(12) United States Patent
Uchimaki et al.

(10) Patent No.: US 6,979,168 B2
(45) Date of Patent: Dec. 27, 2005

(54) METHOD AND APPARATUS FOR TRANSFERRING SUBSTRATE

(75) Inventors: Yoichi Uchimaki, Yamaguchi (JP); Yuko Egawa, Yamaguchi (JP); Tetsunori Kaji, Yamaguchi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 212 days.

(21) Appl. No.: 10/217,405

(22) Filed: Aug. 14, 2002

(65) Prior Publication Data

US 2003/0185655 A1 Oct. 2, 2003

(30) Foreign Application Priority Data

Mar. 26, 2002 (JP) .............................. 2002-086199

(51) Int. Cl.⁷ ............................................ B65G 49/07
(52) U.S. Cl. ...................... 414/935; 414/937; 414/941
(58) Field of Search ................................ 414/935, 937, 414/941, 570; 198/570

(56) References Cited

U.S. PATENT DOCUMENTS

| | | | | |
|---|---|---|---|---|
| 3,812,947 A | * | 5/1974 | Nygaard ...................... 198/617 |
| 4,178,113 A | * | 12/1979 | Beaver et al. ................. 406/10 |
| 5,382,127 A | * | 1/1995 | Garric et al. ............. 414/217.1 |
| 5,417,537 A | * | 5/1995 | Miller ........................ 414/217 |
| 5,443,346 A | * | 8/1995 | Murata et al. .......... 414/222.13 |
| 5,536,128 A | * | 7/1996 | Shimoyashiro et al. ..... 414/273 |
| 5,658,115 A | * | 8/1997 | Yamazaki et al. ........ 414/751.1 |
| 5,855,465 A | * | 1/1999 | Boitnott et al. ......... 414/331.18 |
| 5,976,199 A | * | 11/1999 | Wu et al. .................... 29/25.01 |
| 6,149,367 A | * | 11/2000 | Begin ..................... 414/331.18 |
| 6,282,459 B1 | * | 8/2001 | Ballantine et al. ........... 700/245 |
| 6,413,356 B1 | * | 7/2002 | Chokshi et al. ......... 156/345.32 |
| 6,449,522 B1 | * | 9/2002 | Conboy et al. ............. 700/121 |
| 6,473,996 B1 | * | 11/2002 | Tokunaga ..................... 34/417 |
| 6,519,502 B2 | * | 2/2003 | Chao .......................... 700/213 |
| 6,562,094 B2 | * | 5/2003 | Denker et al. ............. 55/385.2 |
| 6,568,896 B2 | * | 5/2003 | Franklin et al. ............. 414/217 |
| 6,599,763 B1 | * | 7/2003 | Reyes et al. .................. 438/14 |
| 6,663,340 B1 | * | 12/2003 | Zeakes et al. ............... 414/788 |
| 6,722,840 B2 | * | 4/2004 | Fujisawa et al. ........ 414/416.01 |
| 6,746,198 B2 | * | 6/2004 | White et al. ............ 414/222.13 |
| 6,758,647 B2 | * | 7/2004 | Kaji et al. ................... 414/217 |
| 6,848,882 B2 | * | 2/2005 | Chen et al. ................. 414/626 |

* cited by examiner

*Primary Examiner*—Gene O. Crawford
*Assistant Examiner*—Rashmi Sharma
(74) *Attorney, Agent, or Firm*—Antonelli, Terry, Stout and Kraus, LLP.

(57) ABSTRACT

Bays 100, 200, 300 . . . are connected to an inter-bay transfer line 400 via bay stockers 130, 230, 330 . . . , respectively. The bay 100 is, in this embodiment, composed of a single wafer transfer line 120 having a looped planar shape and processing equipments 101–106 arranged side by side along the longitudinal transfer direction of the transfer line (direction crossing the transfer direction of inter-bay transfer line 400). Processing equipments 101–103 are arranged side by side along one side of the transfer line 120, and the remaining processing equipments 104–106 are arranged side by side along the other side of the transfer line 120. The processing equipments 101–106 are equipped with transfer robots 11–16, respectively. Moreover, processing equipments 101–106 are each equipped with a chamber (not shown) for processing wafers W one by one (single wafer processing chamber).

4 Claims, 19 Drawing Sheets

Fig. 17
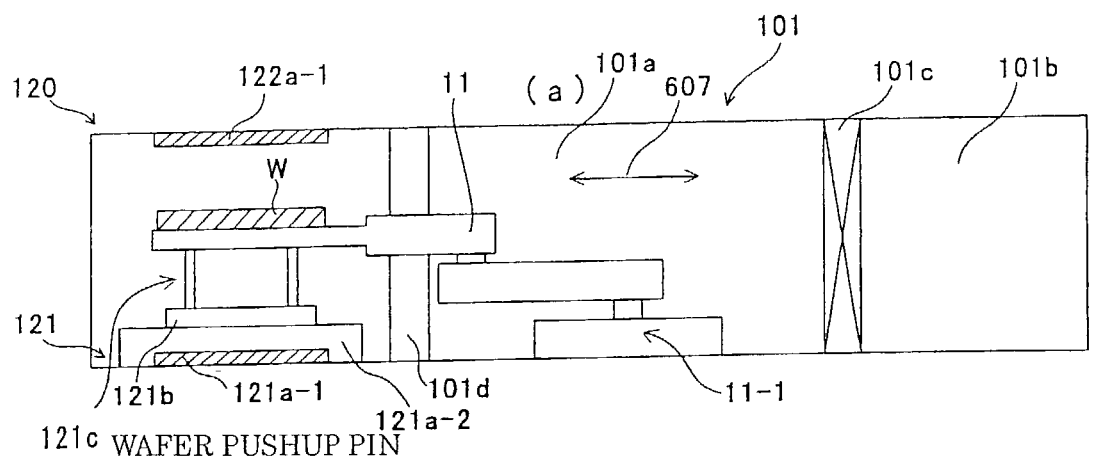
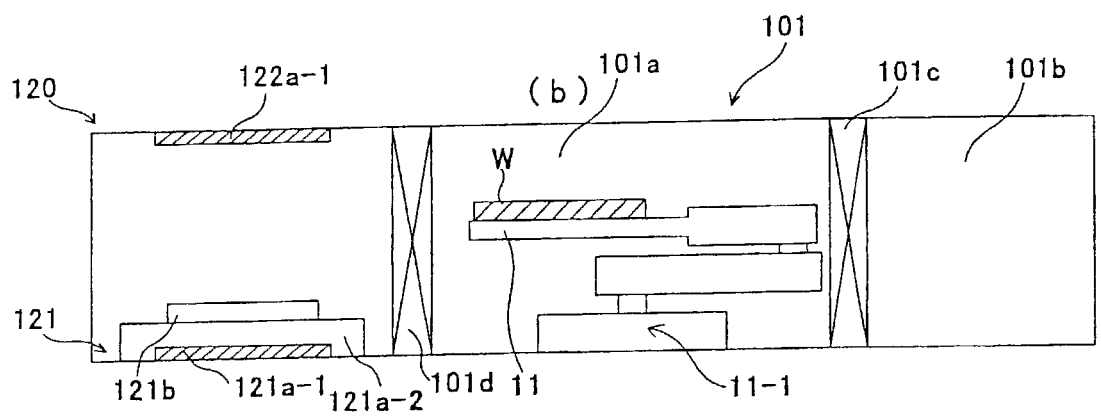
Fig. 18
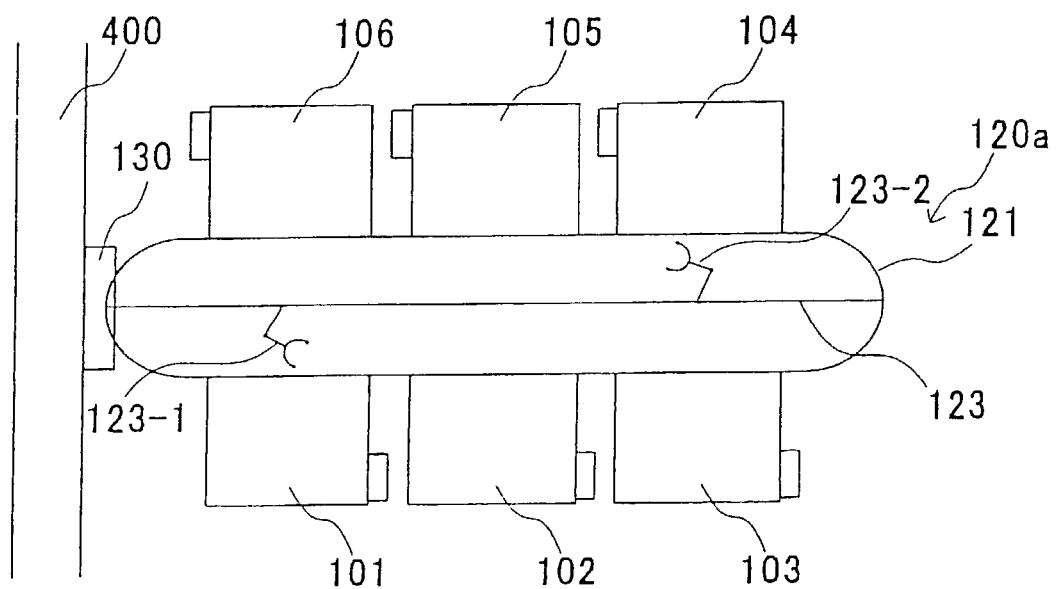

METHOD AND APPARATUS FOR TRANSFERRING SUBSTRATE

BACKGROUND OF THE INVENTION

1. Field of the Invention

The present invention relates to a method and apparatus for transferring one substrate at a time (single substrate transfer) between equipments for processing substrates such as semiconductor substrates, liquid crystal substrates and other substrate parts (hereinafter called wafers).

2. Description of the Related Art

The prior art for transferring wafers one by one between equipments for processing the wafers is disclosed for example in "Production Technique Innovation of LSI Lines" by Katsuhiro Nozaki, NIKKEI MICRODEVICES, August 1993, pages 25–32.

This prior art mainly discloses the following:
1. An automated line capable of efficiently utilizing single wafer processing equipments and cluster tools;
2. A concept of a production line that enables "large item various volume production" by performing single wafer transfer within the bay;
3. A single wafer transfer that is capable of corresponding to variable items and production volume;
4. Cutting down on the number of wafers being worked by the combination of the single wafer processing equipments;
5. Utilizing lot transfer between bays; and
6. Connecting processing chambers for different processes to one cluster tool when starting mass production.

The production capacity will be suppressed if the number of equipments is small. Therefore, the processing capacity of even a single cluster tool is increased in an analog manner by connecting plural processing chambers performing the same process or by adding a module capable of performing plural processes.

Moreover, the above prior art illustrates the following.

On both sides of a wafer transfer system having a deformed U-shape planar shape are disposed plural multiprocessing equipments, thus constituting a bay. In other words, plural multiprocessing equipments are disposed along each of the two rows of parallel transfer lines of the U-shaped wafer transfer system within the bay. In a number of areas of the wafer transfer system are disposed shuttles with robots. An I/O is disposed between each processing equipment and the transfer line. Further, a lot transfer system is adopted for transferring wafers between bays.

FIG. 1 illustrates the second example of the prior art. FIG. 2 appeared in Semiconductor Industry Newspaper on Dec. 5, 2001. This is a module automation example of a single wafer production system indicated by ITRS (International Technology Roadmap for Semiconductors). The system adopts 25-lot transfer Utilizing FOUP and direct single wafer transfer between processes. The black circles indicate wafers, and processing within processing equipments and transferring between processing equipments are performed by single wafers. According to this system, by adopting single wafer processes and direct transferring, the waiting time of wafers which used to correspond to 25-wafer transfer according to the prior art FOUP transfer is reduced to zero, and auxiliary equipments such as FOUP openers and EFEM are no longer necessary.

Moreover, similar prior art is disclosed for example in "Quickness is key to system LSI production—TAT shortened greatly by single wafer production/transfer" by Takehide Hayashi, Electronic Journal, February 2002, pp 95–99.

FIG. 2 illustrates a third prior art example. FIG. 2 comprises a processing portion including plural processing units for performing a series of treatments including applying resist to the wafers, performing exposure and development, and etching the developed wafers, the processing units disposed on both sides of a transfer path; main transfer units that move along the transfer path and convey wafers to the processing units; and an I/O portion comprising a transfer mechanism for transferring the wafers to the main transfer unit; wherein the processing units of the processing portion, the transfer path and the I/O portion being formed integrally.

FIG. 3 illustrates a fourth prior art example. FIG. 3 illustrates a transfer path along which travel transfer equipments for transferring, for example, a glass substrate with TFT arrays used to create liquid crystal displays (LCD), and disposed along the transfer path are an etching equipment for creating a layer of the glass substrate, a first inspection unit, a resist separation equipment, a buffer for standby substrates, a cleaning equipment, a deposition equipment and a second inspection unit. On one end of the transfer path is disposed a substrate input portion, and on the other end is a substrate output portion where cassettes are housed in a multistage shelf, having an elevation mechanism enabling the shelf to elevate so that the transfer unit can access each cassette.

Although the composition of the bay differ according to the prior art examples, the wafer transfer system for transferring the wafer, the substrate or the glass substrate within the bay, the single wafer direct transfer system and the transfer path are all formed as an integral single body according to the examples, so there exist following problems to be solved.

1. The wafer transfer within the bay and the wafer conveyance (wafer handover) between the wafer transfer means and the processing equipments are rate-determined by the longest wafer processing time of the plural processing units (and the wafer transfer time within the processing equipment). Therefore, waiting time occurs for the in-bay wafer transfer and the handing over of wafers to processing units, deteriorating the throughput within the bay. This problem most noticeably occurs according to the prior art examples two through four illustrated in FIGS. 1–3 where the wafer processing performed at each processing equipment differ.
2. For example, if two FOUPs contain wafers to which different processing are to be performed, for example, if wafers in one FOUP require plasma etching treatment and wafers in the other FOUP require plasma CVD treatment, there exists a difference in required processing time for performing the different treatments. Therefore, the wafer transfer within the bay and the wafer handover between the wafer transfer means and the processing equipments are rate-determined by the treatment requiring longer processing time, which is in this case the plasma CVD processing. Therefore, waiting time occurs for the wafer transfer within the bay for wafers especially requiring plasma etching treatment and the transfer between the transfer equipment and the etching equipment, deteriorating the throughput of the bay.
3. Even if the wafer processing performed in all the processing equipments within the bay are the same (for example, the same processing contents and same processing conditions), since the wafer transfer time required for the in-bay transfer means differ from the processing time within the processing equipment plus the wafer transfer time within the processing equipment, there may occur confusions related to the handover of wafers between the in-bay transfer means and the processing equipments or the wafer transfer within the bay, which may lead to deterioration of throughput.

4. If wafers requiring a long processing time and wafers requiring a short processing time are mixed throughout the in-bay transfer line, the already-processed wafers requiring short processing time cannot be transferred from the processing equipment to the transfer line and onto the next processing equipment if the wafer requiring a long processing time existing in front of that wafer has not yet finished its treatment. In other words, waiting time occurs. According to the prior art, there is no recognition of a technique to selectively utilize the transfer line (or transfer lines) to transfer both the wafers requiring short processing time and wafers requiring long processing time in an efficient manner. Therefore, according to the prior art, the transfer time is rate-determined by the wafers having longer processing time. Therefore, the processing time is delayed and the overall speed is deteriorated, and as a result, the throughput of the whole bay is deteriorated.

5. According to large item small volume production, when a wafer requiring express treatment is transferred along the wafer transfer line but a shuttle having a robot supporting a wafer requiring normal treatment is located ahead, the express wafer cannot be transferred to the designated processing equipment with the shuttle in the way. Therefore, waiting time occurs for the express treatment wafer. As a result, wafer processing takes up time and throughput is deteriorated, so the prior art system cannot correspond to large item small volume production.

6. If even only one of the shuttles with robots on the wafer transfer line is malfunctioning, the whole transfer line within the bay stops, and wafers cannot be transferred to the multiprocessing equipments. Therefore, the wafers cannot be processed and the treatment of all the wafers within the bay is stopped. Further, the stopping of the transfer line within the bay and the stopping of the processing equipments makes it impossible to transfer the wafers from this bay to the other bays, so the wafer processing at other bays are also stopped. As a result, the wafer processing of all the related bays are stopped.

The present aims at solving such problems of the prior art.

SUMMARY OF THE INVENTION

The first object of the present invention is to provide a single wafer transfer method and apparatus that prevent the wafer transfer within the bay and the wafer handover between the wafer transfer means and the processing equipments from being rate-determined by the various wafer treatments performed at the various processing equipments within the bay, and thereby prevent deterioration of throughput.

The second object of the present invention is to provide a single wafer transfer method and apparatus that prevent the wafer transfer within the bay and the wafer handover between the wafer transfer means and the processing equipments from being rate-determined even if the wafers housed in one wafer supporting means require treatment that differ from the treatment required for wafers housed in another wafer supporting means, and as a result prevent deterioration of throughput.

The third object of the present invention is to provide a single wafer transfer method and apparatus that prevent the confusion related to wafer handover between the in-bay transfer means and the processing equipments or confusion related to in-bay wafer transfer that may occur when all the wafer processing to be performed within the bay is the same, and as a result prevent deterioration of throughput.

The fourth object of the present invention is to provide a single wafer transfer method and apparatus that enable to transfer both the wafers requiring short processing time and wafers requiring long processing time mixed within the bay in an efficient manner, thereby preventing deterioration of throughput.

The fifth object of the present invention is to provide a single wafer transfer method and apparatus capable of preventing unnecessary waiting time from occurring when treating a wafer requiring express treatment during large item small volume production, thus preventing deterioration of throughput.

The sixth object of the present invention is to provide a single wafer transfer method and apparatus capable of preventing the processes within the bay or processes performed at other bays from stopping when one wafer transfer line within a bay is malfunctioning.

The first to third objects of the present invention are achieved by providing at least one more independent transfer line to the bay that can transfer wafers in parallel with the first transfer line. In other words, even if different wafer treatments are performed in the various processing equipments of the bay, by selectively utilizing a plurality of in-bay transfer lines that can transfer wafers in parallel, the wafer transfer within the bay and the wafer handover between the wafer transfer means and the processing equipments are prevented from being rate-determined by the various wafer processing time required by the processing equipments.

Further, even when plural wafer storage means each contain wafers requiring different treatment, by selectively utilizing the parallel transfer lines constituting the in-bay transfer line, the wafers stored in each wafer storage means can be transferred smoothly within the bay or handed over smoothly between the wafer transfer means and the processing equipments in correspondence to the contents of wafer processing.

Moreover, by selectively utilizing the parallel transfer lines constituting the in-bay transfer line, confusion that may occur when transferring the wafers within the bay or handing over the wafers between the wafer transfer means and the processing equipments in a bay that provides only one kind of wafer treatment can be prevented.

The fourth object of the invention is achieved by providing an ordinary wafer transfer line and an independently disposed express wafer transfer line as the parallel transfer lines constituting the in-bay transfer line. In this example, the ordinary wafer transfer line refers to a single wafer transfer line that transfers wafers requiring a long processing time at the processing equipments. The express wafer transfer line refers to a single wafer transfer line that transfers wafers requiring a short processing time at the processing equipments. Therefore, when wafers requiring a short processing time and wafers requiring a long processing time are mixed within the bay, the short processing wafers are transferred by the express wafer transfer line and the long processing wafers are transferred by the ordinary wafer transfer line.

The long/short processing speed is not quantitative, but is determined by the comparison between a processing speed of one wafer and the processing speed of another wafer, or by the comparison between the processing speed of wafers stored in one wafer storage means and that of wafers stored in another wafer storage means. Such difference in processing speed is compared by a control unit, and based on the computed result, whether to use the ordinary wafer transfer line or to use the express wafer transfer line is determined.

The fifth object of the present invention is achieved by additionally providing an independent single wafer transfer line for skipping processing equipments within the bay. According to such example, the wafer requiring express treatment in a large item small volume production can be moved without delay to the designated processing equipment by utilizing the skip line.

The sixth object of the present invention is achieved by providing an additional independent single wafer transfer line within the bay. In other words, when by some reason the single wafer transfer line within a bay is broken, the malfunction is detected immediately, and the other single wafer transfer line starts operating. Thereby, the transfer process within the bay will not be stopped. Further, the treatment at the processing equipments can be performed continuously without stopping, and thus the operation within the bay is executed smoothly. Moreover, since the transfer and processing of wafers within the bay is performed without stopping, the transfer and processing of wafers at other related bays can also be performed without delay.

According to the present invention, the description "selectively utilizing the two transfer lines" refers to disposing various plural processing equipments within a bay, and providing within the bay a first transfer line that is driven to correspond to a first treatment performed by one of the plural processing equipments, and a second transfer line that is driven to correspond to a different second treatment performed by a different processing equipment, thus selectively and independently utilizing the two transfer lines disposed so as to transfer wafers in parallel relationships.

BRIEF DESCRIPTION OF THE DRAWINGS

FIG. 17 is a vertical cross-sectional view illustrating the pattern of transfer status of the wafer according to FIG. 16;

FIG. 18 is a plane view partially illustrating the second embodiment of the semiconductor fabrication line according to the present invention;

DETAILED DESCRIPTION OF THE PREFERRED EMBODIMENTS

The preferred embodiments of the present invention will now be explained with reference to the drawings.

FIGS. 4 through 17 illustrate one embodiment of the present invention.

Figure 1:
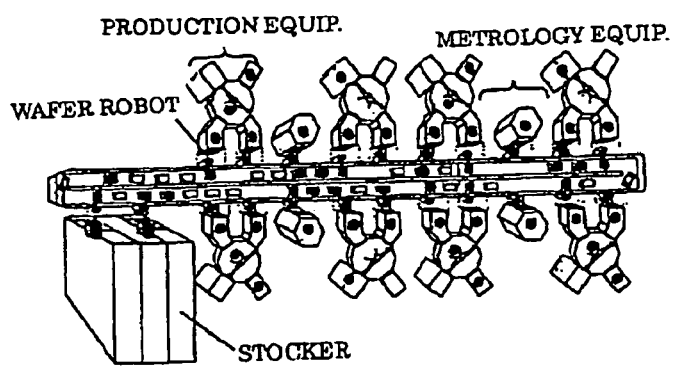
FIG. 1 is a plane view showing the single wafer fabrication system of the second prior art example.
Figure 2:
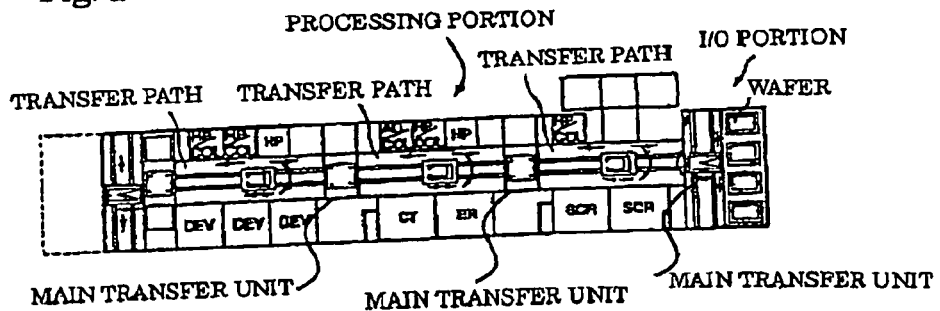
FIG. 2 is a plane view showing the processing line of the processed wafer of the third prior art example.
Figure 3:
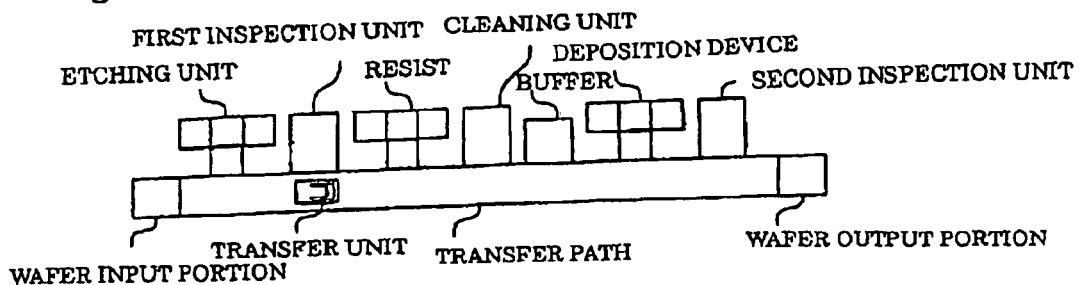
FIG. 3 is a plane view showing the TFT array formation line of the fourth prior art example.
Figure 4:
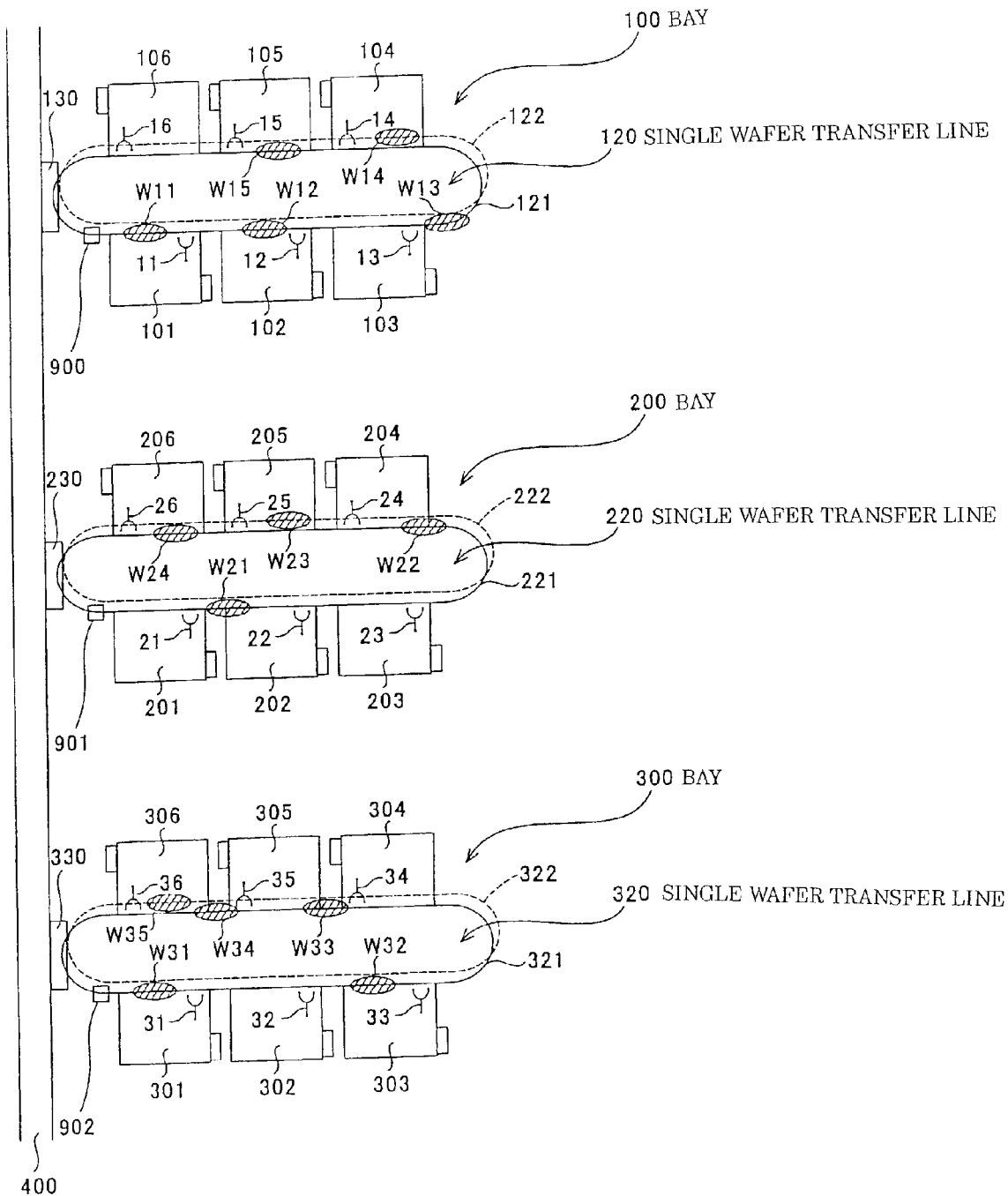
FIG. 4 is a plane view showing partially one embodiment of the semiconductor fabrication line according to the present invention.

FIG. 4 illustrates a portion of a semiconductor fabrication line comprising plural bays 100, 200, 300 and so on. Each bay 100, 200 or 300 is connected via a bay stocker 130, 230 or 330 to an inter-bay transfer line 400.

With reference to FIG. 4, the structure and function of the bays is explained utilizing bay 100 as a representative example. The other bays 200, 300 . . . have substantially the same structure and function as bay 100, so explanations thereof are omitted.

In FIG. 4, according to the illustrated example, bay 100 is composed of a single wafer transfer line 120 having a looped planar surface shape, and processing equipments 101–106 which are respectively disposed along the longitudinal transfer direction of the line 120 (crossing the transfer direction of the inter-bay transfer line 400). In the example, processing equipments 101 through 103 are disposed side-by-side in a line along one side of the single wafer transfer line 120. Further, the remaining processing equipments 104 through 106 are disposed side-by-side in a line on the other side of the line 120. Processing equipments 101 through 106 are each equipped with a transfer robot 11–16. Processing equipments 101 through 106 each also comprises a chamber (not shown) for processing a wafer W one by one, or single-wafer processing chamber. Six processing equipments are disposed in the present example, but there is no limitation to the number. The variety and number of equipments being arranged along the single wafer transfer line 120 is selected and determined based on the process flow of wafer W, as indicated in the prior art example.

In FIG. 4, the single wafer transfer line 120 is composed of two transfer lines, a transfer line 121 for transferring the wafers W one by one and another transfer line 122 for transferring wafers W one by one in parallel with the transfer line 121. Each transfer line is vertically opposed to the other, and in the example, transfer line 121 is set to the lower position and transfer line 122 is set to the upper position. In this case, transfer line 122 comprises a wafer transfer plane that opposes the wafer transfer plane of transfer line 121. Moreover, transfer line 121 comprises a substantially horizontal wafer transfer plane, and transfer line 122 comprises a substantially horizontal wafer transfer plane that vertically opposes the wafer transfer plane of line 121. In other words, the transfer lines 121 and 122 both transfer the wafer W on horizontal planes.

The following example explains the case where the wafer transfer planes of lines 121 and 122 are opposed to one another in vertical direction, but their relation is not limited thereto. For example, the wafer transfer planes of lines 121 and 122 can oppose one another horizontally (left/right relations). In such case, the wafers W are transferred on lines 121 and 122 having their to-be-processed surfaces disposed vertically. The orientation of the to-be-processed surfaces of the wafers W when passing the wafers W to the processing equipments do not especially affect the present embodiment, so the vertically disposed wafers can be changed to horizontal orientation before being passed to the processing equipment, or they can be disposed as they are.

Further, according to FIG. 4, the transfer robots 11–16 of processing equipments 101–106 can receive or hand over one wafer W at a time from/to transfer lines 121 and 122 (single wafer transfer). Moreover, a stocker (not shown) of the bay stocker 130 can receive or hand over wafers W from or to transfer lines 121 and 122.

In FIG. 4, the transfer of wafers between bays 100, 200, 300 . . . are performed on an inter-bay transfer line 400 utilizing bay stockers 130, 230, 330 . . .

Figure 5:
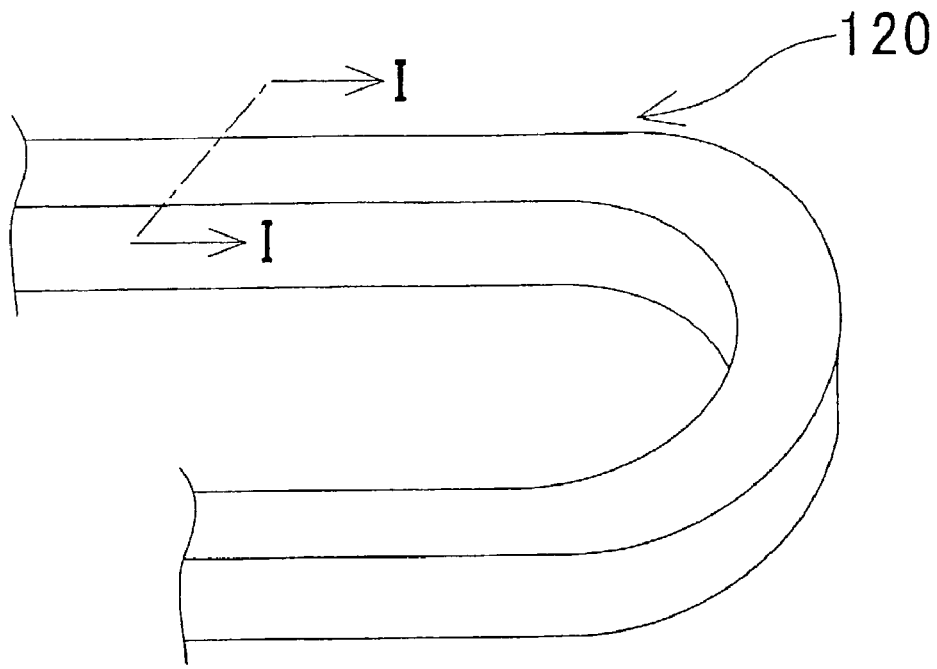
FIG. 5 is a perspective external view showing the portion opposite to the bay stocker of the single wafer transfer line according to the embodiment of FIG. 4.
Figure 6:
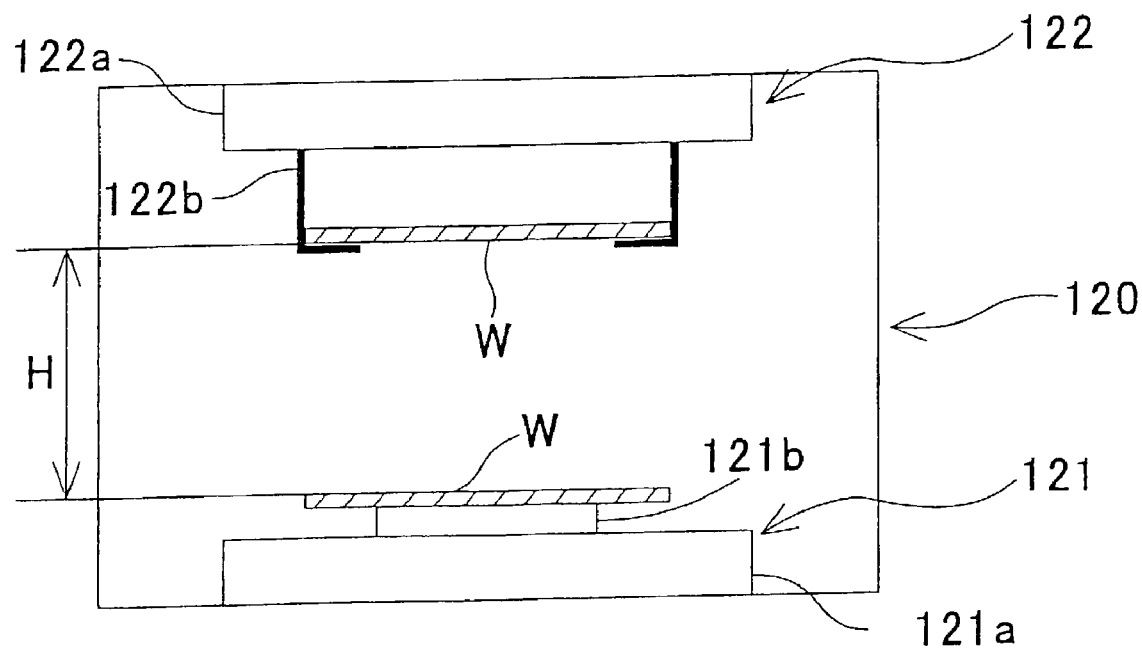
FIG. 6 is a perspective cross-sectional view taken at line I—I of FIG. 5.

FIGS. 5 and 6 show the detailed structure of single wafer transfer line 120. FIG. 5 is a perspective exterior view of the line 120 that is opposite from bay stocker 130. FIG. 6 is an I—I visual cross-sectional view of FIG. 5.

In FIG. 6, transfer line 121 comprises a moving body 121a and a wafer platform 121b. The wafer platform 121b is mounted on the moving body 121a. The upper surface of wafer platform 121b is formed as a wafer support surface which is designed to support a single wafer W. The wafer W comes into contact with and is supported by the upper surface of wafer platform 121b in horizontal orientation. The transfer line 122 comprises a moving body 122a and a wafer supporter 122b. The wafer supporter 122b is mounted to moving body 122a. Wafer supporter 122b supports a single wafer W in horizontal orientation. In FIG. 6, the distance H between wafer mount surface of wafer platform 121b and wafer support portion of wafer supporter 122b is determined by the structure of the processing equipment. This will be explained in detail later.

Figure 7:
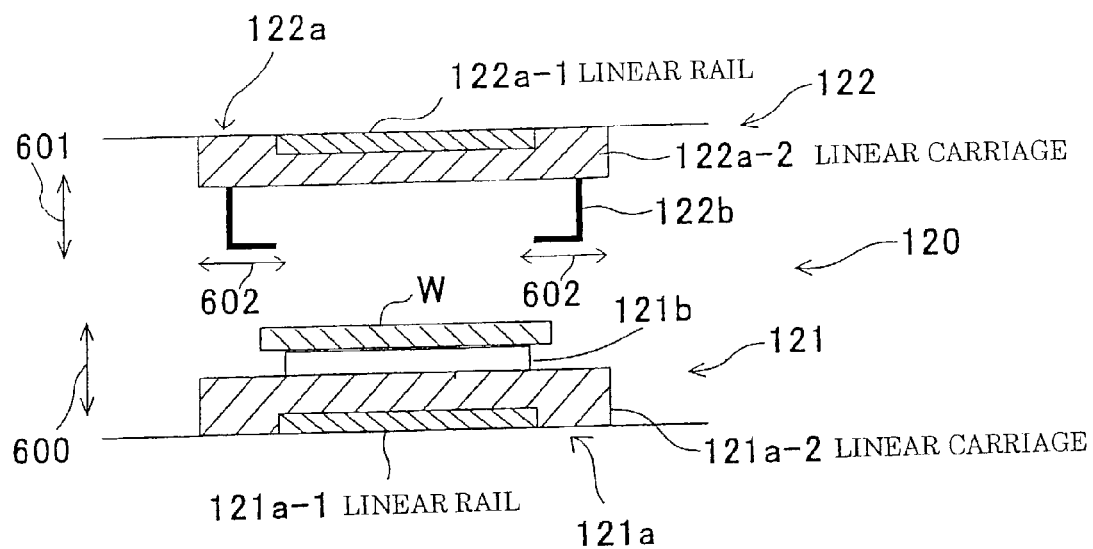
FIG. 7 is a vertical cross-sectional view showing FIG. 5 in detail.

In FIG. 7, a non-contact moving body, in this case a linear moving body comprising a linear rail 121a-1 and a linear carriage 121a-2, is used as moving body 121a. Wafer platform 121b is mounted on linear carriage 121a-2 of moving body 121a. The wafer platform 121b comprises a wafer support surface on the upper surface thereof for supporting a single wafer W. The wafer W comes into contact with and is supported by the upper surface of wafer platform 121b in horizontal orientation.

In FIG. 7, a non-contact moving body, in this case a linear moving body comprising a linear rail 122a-1 and a linear carriage 122a-2, is used as moving body 122a. Wafer supporter 122b supports a single wafer by holding the back surface of the outer periphery of wafer W.

The following is an explanation on how wafer W is passed from transfer line 121 to transfer line 122.

Figure 10:
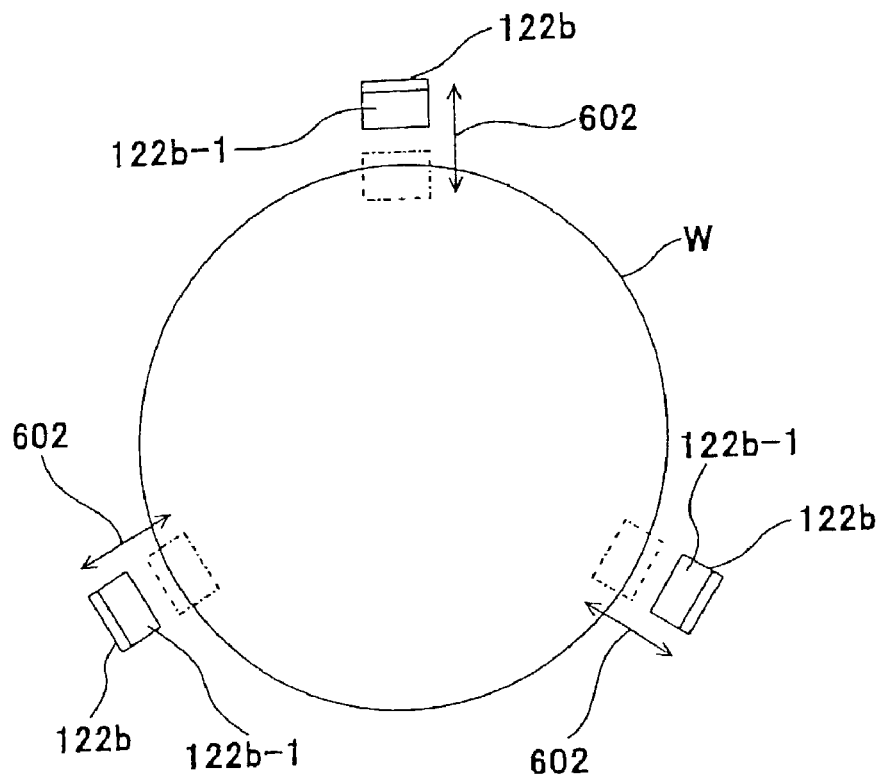
FIG. 10 is a plane view explaining the wafer supporter and the operation of the wafer supporting portion of FIG. 9.

In FIG. 7, at first, a single wafer W is mounted on and supported by wafer platform 121b of transfer line 121. On the other hand, wafer supporter 122b of transfer line 122 is not supporting a wafer. Then, the relative position of platform 121b and supporter 122b is adjusted so as to enable the wafer to be handed over. Next, the wafer W on wafer platform 121b is elevated toward wafer supporter 122b (arrow 600). The elevation is stopped when the wafer reaches a position where the wafer supporter 122b can receive the wafer. In advance, the wafer supporter 122b is opened in the radial direction (arrow 602) as is shown in FIG. 10. When wafer W reaches the determined position, the opened wafer supporter 122b closes radially (arrow 602). Thereby, wafer W is received by wafer supporter 122b by having the back periphery area of wafer W scooped up by scoop portion of wafer supporter 122b. Thereafter, the member that elevated wafer W (not shown) is lowered and stored for example in wafer platform 121b.

Figure 8:
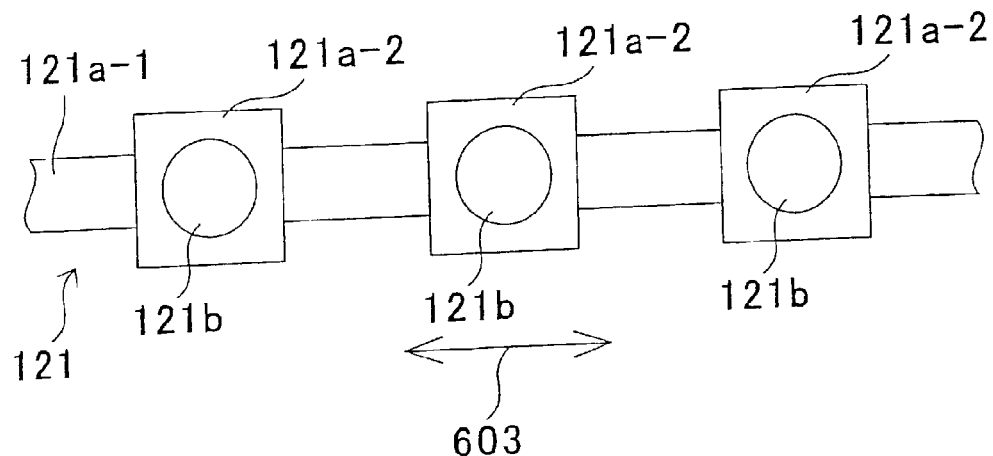
FIG. 8 is a partial plane view showing the lower transfer line of the single wafer transfer line according to the embodiment shown in FIG. 4 of the present invention.

FIG. 8 is a partial plane view of transfer line 121.

In FIG. 8, linear rails 121a-1 are disposed on the bottom surface along the single wafer transfer line 121. Linear rails 121a-1 have three linear carriages mounted movably thereto (arrow 603). Each linear carriage 121a-2 is provided with one wafer platform 121b.

In FIG. 8, the planar shape of the linear carriage 121a-2 is, for example, rectangular. The size of the wafer platform 121b is selected according to the size of the wafer. For example, if the diameter of the wafers varies from 8 in., 12 in., 14 in. and so on, the size of wafer platform 121b will vary according to the wafer diameter. Each linear carriage 121a-2 is provided with a sensor for detecting the interval between the front and back carriages (not shown). The sensors are each connected to a control unit (not shown). Further, one or more sensors (not shown) are provided to linear carriage 121a-2 or wafer platform 121b. The sensor detects the existence of a wafer and further detects wafer information. The sensors are connected to a control unit (not shown). It is possible to detect the existence of a wafer and to detect the wafer information by a single sensor, or these functions can be performed by separate sensors.

Moreover, each linear carriage 121a-2 is equipped with a sensor (not shown) for confirming its positional information on the transfer line 121. This sensor is connected to a control unit (not shown). For example, this sensor can detect whether the linear carriage 121a-2 has reached a position corresponding to a determined processing equipment. In another example, the sensors having such function can be equipped on the processing equipments, or they can be equipped both on the linear carriages and the processing equipments.

Figure 9:
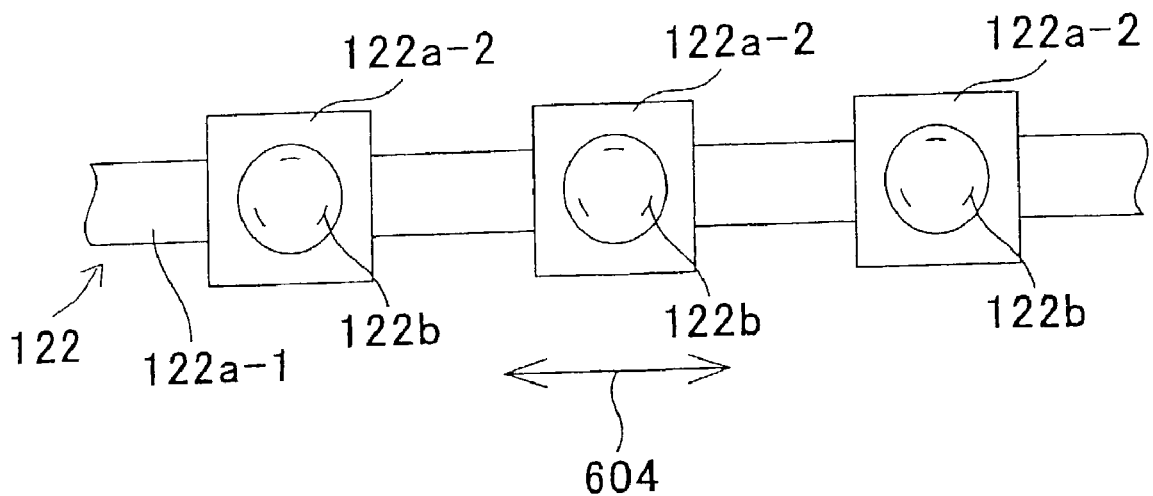
FIG. 9 is a partial plane view showing the upper transfer line of the single wafer transfer line according to the embodiment shown in FIG. 4 of the present invention.

FIG. 9 is a partial plan view of transfer line 122.

In FIG. 9, linear rails 122a-1 are disposed on the bottom surface along the single wafer transfer line. Linear rails 122a-1 have three linear carriages 122a-2 mounted movably thereto (arrow 604). Each linear carriage 122a-2 is provided with one wafer supporter 122b. For example, as shown in FIG. 10 the wafer supporter 122b comprises three scoop portions 122b-1. The scoop portions 122b-1 are disposed around the circumference at 120-degree intervals, and are positioned at the outer periphery of wafer W. The wafer supporters 122b can be opened and closed along the radial direction of wafer W (arrow 602) when receiving the wafer W.

In FIG. 9, the planar shape of the linear carriage 122a-2 is, for example, rectangular. Each linear carriage 122a-2 is provided with a sensor (not shown) for detecting the interval between the front and back carriages. The sensors are each connected to a control unit (not shown). Further, one or more sensors (not shown) are provided to the linear carriage 122a-2 for detecting the existence of a wafer and further detecting wafer information. The sensors are connected to a control unit (not shown). It is possible to detect the existence of a wafer and to detect the wafer data by a single sensor, or the functions can be performed by separate sensors.

Moreover, each linear carriage 122a-2 is equipped with a sensor (not shown) for confirming its position on the transfer line 122. This sensor is connected to a control unit (not shown). For example, this sensor can detect whether the linear carriage 122a-2 has reached a position corresponding to a determined processing equipment. In another example, the sensors having such function can be equipped on the processing equipments, or they can be equipped both on the linear carriages and the processing equipments.

In FIGS. 8 and 9, the number of linear carriages 121a-2 disposed on transfer line 121 and the number of carriages 122a-2 disposed on transfer line 122 can either be same or different. FIGS. 8 and 9 illustrate an example where three carriages are disposed on each line, but the number can be determined appropriately based on need. Further, there can be one control unit to which all the sensors are connected, or more than one control unit.

The positional relationship between linear carriages 121a-2 of transfer line 121 and linear carriages 122a-2 of transfer line 122 is controlled appropriately utilizing sensors and the data sent to control units.

Figure 11:
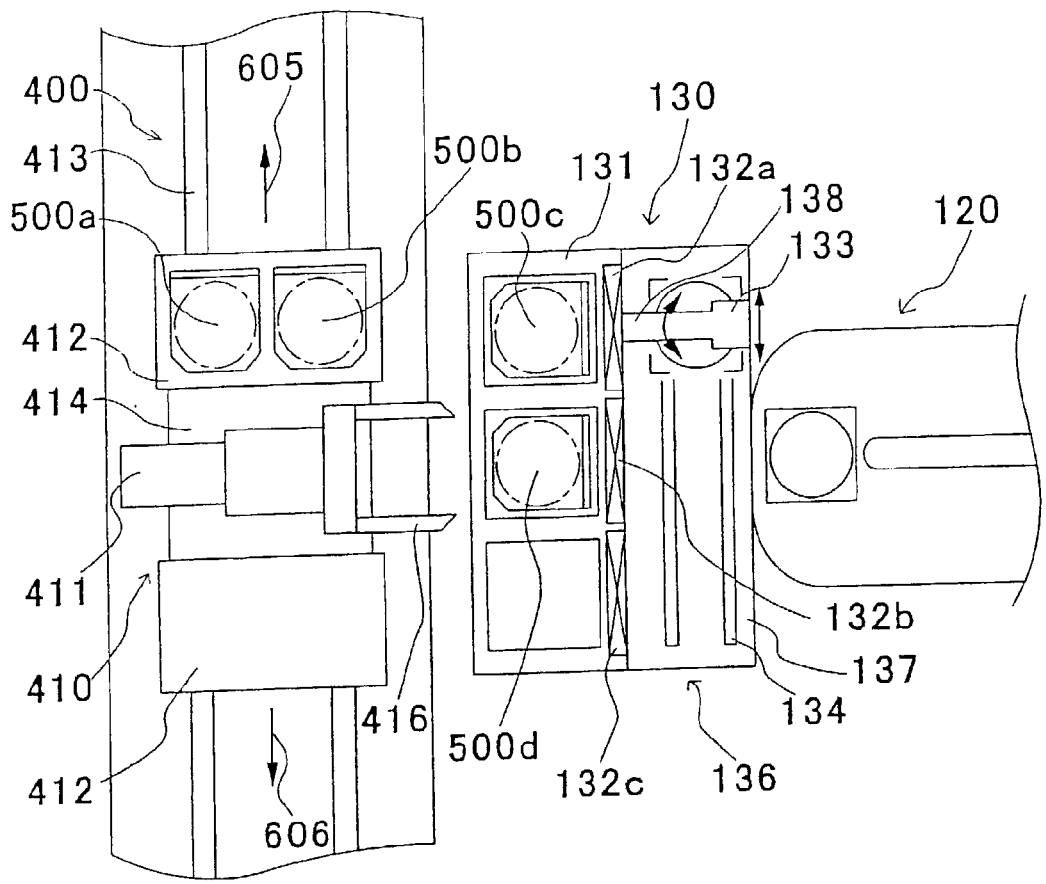
FIG. 11 is a partial plane view explaining the single wafer transfer line according to the first embodiment of FIG. 4 of the present invention, especially illustrating the wafer conveyance between the inter-bay transfer line and the in-bay single wafer transfer line.
Figure 12:
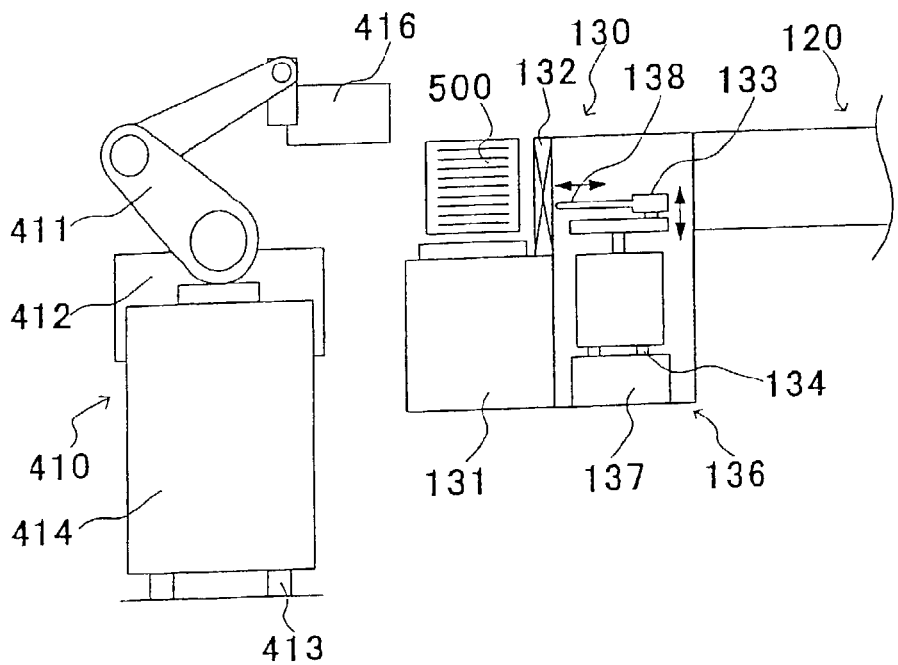
FIG. 12 is a front view of FIG. 11.

In FIGS. 11 and 12, a bay stocker 130 is connected to an inter-bay transfer line 400. In the example, AGV (automatic guided vehicle) 410 is adopted in the inter-bay transfer line 400. AGV 410 comprises a robot 411, a platform 412, rails 413 and a track frame 414. Track rails 413 are formed along inter-bay transfer line 400. Track frame 414 is movably disposed on rails 413. Robot 411 and platform 412 are provided on track frame 414. Track frame 414 is further equipped with a driving unit (not shown). Driving unit is connected to a control unit (not shown). Track frame 414 comprises a position sensor corresponding to bay stocker 130. The sensor can also be equipped to bay stocker 130.

In FIGS. 11 and 12, platform 412 comprises a flat surface capable of mounting a wafer storage means, such as two FOUPs (front opening unified pods) 500 (500a, 500b). FOUP 500 is mounted on the mounting surface of platform 412 so as to maintain the to-be-processed surface of the wafer stored therein in horizontal orientation. Robot 411 comprises an arm 416 that grasps the grip portion of FOUP at the tip portion. Robot 411 comprises a driving means (not shown) for rotating the arm 416 or moving the same in vertical and horizontal directions. Driving means is connected to a control unit (not shown). The wafer storage means is not limited to FOUP, but other storage means such as open cassettes etc. can be utilized.

In FIGS. 11 and 12, bay stocker 130 comprises a platform 131, a gate 132, a robot 133 and rails 134. In the example, bay stocker 130 is divided into a platform 131 portion and transfer robot portion 136. Platform 131 portion and transfer robot portion 136 are divided by gate 132. Platform 131 is disposed on the AGV 410 side of gate 132. Transfer robot portion 136 is disposed on transfer line 121 side of gate 132. Platform 131 comprises a flat surface capable of mounting three FOUPs 500. FOUPs are mounted on the mounting surface of platform 131 so as to maintain the to-be-processed surface of plural wafers stored therein in horizontal orientation. FOUPs 500 are placed side-by-side on the mounting surface of platform 131 along the direction of movement of AGV 410. In this example, three gates 132 are provided, each gate 132a-132c located so as to correspond to each FOUP 500. Rails 134 are disposed on rail platform 137 of transfer robot 136. Rails 134 are disposed in parallel to the mounting surface of FOUP 500 on platform 131. Robot 133 is mounted on rails 134. Robot 133 comprises a driving means (not shown) enabling it to run on the rails 134. Driving means is connected to a control unit (not shown). Robot 133 comprises an arm 138. Arm 138 comprises a driving means (not shown) for rotating the arm or to move it in vertical and horizontal directions. Driving means is connected to a control unit (not shown). In the example, arm 138 is equipped with a sensor (not shown) to sense both the existence of wafers and the wafer data. Sensor is connected to a control unit (not shown).

The above-mentioned system offers the following wafer operation/processing.

According to FIGS. 4 through 12, wafers are transferred from the upstream side of bay 100 to bay 100 via inter-bay transfer line 400. Actually, two FOUPs 500*a*, 500*b* are placed side-by-side on the mounting surface of platform 412 of AGV 410. For example, FOUP 500*b* stores wafers having high processing speed. Sensors detect whether FOUPs 500*a*, 500*b* are placed on platform 412. This sensor information is transmitted to a control unit. Thus, it is confirmed that FOUPs 500*a* and 500*b* are appropriately placed on platform 412. Thereafter, operation signals are output from the control unit to the driving means, thereby starting operation of the driving means. Thus, AGV 410 is driven within inter-bay transfer line 400 toward bay stocker 130 of bay 100. Thereafter, using position sensors, it is detected that AGV 410 has reached a location corresponding to the predetermined position of bay stocker 130. This detection signal is sent to the control unit, corresponding to which the control unit outputs a stop signal. AGV 410 stops. In the example, FOUPs 500*c* and 500*d* are mounted on the FOUP mounting surface of platform 131. No FOUP is mounted on the remaining FOUP mounting surface. In this example, the wafer processing of FOUP 500*d* mounted on platform 131 of bay stocker 130 is almost completed. The processing to wafer within FOUP 500*c* is still mid-course. Moreover, wafers stored in FOUP 500*d* have slow processing speeds unlike the wafers in FOUP 500*b*. According to the mounting surface of FOUP on platform 131, whether there is a FOUP mounted on the remaining single mounting surface, in the example the mounting surface located toward the right side of FOUP 500*d* facing gate 132*b*, is detected using a sensor (not shown). When sensor detects no FOUP, control unit outputs a control signal to the drive means of robot 411. Upon receiving the control signal, robot 411 starts moving. This movement is stopped after the arm 416 is rotated from the position illustrated in FIG. 11 to the position corresponding to FOUP 500*b*. Thereafter, arm 416 is opened large enough to grip FOUP 500*b*. Then, arm 416 is lowered to a position corresponding to the grip portion of FOUP 500*b*. Thereafter, arm 416 is closed and thus the FOUP 500*b* is grasped by arm 416. Sensor detects that FOUP 500*b* is gripped by arm 416, and this signal is output to the control unit. Thereafter, FOUP 500*b* is transferred to the remaining mounting surface of platform 131. FOUP 500*b* is placed on the mounting surface. Sensor outputs a signal to the control unit when mounting of FOUP 500*b* is detected. On the other hand, a signal notifying that wafer processing of FOUP 500*d* is completed is transmitted to control unit. In response, arm 416 of robot 411 moves FOUP 500*d* to a retrievable position, and stops. Then, the opened arm 416 of robot 411 moves toward FOUP 500*d*. This movement is stopped by control unit when arm 416 reaches a position where it is possible to catch FOUP 500*d* at its side surface. Then, the arm 416 is closed and thus FOUP 500*d* is clutched by arm 416. In this state, FOUP 500*d* is mounted on the mounting surface of platform 412 where FOUP 500*b* has been originally mounted. In other words, the surface of platform 131 on which FOUP 500*b* was originally placed becomes the receiving surface of the next FOUP. AGV 410 supporting FOUP 500*a* and FOUP 500*d* moves either toward the next bay in arrow 605 direction or upstream in arrow 606 direction.

Next, gate 132*c* opens based on the command from the control unit. At this time, the door of FOUP 500*b* is also opened. Thereby, the interior of FOUP 500*b* communicates with the atmosphere of transfer robot 136 and single wafer transfer line 120. Based on the command from the control unit, robot 133 moves and stops at a position corresponding to gate 132*c*. Information on the wafers stored inside FOUP 500*b* is read by a sensor on arm 138. The information is output to the control unit. Based on this information signal, selection is made on which wafer within FOUP 500*b* is to be taken out for the next process. The selected signal is output to robot 133. Thus, robot 133 moves its arm 138 to the predetermined height position. Then, arm 138 passes gate 132*c* and enters FOUP 500*b*. The control unit stops the movement of arm 138 when the scoop portion of arm 138 reaches the back surface of the selected wafer within FOUP 500*b*. Thereafter, scoop portion of arm 138 is somewhat elevated. By this elevation, the wafer is received by the scoop portion of arm 138. Then, the arm 138 is pulled back to its original position. On the other hand, linear carriage 122*a*-2 on transfer line 122 positioned at the upper portion of single wafer transfer line 120 is stopped at a position enabling wafer to be passed over. The position and information are output from the sensor to the control unit. Wafer supporter 122*b* of linear carriage 122*a*-2 is opened toward the radial direction. At this time, whether or not linear carriage 121*a*-2 is disposed below linear carriage 122*a*-2 is not a problem. Robot 133 holding a wafer by the scoop portion of arm 138 is moved on rails 134 until it reaches a position corresponding to linear carriage 122*a*-2. This movement is stopped by the control unit when robot 133 reaches a position corresponding to linear carriage 122*a*-2. During this time, the scoop portion on the arm 138 holding the wafer is rotated by 180 degrees. Thereafter, scoop portion of arm 138 moves toward linear carriage 122*a*-2. When the wafer held by scoop portion of arm 138 reaches the position below linear carriage 121*a*-2, the movement of arm 138 is stopped. Next, the scoop portion of arm 138 elevates. This elevation is stopped by control unit when the wafer held by the scoop portion of arm 138 reaches a position where wafer supporter 122*b* of linear carriage 122*a*-2 is capable of receiving the wafer. The wafer supporter 122*b* closes toward the radial direction (arrow 602). Thus, the wafer is passed on from the scoop portion of arm 138 to wafer supporter 122*b*. The arm 138 having handed over the wafer is returned to its original position for standby.

In FIG. 4, when FOUP 500*b* is set for example to the platform 131 of bay stocker 130, the control unit sets the processing devices 103 and 106 to process wafers having fast processing speeds. As for other processing devices 101, 102, 104 and 105, the processing of wafers having slow processing speeds is performed continuously.

Figure 13:
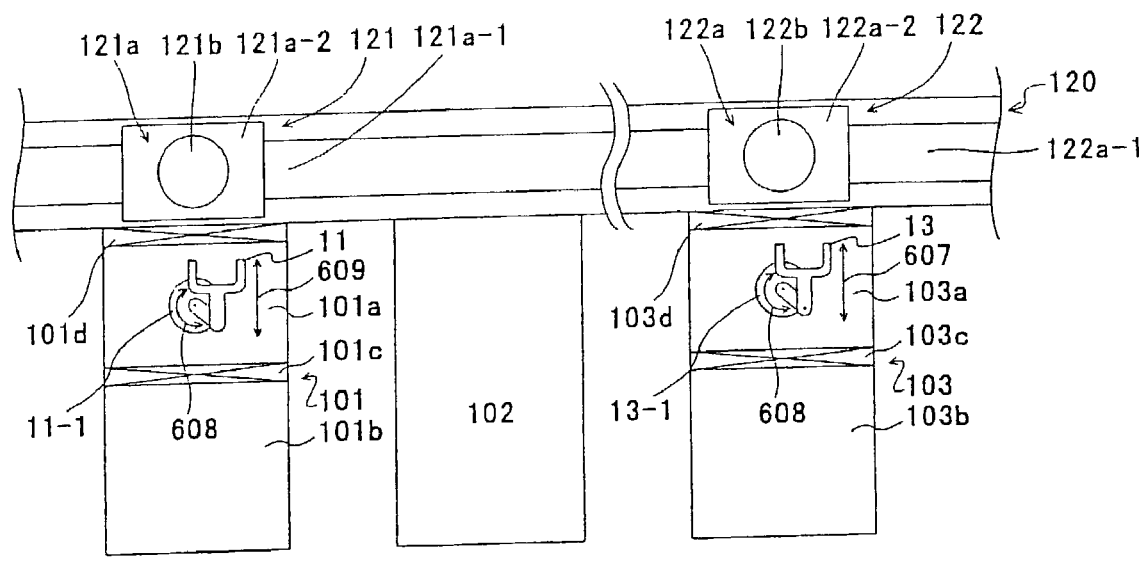
FIG. 13 is a plane view showing partially the wafer handover example between the single wafer transfer line and the vacuum processing equipments according to the embodiment of FIG. 4 of the present invention.

FIG. 13 illustrates in detail the structure of processing equipments 101 and 103 of single wafer transfer line 120 in FIG. 4. FIG. 13 shows the lower transfer line 121 of single wafer transfer line 120. Linear carriage 121*a*-2 is positioned in front of processing equipment 101. The processing equipment 101 comprises, from the side facing transfer line 121, a gate valve 101*d*, a lock chamber 101*a*, a gate valve 101*c* and a processing chamber 101*b*. A robot 11 having a scoop portion 11-1 is disposed within lock chamber 101*a*. The scoop portion 11-1 comprises both a link mechanism to receive or hand over wafer through gate valve 101*d* and a function to rotate and hand over wafer to or receive wafer from processing chamber 101*b* through gate valve 101*c*.

FIG. 13 also illustrates the upper transfer line 122 of single wafer transfer line 120. Linear carriage 122*a*-2 is located in front of processing equipment 103. The processing equipment 103 comprises, from the side facing transfer line 122, a gate valve 103*d*, a lock chamber 103*a*, a gate valve 103*c* and a processing chamber 103*b*. A robot 13 having a scoop portion 13-1 is disposed within lock chamber 103*a*. The scoop portion 13-1 comprises both a link mechanism to receive or hand over wafer through gate valve 103*d* and a function to rotate and hand over wafer to or receive wafer from processing chamber 103b through gate valve 103c.

The conveyance structure between the processing equipments 102, 104 and 105 for processing slow processing speed wafers and the transfer line 121 is similar to the conveyance structure between processing chamber 101 and transfer line 121, so detailed description thereof and illustration thereof are omitted. Further, the conveyance structure between the processing equipment 106 for processing fast processing speed wafers and the transfer line 122 is similar to the conveyance structure between processing chamber 103 and transfer line 122, so detailed description thereof and illustration thereof are omitted.

Figure 14:
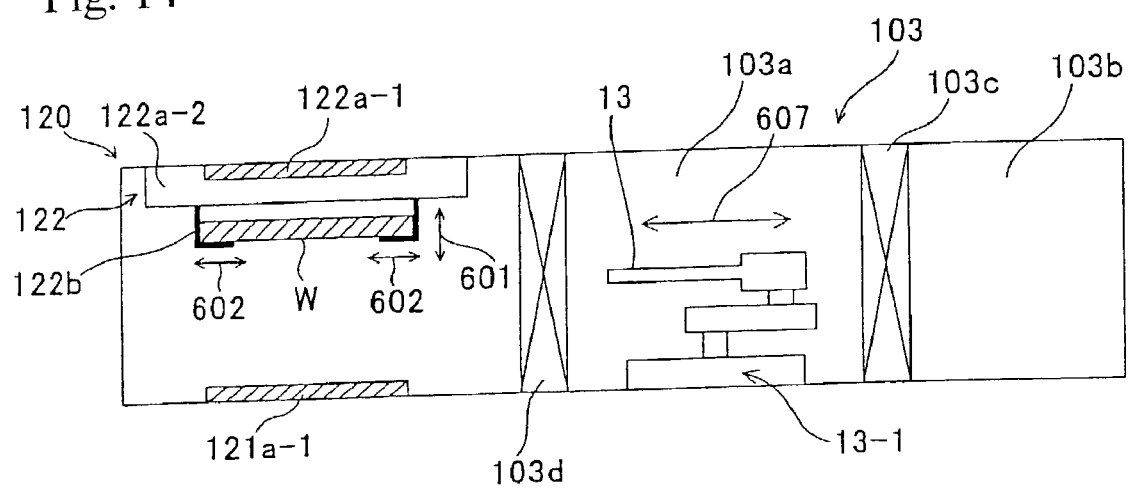
FIG. 14 is a vertical cross-sectional view showing the wafer handover structure between the upper transfer line and the vacuum processing equipment of FIG. 13.

FIG. 14 illustrates in detail the relationship or connection between processing equipment 103 and single wafer transfer line 122. In FIG. 14, the space between transfer line 120 and lock chamber 103a is separated by gate valve 103d. In the example, the heights of transfer line 120 and lock chamber 103a are roughly the same. The inner spaces of lock chamber 103a and processing chamber 103b are divided by gate valve 103c.

Figure 15:
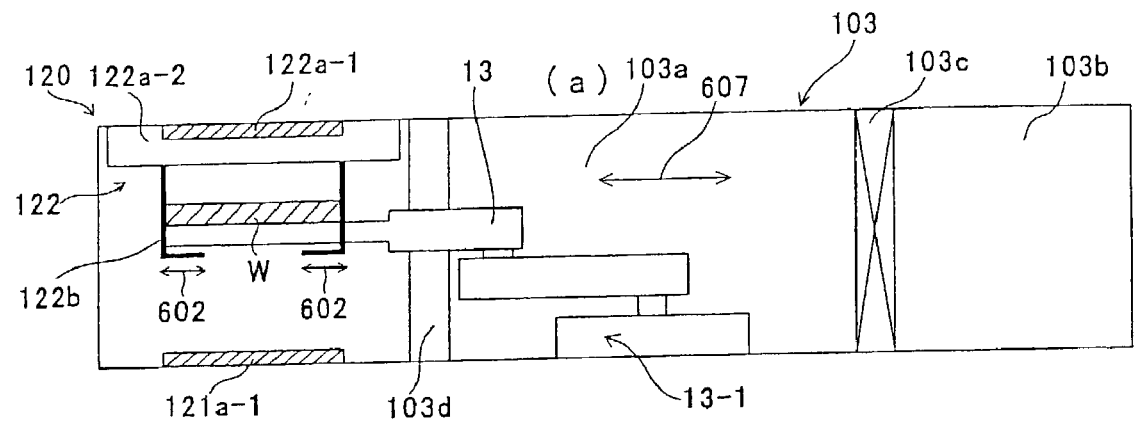
FIG. 15 is a vertical cross-sectional view illustrating the pattern of transfer status of the wafer in FIG. 14.

The linear carriage 122a-2 having received wafer Wb1 stored in FOUP 500b from arm 138 of robot 133 moves from the position illustrated in FIG. 11 to the position corresponding to processing equipment 103 in FIG. 4. This movement is controlled by control unit based on data from sensors informing that the linear carriage 122a-2 has reached a predetermined position (FIG. 14). In FIG. 14, clean gas such as nitrogen gas is introduced into the lock chamber 103a, and thus the pressure within lock chamber 103a is adjusted to almost the same pressure as the ambient pressure of single wafer transfer line 120. Thereafter, gate valve 103d is opened. Then, scoop portion 13-1 of robot 13 passes through the opened gate valve 103d into transfer line 120 (arrow 607). When scoop portion 13-1 reaches the position under wafer Wb1 held by wafer supporter 122b, the movement of scoop portion 13-1 is stopped. Thereafter, wafer supporter 122b is lowered (arrow 601). This lowering is stopped when the back surface of wafer Wb1 comes into contact with scoop portion 13-1 (FIG. 15). Thereafter, wafer supporter 122b is opened toward the radial direction (arrow 602). Thereby, wafer Wb1 is handed over from wafer supporter 122b to scoop portion 13-1. The scoop portion 13-1 having received the wafer Wb1 passes through gate valve 103d and returns to its original position in the lock chamber 103a. Thereafter, as shown in FIG. 15(b), gate valve 103d is closed and the interior of lock chamber 103a is evacuated. When the pressure within lock chamber 103a is substantially equal to the pressure within pressure chamber 103b, gate valve 103c is opened. The scoop portion 13-1 of robot 13 is moved from lock chamber 103a into processing chamber 103b. Thereby, wafer Wb1 being held by scoop portion 13-1 is transferred into processing chamber 103b. Further, wafer Wb1 is placed on a wafer platform (not shown) disposed within processing chamber 103b. The scoop portion 13-1 having handed over the wafer Wb1 returns to lock chamber 103a through gate valve 103c, and returns to its original position within lock chamber 103a for standby. Then, gate valve 103c is closed. At this state, wafer Wb1 mounted on the wafer platform within processing chamber 103b goes through a predetermined process within processing chamber 103b, such as plasma etching process. After plasma etching treatment is completed, the wafer Wb1 exits processing chamber 103b through gate valve 103c, lock chamber 103a and gate valve 103d by the reverse operation as explained before, and is finally transferred to transfer line 120 and handed over to wafer supporter 122b. The linear carriage 122a-2 now holding wafer Wb1 having been plasma etched is guided by linear rails 122a-1 and moves on transfer line 122 toward processing equipment 106.

In FIGS. 11 and 12, the next selected wafer Wb2 inside FOUP 500b is picked up by scoop portion of arm 138 of robot 133 by a movement similar to that explained above and pulled out of FOUP 500b. This second wafer Wb2 is handed over from scoop portion of arm 138 of robot 133 to wafer supporter 122b of linear carriage 122a-2 substantially similarly as explained. Linear carriage 122a-2 having received wafer Wb2 from wafer supporter 122b moves and stops at a position corresponding to processing equipment 103 similarly as explained. However, the process performed at processing equipment 103 differs from that performed at processing equipment 106. Linear carriage 122a-2 supporting wafer Wb1 having been plasma etched in processing equipment 103 is moved along transfer line 122 toward processing equipment 106. Thereafter, linear carriage 122a-2 is stopped when it reaches processing equipment 106. Wafer Wb1 supported by linear carriage 122a-2 is transferred into processing chamber (not shown) of processing equipment 106 similarly as with processing equipment 103. A predetermined process such as a deposition process (CVD, PVD, etc.) is performed to wafer Wb1 entering the processing equipment. After deposition treatment is completed, the treated wafer Wb1 travels from processing chamber through gate valve (not shown), lock chamber (not shown) and gate valve (not shown) to single wafer transfer line 120. The transferred wafer Wb1 is supported by wafer supporter 122b of linear carriage 122a-2 and moves to a position where the arm 138 of robot 133 can receive the wafer. Thereafter, wafer Wb1 being held by wafer supporter 122b of linear carriage 122a-2 is retrieved to its original position within FOUP 500b via robot 133 by an opposite movement as explained above.

On the other hand, wafer Wb2 supported by wafer supporter 122b of linear carriage 122a-2 stopped at a position corresponding to processing equipment 103 is transferred into processing chamber 103b of processing equipment 103 similarly as wafer Wb1, and plasma etched. Thereafter, treated wafer Wb2 is transferred from processing chamber 103b to single wafer transfer line 120, where it is handed over to and supported by wafer supporter 122b of linear carriage 122a-2. Next, linear carriage 122a-2 is driven toward processing equipment 106.

Such procedure is performed repeatedly. Thereby, wafers Wb1, Wb2, . . . Wbn stored in FOUP 500b are sequentially transferred via transfer line 122 to processing equipments 103 and 106. Wafers Wb1, Wb2, . . . Wbn treated by processing equipments 103 and 106 are sequentially returned to FOUP 500b and stored in their original positions within FOUP 500b.

Figure 16:
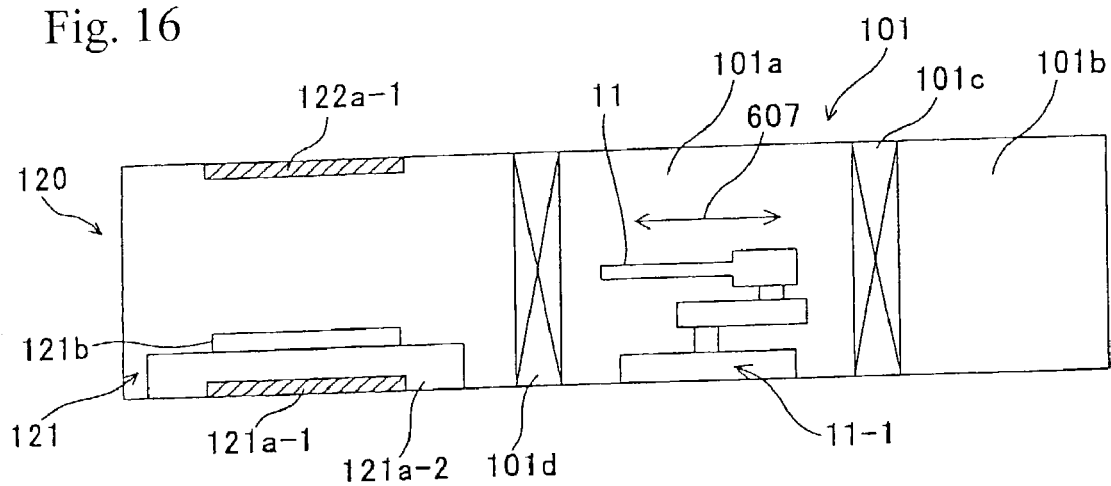
FIG. 16 is a plane view showing partially the example of wafer handover between the lower transfer line and the vacuum processing equipment of FIG. 13.

FIG. 16 illustrates in detail the handover structure between processing equipment 101 and single wafer transfer line 121. In FIG. 16, the spaces of transfer line 120 and lock chamber 101a are separated by gate valve 101d. In the example, the heights of transfer line 120 and lock chamber 101a are roughly the same. The inner spaces of lock chamber 101a and processing chamber 101b are divided by gate valve 101c.

The information on the wafers stored within FOUP 500c is read by a sensor. This information is sent to the control unit. The wafers within FOUP 500c are slow processing speed wafers. Thus in this case, information that the wafers have slow processing speeds is read by the sensor and sent to the control unit. On the other hand, linear carriage 121a-2 of transfer line 121 positioned at a lower position of single wafer transfer line 120a is stopped at a position enabling wafer handover. The stop position and information are sent from the sensor to the control unit. Wafer pushup pins 121c at wafer platform 121b of linear carriage 121a-2 are, in the example, stored within platform 121b. In this example, there are three wafer pushup pins disposed on platform 121b with 120-degree intervals around center of wafer platform 121b. Moreover, these pins can be elevated with predetermined intervals. Robot 133 holding a wafer at the scoop portion of its arm 138 is moved along rails 134 to a position corresponding to linear carriage 121a-2. This movement is stopped by control unit when the robot 133 reaches the position corresponding to carriage 121a-2. During this time, scoop portion of arm 138 holding a wafer is moved toward linear carriage 121a-2. When wafer Wcn supported by scoop portion of arm 138 reaches the position above linear carriage 121a-2, the movement of arm 138 is stopped. Thereafter, wafer pushup pins 121c are elevated. This elevation of the pushup pins is stopped when they reach the back surface of wafer Wcn on the scoop portion of arm 138. Thereby, wafer Wcn is transferred from scoop portion of arm 138 to wafer pushup pins 121c. Thereafter, arm 138 is returned to its original position for standby.

Linear carriage 121a-2 having received wafer Wcn from arm 138 of robot 133 is moved to a position corresponding to processing equipment 101. This movement of linear carriage 121a-2 to the predetermined position is detected by a sensor and controlled by the control unit.

In FIG. 16, clean gas such as nitrogen gas is introduced into lock chamber 101a, and thereby the pressure within lock chamber 101a is adjusted to substantially the same pressure as the single wafer transfer line 120. Thereafter, gate valve 101d is opened. Then, scoop portion 11-1 of robot 11 passes through the opened gate valve 101d into transfer line 120 (arrow 607). On the other hand, wafer Wcn mounted on wafer platform 121b of linear carriage 121a-2 positioned corresponding to processing equipment 101 is handed over from platform 121b to wafer pushup pins 121c by the elevation of pins, and supported thereby.

At this state, when the scoop portion 11-1 of robot 11 reaches the position under wafer Wcn supported by pins 121c, the movement of scoop portion 11-1 is stopped (FIG. 17(a)). Thereafter, wafer pushup pins 121c are lowered. By this movement, wafer Wcn is transferred from pins 121c to scoop portion 11-1. Scoop portion 11-1 having received wafer Wcn passes through gate valve 101d and returns to its original position within lock chamber 101a. Then, gate valve 101d is locked and the inside of lock chamber 101a is evacuated (FIG. 17(b)) When the pressure within lock chamber 101a becomes substantially equal to the pressure within processing chamber 101b, gate valve 101c is opened. Then, scoop portion 11-1 of robot 11 is moved from lock chamber 101a into processing chamber 101b. Thereby, wafer Wcn being held by scoop portion 11-1 is transported into processing chamber 101b. Next, wafer Wcn is transferred onto platform installed to processing chamber 101b. Having handed over wafer Wcn, scoop portion 11-1 returns through gate valve 101c to its original position within lock chamber 101a for standby. Thereafter, gate valve 101c is closed. Then, predetermined treatment such as plasma etching is performed to wafer Wcn mounted on the platform within processing chamber 101b.

Further, the conditions for plasma etching wafer Wb within processing chamber 103b and the conditions for plasma etching wafer Wc within processing chamber 101b are, of course, different. The conditions for plasma etching wafer Wb in processing chamber 103b include short processing time whereas the conditions for plasma etching wafer Wc in processing chamber 101b include long processing time. Wafer Wcn having been plasma etched in chamber 101b is transferred out through gate valve 101c, lock chamber 101a and gate valve 101d to transfer line 120 and onto wafer platform 121b through wafer pushup pins 121c by a reverse operation to what was performed when wafer entered chamber 101b.

Linear carriage 121a-2 supporting wafer Wcn having been plasma etched in chamber 101b is guided by linear rails 121a-1 along transfer line 121 toward processing chamber 105.

In FIGS. 11 and 12, wafer Wcn+1 selected secondly in FOUP 500c is picked up by scoop portion of arm 138a of robot 133 by the same operation as explained above and taken out of FOUP 500c. The wafer Wcn+1 is handed over from scoop portion of arm 138 of robot 133 to wafer platform 121b of linear carriage 121a-2 as explained above. The linear carriage 121a-2 having received wafer Wcn+1 on wafer platform 121b is moved and stopped at a position corresponding to processing equipment 101 as explained. The treatment performed at processing equipment 101 differs from that performed at processing equipment 105. The linear carriage 121a-2 holding wafer Wcn having been plasma etched in processing equipment 101 is moved along transfer line 121 toward processing equipment 105. Thereafter, when linear carriage 121a-2 reaches a position corresponding to processing equipment 105, the carriage movement is stopped. Wafer Wcn supported by linear carriage 121a-2 is transferred into processing chamber (not shown) of processing equipment 105 similarly as in the case of processing equipment 101. A predetermined treatment, such as deposition (CVD, PVD, etc.), is performed to wafer Wcn entering this processing equipment. The wafer Wcn having completed deposition treatment is transferred from processing chamber through gate valve (not shown), lock chamber (not shown) and gate valve (not shown) to transfer line 120. The transferred wafer Wcn is supported by wafer platform 121b of linear carriage 121a-2 and moved to a position where arm 138 of robot 133 can receive the wafer Wcn. Thereafter, wafer Wcn supported by platform 121b of carriage 121a-2 is picked up by robot 133 and returned to its original position within FOUP 500c by steps opposite to those explained above. On the other hand, the next wafer Wcn+1 mounted on wafer platform 121b of linear carriage 121a-2 stopped at a position corresponding to processing equipment 101 is transferred into processing chamber 101b of processing equipment 101 by a movement similar to the above-mentioned wafer Wcn, and receives plasma etching treatment. Thereafter, processed wafer Wcn+1 is transferred out of processing chamber 101b to transfer line 120, and mounted to wafer platform 121b of linear carriage 121a-2. Then, the linear carriage 121a-2 is moved toward processing equipment 105. Thus, the wafers stored in FOUP 500c are sequentially treated in processing equipments 101, 102, 104 and 105 on transfer line 121 in parallel with the transfer/processing of wafers stored in FOUP 500b as explained above. The treated wafers are returned to FOUP 500c one by one, and stored in predetermined positions.

The above explains the case where the wafers stored in FOUP 500b and wafers stored in FOUP 500c have different processing conditions. Next, we will explain the case where the wafers within FOUP 500b and FOUP 500c have the same processing conditions.

In FIG. 4, processing equipments 101–103 are the same equipments such as plasma etching equipments, and processing equipments 104–106 are for example plasma CVD equipments. Processing equipments 101–103 are operated by same wafer processing conditions. Processing equipments 104–106 are operated by same wafer processing conditions. In FIG. 11, FOUP 500b stores fast process speed wafers. FOUP 500c and FOUP 500d store slow process speed wafers. The wafers stored in FOUPs 500b through 500d require the same processing conditions for treatments performed in processing equipments 101–103 and processing equipments 104–106.

Based on similar procedure mentioned above from the state shown in FIGS. 11 and 12, FOUP 500b on platform 412 is transferred and located on the vacant mounting surface of platform 131 via robot 411. Next, when the treatment of wafers stored in FOUP 500d are completed, FOUP 500d is transferred via robot 411 from platform 131 to the mounting surface of platform 412 and placed thereto. Thereafter, AGV 410 is moved in the direction of arrow 605 or 606. Wafer Wb1 stored in FOUP 500b is taken out by robot 133 as explained, and handed over to wafer supporter 122b of linear carriage 122a-2 of transfer line 122. On the other hand, based on the transfer and placement of FOUP 500b, the processing equipment in standby status of processing equipments 101 through 103 is detected by a sensor, the signal of which is output to the control unit. For example, if processing equipment 102 out of processing equipments 101 through 103 is detected as being in a standby status, the linear carriage 122a-2 supporting the wafer Wb1 is moved and stopped at a position corresponding to equipment 102. Wafer Wb1 is then transferred into processing chamber of equipment 102 and receives plasma etching treatment. The wafer Wb1 having been plasma etched is taken out of equipment 102 and returned to wafer supporter 122b of linear carriage 122a-2. In parallel therewith, the processing of wafers Wcn . . . stored in FOUP 500c having slow processing speeds is performed in processing equipments 101 and 103.

Next, the processing equipment in standby state out of the processing equipments 104 through 106 is detected by a sensor and output to the control unit. If equipment 104 out of equipments 104 through 106 is detected as being in standby state, the linear carriage 122a-2 holding wafer Wb1 is moved and stopped at a position corresponding to equipment 104. Wafer Wb1 is then transferred into processing chamber of equipment 104 and receives plasma CVD treatment. The wafer Wb1 having completed CVD treatment is taken out of equipment 104 and returned to wafer supporter 122b of linear carriage 122a-2.

Further, wafers Wcn . . . having slow processing speeds are processed in parallel at processing equipments 105 and 106. Wafer Wb1 having completed its treatment at processing equipment 104 is returned to its original position within FOUP 500b via transfer line 122 and robot 133. Along with this movement, wafers Wcn . . . having completed their treatment at processing equipments 105 and 106 are returned to their original positions within FOUP 500c via transfer line 121 and robot 133. The next wafer Wb2 is selected from FOUP 500b. When processing equipment 101 out of equipments 101 through 103 is at a standby status, wafer Wb2 is transferred to the processing chamber of processing equipment 101 via robot 133 and transfer line 122, and receives plasma etching treatment. The wafer Wb2 having completed its treatment at processing equipment 101 is taken out of processing chamber 101. When processing equipment 105 out of equipments 104 through 106 is at a standby status, wafer Wb2 having completed its treatment at processing equipment 101 is transferred to processing equipment 105 via transfer line 122. Wafer Wb2 is transferred to the processing chamber of equipment 105 and receives plasma CVD treatment. The processed wafer Wb2 is taken out of processing equipment 105 and returned to its original position within FOUP 500b via transfer line 122 and robot 133. Simultaneously, wafers Wcn+1 . . . having slow processing speeds receive plasma CVD treatment at processing equipments 104 and 106. When these treatments are completed, treated wafers Wcn+1 . . . are taken out of processing equipments 104 and 106, and returned to their original positions within FOUP 500c via transfer line 121 and robot 133. The wafers Wb1, Wb2 . . . Wbn stored in FOUP 500b are sequentially treated one by one at the processing equipment in standby state (of equipments 101 through 103). The wafers Wb1, Wb2 . . . Wbn having completed their treatments at processing equipments are then transferred to the processing equipment in standby state (of equipments 104 through 106) and receives plasma CVD treatment. The transfer of wafers Wb1, Wb2 . . . Wbn within the bay is performed by transfer line 122. The wafers Wb1, Wb2 . . . Wbn having been treated at processing equipment 104, 105 or 106 are returned one by one to determined positions within FOUP 500b via transfer line 122 and robot 133. Simultaneously, the treatment of wafers Wcn+1 . . . Wcm having slow processing speeds stored in FOUP 500c is sequentially performed at any one of processing equipments 101 through 103 and at any one of processing equipments 104 through 106. In this case, the transfer of wafers within the bay is performed by transfer line 121. The wafers Wcn, Wcn+1 . . . Wcm that have gone through plasma CVD treatment in any of the treatment equipments 104 through 106 are returned to their original positions in FOUP 500c via transfer line 121 and robot 133.

According to FIGS. 11 and 12, FOUP 500c is mounted on the FOUP mounting surface of platform 131 by a robot 411 on AGV 410. FOUP 500c stores therein a mixture of wafers having fast processing speeds (requiring short processing time) and those having slow processing speeds (requiring long processing time). Here, the processing conditions of each wafer in processing chambers are varied. In FIG. 4, processing equipments 101 through 103 are plasma etching equipments, and processing equipments 104 through 106 are plasma CVD equipments. Moreover, of the plasma etching equipments 101 through 103, equipment 103 is set to a processing condition corresponding to wafers having a short processing time. Equipments 101 and 102 are set to a processing condition corresponding to wafers having a long processing time. Of the processing equipments 104 through 106, equipment 104 is set to a processing condition corresponding to wafers having a short processing time. Equipments 105 and 106 are set to a processing condition corresponding to wafers having a long processing time. Further, transfer line 121 is used to transfer wafers having a long processing time, and transfer line 122 is used to transfer wafers having a short processing time.

In FIGS. 11 through 17, the arm 138 of robot 133 is inserted to FOUP 500c. At this time, the wafer information located above arm 138 is detected by a sensor and output to the control unit. Thereby, the control unit determines that this wafer is, for example, wafer WcS1 having a short processing time. This short processing time wafer WcS1 is then handed over to wafer supporter 122b of linear carriage 122a-2 on transfer line 122 by robot 133. Linear carriage 122a-2 having received wafer WcS1 by wafer supporter 122b is moved along transfer line 122 toward processing equipment 103. Thereafter, a sensor detects that linear carriage 122a-2 storing wafer WcS1 has reached a position corresponding to processing equipment 103, and the movement of carriage is stopped. Then, wafer WcS1 is transferred into processing equipment 103, and plasma etching is performed thereto. When plasma etching treatment is completed, the treated WcS1 is taken out of processing equipment 103 and handed over to wafer supporter 122b of linear carriage 122a-2. Linear carriage 122a-2 having received wafer WcS1 is moved along transfer line 122 toward processing equipment 104. On the other hand, arm 138 of robot 133 is inserted to FOUP 500c. At this time, the wafer information located above arm 138 is detected by a sensor and output to the control unit. Thereby, the control unit determines that this wafer is, for example, a wafer having a slow processing speed. This wafer WcL1 having a slow processing speed is then handed over to wafer platform 121b of linear carriage 121a-2 on transfer line 121 by robot 133. Linear carriage 121a-2 having received wafer WcL1 by wafer platform 121b is moved along transfer line 121 toward processing equipment 102. Thereafter, a sensor detects that linear carriage 121a-2 storing wafer WcL1 has reached a position corresponding to processing equipment 102, and the movement of carriage is stopped. Then, wafer WcL1 is transferred into processing equipment 102, and plasma etching is performed thereto. When plasma etching is completed, the processed WcL1 is taken out of processing equipment 102 and handed over to wafer platform 121b of linear carriage 121a-2. Linear carriage 121a-2 having received wafer WcL1 is moved along transfer line 121 toward processing equipment 105. Thereafter, wafer WcL1 is introduced to processing equipment 105 and receives plasma CVD treatment. When plasma CVD is completed, the processed wafer WcL1 is taken out of processing equipment 105 and handed over to wafer supporter 121b of linear carriage 121a-2. Then, wafer WcL1 is returned to its original position in FOUP 500c. On the other hand, arm 138 of robot 133 is inserted to FOUP 500c. At this time, the wafer information located above arm 138 is detected by a sensor and output to the control unit. Thereby, the control unit determines that this wafer is, for example, a wafer requiring a long processing time. This wafer WcL2 requiring a long processing time is then handed over to wafer platform 121b of linear carriage 121a-2 on transfer line 121 by robot 133. Linear carriage 121a-2 having received wafer WcL2 by wafer platform 121b is moved along transfer line 121 toward processing equipment 101. Thereafter, a sensor detects that linear carriage 121a-2 storing wafer WcL2 has reached a position corresponding to processing equipment 101, and the movement of carriage is stopped. Then, wafer WcL2 is introduced to processing equipment 101, and plasma etching is performed thereto. When plasma etching is completed, the processed WcL2 is taken out of processing equipment 101 and handed over to wafer platform 121b of linear carriage 121a-2. Linear carriage 121a-2 having received wafer WcL2 is moved along transfer line 121 toward processing equipment 106. Thereafter, wafer WcL2 is introduced to processing equipment 106 and receives plasma CVD. When plasma CVD treatment is completed, the treated wafer WcL2 is taken out of processing equipment 106 and handed over to wafer supporter 121b of linear carriage 121a-2. Then, wafer WcL2 is returned to its original position in FOUP 500c. On the other hand, arm 138 of robot 133 is inserted to FOUP 500c. At this time, the wafer information located above arm 138 is detected by a sensor and output to the control unit. Thereby, the control unit determines that this wafer is, for example, a wafer requiring a short processing time. This wafer WcS2 requiring a short processing time is then handed over to wafer supporter 122b of linear carriage 122a-2 on transfer line 122 by robot 133. Linear carriage 122a-2 having received wafer WcS2 by wafer supporter 122b is moved along transfer line 122 toward processing equipment 103. Thereafter, a sensor detects that linear carriage 122a-2 storing wafer WcS2 has reached a position corresponding to processing equipment 103, and the movement of carriage is stopped. Then, wafer WcS2 is introduced to processing equipment 103, and plasma etching treatment is performed thereto. At this time, wafer WcS1 is introduced to processing equipment 104, and plasma CVD treatment is performed thereto. When plasma CVD treatment is completed, the treated wafer WcS1 is taken out of processing equipment 104 and handed over to wafer supporter 122b of linear carriage 122a-2. Thereafter, wafer WcS1 is returned to its original position in FOUP 500c. Then, the wafer WcS2 having completed the plasma etching treatment is taken out of processing equipment 103 and handed over to wafer platform 122b of linear carriage 122a-2. Linear carriage 122a-2 having received wafer WcS1 is moved along transfer line 122 toward processing equipment 104. Thereafter, wafer WcS2 is introduced to processing equipment 104 and receives plasma CVD treatment. When plasma CVD treatment is completed, the treated wafer WcS2 is taken out of processing equipment 104 and handed over to wafer supporter 122b of linear carriage 122a-2. Then, wafer WcS2 is returned to its original position in FOUP 500c.

Thus as explained, wafers WcS1, WcS2 . . . WcSn having a short processing time and wafers WcL1, WcL2 . . . WcLn having a long processing time stored in FOUP 500c sequentially receive processing in processing equipments 101 through 106 along single wafer transfer line 120 before they are returned to their original positions in FOUP 500c.

In FIGS. 11 through 14, FOUP 500a and FOUP 500b are mounted on platform 412 of AGV 410. AGV 410 is moved toward the direction of arrow 604. When it reaches a position corresponding to bay stocker 130 of bay 100, the movement of AGV 410 is stopped. FOUP 500b houses wafers Wbh1, Wbh2 . . . Wbhn corresponding to express specification. Based on the information on these wafers, selection is made on which equipment out of the processing equipments 101 through 106 of FIG. 4 is used to process these wafers, and the conditions for the processing is set. In this case, for example, processing equipments 101 and 105 are selected as devices for processing these express wafers. The remaining processing equipments 102, 103, 104 and 106 are continuously used to process the wafers of FOUP 500c and FOUP 500d. Further, in this example, transfer line 122 is selected as the line of 120 for transferring the express wafers. Transfer line 121 is used to transfer wafers of FOUP 500c and FOUP 500d.

According to FIGS. 11 through 14, FOUP 500b is mounted on a FOUP mounting surface on the right side of FOUP 500d on platform 131 of bay stocker 130. Gate 132c corresponding to FOUP 500b is opened and along therewith the door of FOUP 500b (not shown) is opened. Arm 138 of robot 133 is inserted to FOUP 500b. At this time, the wafer information located above arm 138 is detected by a sensor and output to the control unit. Thereby, the control unit determines that this wafer is, for example, an express wafer. This wafer Wbh1 having express processing speed is then handed over to wafer supporter 122b of linear carriage 122a-2 on transfer line 122 by robot 133. Linear carriage 122a-2 having received wafer Wbh1 by wafer supporter 122b is moved along transfer line 122 toward processing equipment 101. Thereafter, a sensor detects that linear carriage 122a-2 storing wafer Wbh1 has reached a position corresponding to processing equipment 101, and the movement of carriage is stopped. Then, wafer Wbh1 is introduced to processing equipment 101, and plasma etching treatment is performed thereto. When plasma etching treatment is completed, the treated wafer Wbh1 is taken out of processing equipment 101 and handed over to wafer supporter 122*b* of linear carriage 122*a*-2. Linear carriage 122*a*-2 having received wafer Whb1 runs along transfer line 122 toward processing equipment 105. Thereafter, wafer Wbh1 is introduced to processing equipment 105 and receives plasma CVD treatment. When plasma CVD treatment is completed, the treated wafer Wbh1 is taken out of processing equipment 105 and handed over to wafer supporter 122*b* of linear carriage 122*a*-2. Then, wafer Wbh1 is returned to its original position in FOUP 500*b*. Thereafter, arm 138 of robot 133 is inserted to FOUP 500*b*. At this time, the wafer information located above arm 138 is detected by a sensor and output to the control unit. Thereby, the control unit determines that this wafer is, for example, a wafer having express processing speed. This wafer Wbh2 having express processing speed is then handed over to wafer supporter 122*b* of linear carriage 122*a*-2 on transfer line 122 by robot 133. Linear carriage 122*a*-2 having received wafer Wbh2 by wafer supporter 122*b* is moved along transfer line 122 toward processing equipment 101. Thereafter, a sensor detects that linear carriage 122*a*-2 storing wafer Wbh2 has reached a position corresponding to processing equipment 101, and the movement of carriage is stopped. Then, wafer Wbh2 is introduced to processing equipment 101, and plasma etching treatment is performed thereto. When plasma etching treatment is completed, the treated wafer Wbh2 is taken out of processing equipment 101 and handed over to wafer supporter 122*b* of linear carriage 122*a*-2. Linear carriage 122*a*-2 having received wafer Wbh2 is moved along transfer line 122 toward processing equipment 105. Thereafter, wafer Wbh2 is introduced to processing equipment 105 and receives plasma CVD treatment. When plasma CVD treatment is completed, the treated wafer Wbh2 is taken out of processing equipment 105 and handed over to wafer supporter 122*b* of linear carriage 122*a*-2. Then, wafer Wbh2 is returned to its original position in FOUP 500*b*. FOUP 500*b* houses five of these express wafers. The remaining three express wafers are transferred and treated similarly as wafers Wbh1 and Wbh2, and are returned to their original positions in FOUP 500*b*.

Now, it is assumed that FOUP 500*d* stores either the aforementioned wafer having a fast processing speed (requiring short processing time) or the aforementioned wafer having a slow processing speed (requiring long processing time). For example, if FOUP 500*d* houses wafers requiring a short processing time, the wafer WdS is transferred on transfer line 122 and introduced to processing equipment 103 for plasma etching treatment and then transferred to processing equipment 105 for plasma CVD treatment. Thereafter, the treated wafer is returned to its original position in FOUP 500*d*. On the other hand, if FOUP 500*d* houses wafers requiring a long processing time, the wafer WdL1 is transferred on transfer line 121 and introduced to processing equipments 101, 102 for plasma etching treatment and then transferred to processing equipments 104, 106 for plasma CVD treatment. Thereafter, the treated wafer is returned to its original position in FOUP 500*d*. The above-mentioned processes are performed utilizing the interval (waiting time) between the above-explained processes for wafers stored in FOUP 500*c*. This system is performed smoothly by sensors and the control unit.

After retrieving all the wafers having completed the processes, FOUP 500*b* is then mounted on platform 412 of AGV 410. Then, AGV 410 is moved to another location such as another bay (direction of arrows 605 or 606). During this time, the wafers of FOUP 500*c* and FOUP 500*d* are transferred on transfer line 121 into processing equipments 102 or 103 and processing equipments 104 or 106, and receive treatment sequentially. The treated wafers are then returned to their original positions in FOUP 500*c* or FOUP 500*d*. When all processes to be performed at bay 100 to express wafers stored in FOUP 500*b* are completed, the process conditions set to processing equipments 101 and 105 corresponding to express wafers are returned to normal. Thereafter, the untreated wafers within FOUP 500*c* and FOUP 500*d* are transferred on line 121 to processing equipments 101 through 106 for treatments. The treated wafers are returned to their original positions within FOUP 500*c* and FOUP 500*d*.

The above explains in detail one preferred embodiment of the present invention.

This embodiment has the following advantageous effects.

1. Even when wafers requiring a long processing time and wafers requiring a short processing time exist in a mixture on the transfer line within the same bay, the present embodiment comprises two transfer lines capable of transferring wafers in parallel as the in-bay transfer line, so it is possible to perform transferring and processing of both the wafers requiring a long processing time and those requiring a short processing time in an isolated manner. Thus, according to the present invention, it is possible to selectively utilize the two transfer lines according to the various processing conditions of the wafers, or in other words, the transfer lines can be selectively utilized for wafers requiring a long processing time and for those requiring a short processing time, respectively, preventing waiting time for the transferring and processing of wafers from occurring as in the prior art. In other words, according to the prior art, transfer time is determined or limited by the wafers requiring longer processing time, but since according to the present embodiment two transfer lines are selectively utilized individually, there is no such limitation. According to the present embodiment, processing time will not be delayed, the speed of the whole process will not drop, and the throughput of the whole bay is thereby maintained.

2. Even when wafers requiring a long processing time and those requiring a short processing time but with same processing conditions exist in a mixture on the transfer line within the same bay, the present embodiment has two transfer lines that are capable of transferring wafers in parallel as the in-bay transfer line, so it is possible to perform transferring and processing of both the wafers requiring a long processing time and those requiring a short processing time in an isolated manner. Thus, according to the present invention, it is possible to selectively utilize the two transfer lines by using one for wafers requiring a long processing time and the other for those requiring a short processing time having the same processing conditions, thereby preventing waiting time for the transferring and processing of wafers from occurring as in the prior art. In other words, according to the prior art, transfer time is determined or limited by the wafers requiring longer processing time, but since according to the present embodiment two transfer lines are selectively utilized independently, there is no such limitation. According to the present embodiment, processing time will not be delayed, the speed of the whole process will not drop, and the throughput of the whole bay is thereby maintained.

3. Even when wafers requiring a long processing time and those requiring a short processing time and having different processing conditions exist in a mixture on the transfer line within the same bay, the present embodiment has two transfer lines that are capable of transferring wafers in parallel as the in-bay transfer line, so it is possible to perform transferring and processing of both the wafers requiring long processing time and those requiring short processing time in an isolated manner. Thus, according to the present invention, it is possible to selectively utilize the two transfer lines by using one for wafers requiring a long processing time and the other for those requiring a short processing time with different processing conditions, thereby preventing waiting time for the transferring and processing of wafers from occurring as in the prior art. In other words, according to the prior art, transfer time is determined or limited by the wafers requiring longer processing time, but since according to the present embodiment two transfer lines are selectively utilized independently, there is no such limitation. According to the present embodiment, processing time will not be delayed, the speed of the whole process will not drop, and the throughput of the whole bay is thereby maintained.

4. In case wafers to be subjected to different treatments exist in a mixture within the same FOUP, and even when wafers requiring a long processing time and those requiring a short processing exist on the transfer line within the same bay, the present embodiment comprising two transfer lines that are capable of transferring wafers in parallel as the in-bay transfer line, so it is possible to perform transferring and processing of both the wafers of the same FOUP requiring a long processing time and those requiring a short processing time in an isolated manner. Thus, according to the present invention, it is possible to selectively utilize the two transfer lines by using one for wafers requiring a long processing time and the other for those requiring a short processing time, thereby preventing waiting time for the transferring and processing of wafers from occurring as in the prior art. In other words, according to the prior art, transfer time is determined or limited by the wafers requiring longer processing time, but since according to the present embodiment two transfer lines are selectively utilized independently, there is no such limitation. According to the present embodiment, processing time will not be delayed, the speed of the whole process will not drop, and the throughput of the whole bay is thereby maintained.

5. In case processing of the wafers are to be performed by express specification, even when wafers requiring a long processing time and those requiring a short processing time exist in a mixture on the transfer line within the same bay, the present embodiment has two transfer lines that are capable of transferring wafers in parallel as the in-bay transfer line, so it is possible to perform transferring and processing of both the wafers requiring a long processing time and those requiring a short processing time in an isolated manner. Thus, according to the present invention, it is possible to selectively utilize the two transfer lines by using one for wafers requiring a long processing time and the other for those requiring a short processing time, thereby preventing waiting time for the transferring and processing of wafers from occurring as in the prior art. In other words, according to the prior art, transfer time is determined or limited by the wafers requiring longer processing time, but since according to the present embodiment two transfer lines are selectively utilized independently, there is no such limitation. According to the present embodiment, processing time will not be delayed, the speed of the whole process will not drop, and the throughput of the whole bay is thereby maintained.

Moreover, the present embodiment realizes the following advantageous effects.

6. Since the single wafer transfer line is composed of two transfer lines capable of transferring wafers in parallel, and since these two transfer lines are formed so that one line is disposed above the other, there is not much increase in occupied floor space in the clean room (footprint) by this additional transfer line. Therefore, the present embodiment enables to prevent any deterioration of throughput per footprint.

7. Since the transfer space of the two upper and lower transfer lines constituting the single wafer transfer line is maintained in a clean gas atmosphere, the required cleanliness of the clean room to which the transfer line is installed can be eased. Thus, the cost of building and maintaining the clean room can be cut down.

8. Since the inter-bay transfer line and the in-bay transfer line (single wafer transfer line) are communicated with an atmospheric loader-type bay stocker, the handling of FOUP between the inter-bay transfer line and the bay stocker can be automated and simplified.

9. When the bay stocker is designed as an atmospheric loader (loader disposed between atmosphere and clean gas atmosphere), there is no need to form an atmospheric loader portion to each of the processing equipments within the bay, so the system can be simplified and equipment expenses can be cut down.

10. Since the clean gas atmosphere of the atmospheric loader portion of bay stocker is communicated with the clean gas atmosphere of the transfer space of the single wafer transfer line, the equipment supplying cleaning gas thereto can be integrated, and therefore the equipment expenses and operation costs can be cut down.

11. Since the two transfer lines constituting the single wafer transfer line are disposed one above the other, and since the wafers being transferred by each of the two lines can be loaded into the corresponding processing equipments independently, the transferring of wafers by each transfer line, the loading of wafers from each of the transfer lines to corresponding processing equipments and the treatment of wafers at each processing equipment can be performed smoothly. Accordingly, even when wafers requiring various processing times are mixed in a bay, or even when wafers requiring express processing are introduced to the bay, the throughput within the bay and the overall throughput of the system is maintained.

12. According to the present embodiment, the height of the single wafer transfer line space and the height of the lock chamber of each processing chamber are substantially the same, so the desired processing equipments can be connected to the single wafer transfer line without having to dispose any special interface unit. Therefore, the structure of each bay can be simplified, the time required to build the bays is reduced, and the equipment expenses can be cut down.

Further to the above-explained preferred embodiment, a failure detector can be disposed on the single wafer transfer line for detecting malfunction (FIG. 4). If for example the transfer line 121 is broken by some cause, this failure is detected at once by the failure detector. The detection signal is sent to a control unit (not shown), and thereby, for example, the operation of the transfer line 122 is started. Thus, even when such unusual event occurs, the single wafer transfer within the bay is continuously performed without being stopped. Thus, the processing equipments can treat wafers continuously without halt, and all the operation within the bay is performed smoothly. Moreover, since the transfer and treatment of wafers within the bay is prevented from stopping, all the other transferring and treating of wafers at other related bays can be performed normally without being stopped.

Moreover, according to the above embodiment, the single wafer transfer line is composed of a pair of transfer lines disposed one above the other, but according to another example, the lower transfer line can be formed as the explained example but the upper transfer line can utilize OHT, for example.

Figure 19:
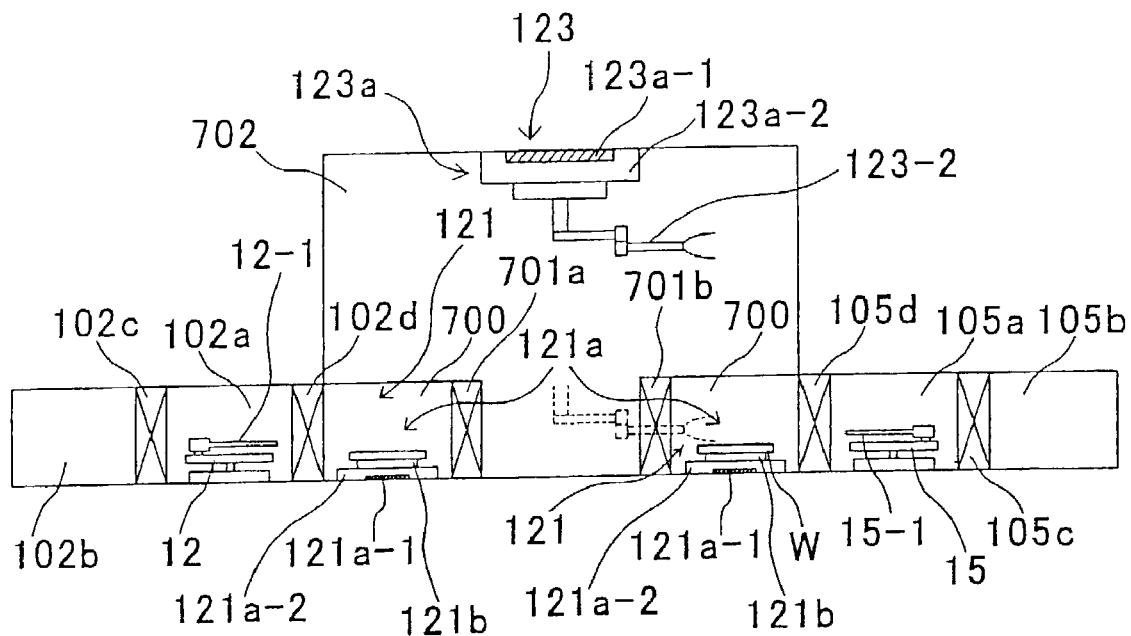
FIG. 19 is a vertical cross-sectional view showing the main portion of FIG. 18.

FIGS. 18 and 19 illustrate the second embodiment of the present invention. The difference of the second embodiment from the embodiment illustrated in FIGS. 4, 6, 7, 14 etc. is that the single wafer transfer line 120b is, in the present case, composed of a loop-shaped transfer line 121 and a linear transfer line 123 disposed at the longitudinal center area of line 121.

In FIG. 18, processing equipments 101 through 106 are disposed along the longitudinal transfer direction of transfer line 121 and the transfer direction of transfer line 123, three on either side.

In FIG. 18, transfer line 123 comprises, according to this example, two robots 123-1 and 123-2 having scoop portions for supporting wafers which are movably disposed on either side of the transfer direction of transfer line 123.

Similar to the first embodiment, moving bodies 121a each composed of linear rails 121a-1 and a linear carriage 121a-2 are disposed on the bottom wall portion of a loop-shaped transfer chamber 700 of the transfer line 121 as shown in FIG. 19. A wafer platform 121b is formed on linear carriage 121a-2 of moving body 121a. Since the moving body 121a and the wafer platform 121b are the same as those utilized in the first embodiment, detailed explanations thereof are omitted.

In FIG. 19, gates 701a and 701b are disposed on the opposing sides of transfer chamber 700. On the side opposite thereto, for example, lock chambers 102a and 105a are disposed via gate valves 102d and 105d, respectively. Robots 12 and 15 respectively comprising a scoop portion 12-1 and scoop portion 15-1 are disposed in lock chambers 102a and 105a, respectively. Processing chambers 102b and 105b are connected to lock chambers 102a and 105a through gate valves 102c and 105c, respectively. In FIG. 19, the other components are the same as those explained with reference to FIG. 13 illustrating the first embodiment, so detailed explanations are omitted. According to FIG. 19, clean gas such as nitrogen gas is supplied into transfer chamber 700, maintaining the interior to nitrogen atmosphere.

In FIG. 19, a transfer chamber 702 including in its interior the transfer line 123 is disposed. In this example, transfer line 123 is located at the top wall portion of transfer chamber 702. In other words, the top wall of transfer chamber 702 is equipped with a moving body 123a. The moving body 123a adopts a non-contact moving body, in this case linear rails 123a-1 and linear carriage 123a-2. Linear rails 123a-1 are disposed on the top wall of transfer chamber 702. Linear carriage 123a-2 is movably disposed on and guided by linear rails 123a-1. A robot 123-2 with a wafer scoop portion is disposed on linear carriage 123a-2. The atmosphere within transfer chamber 702 can either be atmospheric or of clean gas.

In FIGS. 18 and 19, robot 123-2 of linear transfer line 123 having received a determined wafer at bay stocker 130 is moved along transfer line 123 by the movement of linear carriage 123a-2. This movement is stopped when linear carriage 123a-2 reaches a position corresponding to the predetermined processing equipment. Thereafter, robot 123-2 holding the wafer by the scoop portion is lowered toward the bottom wall of transfer chamber 702. This descent is stopped at a height where the wafer can be handed over to the scoop portion 12-1 of robot 12 disposed in lock chamber 102a. Thereafter, gate valve 701a is opened, and scoop portion supporting the wafer is loaded into transfer chamber 700 through gate valve 701a. On the other hand, gate valve 102d is opened, and scoop portion 12-1 of robot 12 within lock chamber 102a is moved into transfer chamber 700 via gate valve 102d, and stopped at position to receive the wafer. After handing over the wafer, robot 123-2 is pulled back through gate valve 701a to its original position (height) for standby. Scoop portion 12-1 of robot 12 having received the wafer is pulled back into lock chamber 102a through gate valve 102d. Thereafter, gate valve 102d is closed, and the interior of lock chamber 102a is evacuated to the same pressure as processing chamber 102b. Then, gate valve 102c is opened, and the wafer is transferred from lock chamber 102a into processing chamber 102b, where it is subjected to a predetermined treatment. Further, the processed wafer is returned to bay stocker portion 130 by the reverse operation.

The other robot 123-1 on linear transfer line 123 illustrated in FIG. 18 operates in a similar manner, so detailed explanation thereof is omitted.

In FIG. 18, it is possible for control robot 123-1 disposed on the left side to correspond to the processing equipments located on the left side and center, and for control robot 123-2 disposed on the right side to correspond to the processing equipments located on the right side and center.

The embodiment illustrated in FIGS. 18 and 19 has the following advantages.

1. Even when the processing devices in a bay are set to provide different treatments to the wafers, the selective utilization of the loop transfer line and the linear transfer line prevents the speed of transfer of wafers within the bay and the passing of wafers between the wafer transfer equipment and the processing devices from being limited by the various wafer processing, so deterioration of throughput is advantageously suppressed.
2. Even when the contents of wafer processing are varied per each FOUP, for example, the selective utilization of the loop transfer line and the linear transfer line prevents the speed of transfer of wafers within the bay and the passing of wafers between the wafer transfer equipment and the processing devices from being limited by the various FOUPs, so deterioration of throughput is advantageously suppressed.
3. The confusion related to transferring wafers within the bay and handing over wafers between the wafer transfer equipment and the processing devices that may be caused when only one kind of wafer processing is performed within the bay can be prevented by selectively utilizing the loop transfer line and the linear transfer line, so deterioration of throughput is advantageously suppressed.

4. Even when wafers requiring various processing time are mixed within the bay, the selective utilization of the loop transfer line and the linear transfer line enables to treat wafers requiring short processing time and those requiring long processing time appropriately, so deterioration of throughput is advantageously suppressed.

5. When performing large item small volume production, by selectively utilizing the linear transfer line to correspond to express specification wafers, for example, the transferring of wafers requiring express treatment can be performed independently from the other wafers being treated in a normal manner, so the processing of the wafers requires less time, and deterioration of throughput is advantageously suppressed.

6. Even when a failure occurs to the wafer transfer line, either the loop transfer line or the linear transfer line can still be utilized, so the processing within the bay or the processing performed at other bays will not be stopped.

7. Since the single wafer transfer line is constituted of two lines, the loop transfer line and the linear transfer line, and since the linear transfer line can be installed within the installation area of the loop transfer line, the increase of footprint can be suppressed and the deterioration of throughput per footprint is prevented.

Moreover, since according to the present embodiment, one of the transfer lines is a linear transfer line unlike the first embodiment, so the structure of the single wafer transfer line is simplified and the installation cost can be cut down.

Furthermore, the present embodiment enjoys the same advantages as the first embodiment.

Figure 20:
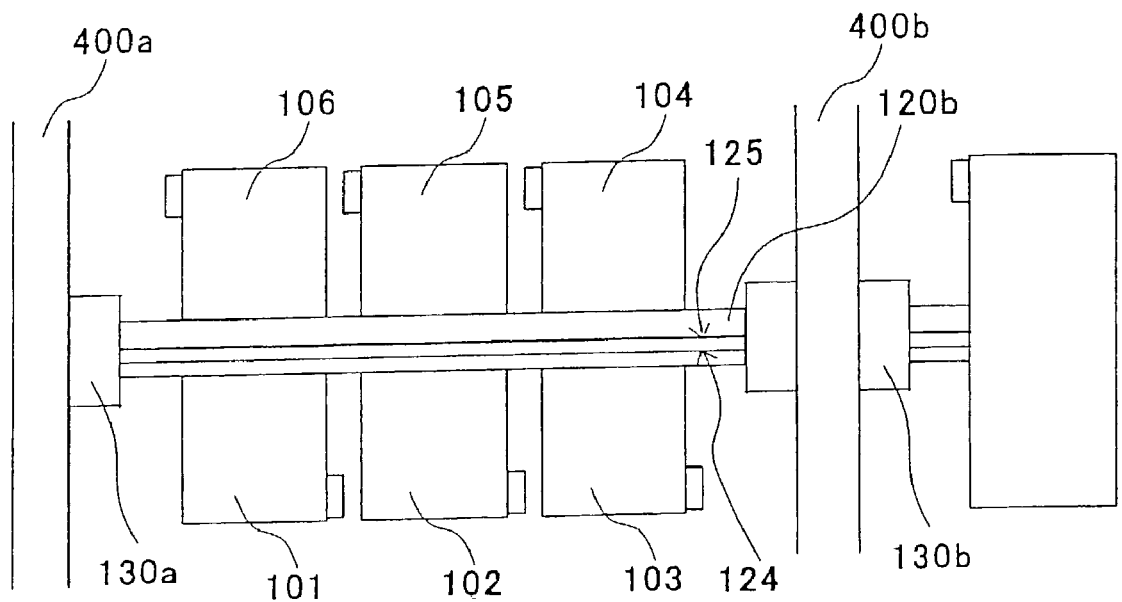
FIG. 20 is a plane view illustrating partially the third embodiment of the semiconductor fabrication line according to the present invention.
Figure 21:
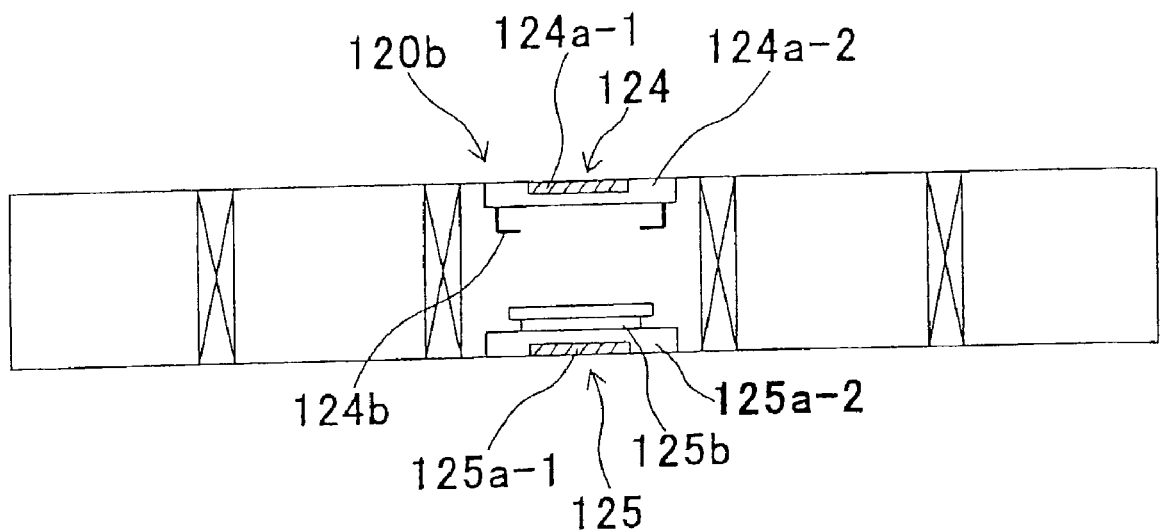
FIG. 21 is a vertical cross-sectional view showing the main portion of FIG. 20.

FIGS. 20 and 21 illustrate the third embodiment of the present invention. The structure of FIGS. 20 and 21 that differs from the first embodiment of the present invention illustrated in FIGS. 4, 6, 7, 14 etc. is that the single wafer transfer line according to embodiment 3 is composed of a linear transfer line and another linear transfer line.

In FIGS. 20 and 21, the transfer lines 124 and 125 are disposed one above the other in vertical relationship, wherein transfer line 125 is set as the lower line and transfer line 124 is set as the upper line. Further, in FIG. 20, the single wafer transfer line 120*b* is disposed between inter-bay transfer lines 400*a* and 400*b*, having bay stocker portions 130*a* and 130*b* disposed at the corresponding ends.

In FIGS. 20 and 21, the actual structure of the single wafer transfer line 120*b* is substantially the same as that of embodiment 1 shown in FIGS. 6 and 7, so detailed explanation is omitted. Further, in FIG. 20, six processing equipments 101 through 106 are disposed along the direction of transfer of the single wafer transfer line, three on each side thereof.

Moreover, the structure of the inter-bay transfer line, the bay stockers, the connection with the single wafer transfer line, and the connection between the single wafer transfer line and each processing equipments are substantially the same as those of the first embodiment explained already, so detailed explanations thereof are omitted.

The embodiment of FIGS. 20 and 21 have the following advantages.

1. Even when the processing devices in a bay are set to provide different treatments to the wafers, the selective utilization of the two linear transfer lines prevents the speed of transfer of wafers within the bay and the passing of wafers between the wafer transfer equipment and the processing devices from being limited by the various wafer processing, so deterioration of throughput is advantageously suppressed.

2. Even when the contents of wafer processing are varied per each FOUP, for example, the selective utilization of the two linear transfer lines prevents the speed of transfer of wafers within the bay and the passing of wafers between the wafer transfer equipment and the processing devices from being limited by the various FOUPs, so deterioration of throughput is advantageously suppressed.

3. The confusion related to transferring wafers within the bay and handing over of wafers between the wafer transfer equipment and the processing devices that may be caused when the wafer processing performed within the bay are the same can be prevented by selectively utilizing the two linear transfer lines, so deterioration of throughput is advantageously suppressed.

4. Even when wafers requiring various processing time are mixed within the bay, the selective utilization of the two linear transfer lines enables to treat wafers requiring short processing time and those requiring long processing time appropriately, so deterioration of throughput is advantageously suppressed.

5. When performing large item small volume production, by selectively utilizing one of the linear transfer lines to correspond to express specification wafers, for example, the transferring of wafers requiring express treatment can be performed independently from the other wafers being treated in a normal manner, so the processing of the wafers requires less time, and deterioration of throughput is advantageously suppressed.

6. Even when a failure occurs to the wafer transfer line, either one of the linear transfer lines can still be utilized, so the processing within the bay or the processing performed at other bays will not stop.

Moreover, since according to the present embodiment the single wafer transfer line is composed of two linear transfer lines unlike the first and second embodiments, the increase of footprint can further be effectively suppressed, and the drop of throughput per footprint can even further be prevented. Moreover, since the single wafer transfer line comprises two linear transfer lines, the structure of the line is simplified and the related costs can be cut down.

Even further, when transferring wafers from the bay shown in FIG. 20 to the neighboring bay by going across the inter-bay transfer line, the transfer distance of the wafers can be made minimum by utilizing either of the corresponding bay stockers. Therefore, the transfer time of the wafers can be cut down and the throughput can be improved.

FIGS. 22 through 25 illustrate the fourth embodiment of the present invention.

The structure of FIGS. 22 through 25 that differ from the first embodiment illustrated in FIGS. 13 through 17 is that the lock chamber 107*a* of the processing equipment 107 is disposed below the single wafer transfer line 120.

Figure 22:
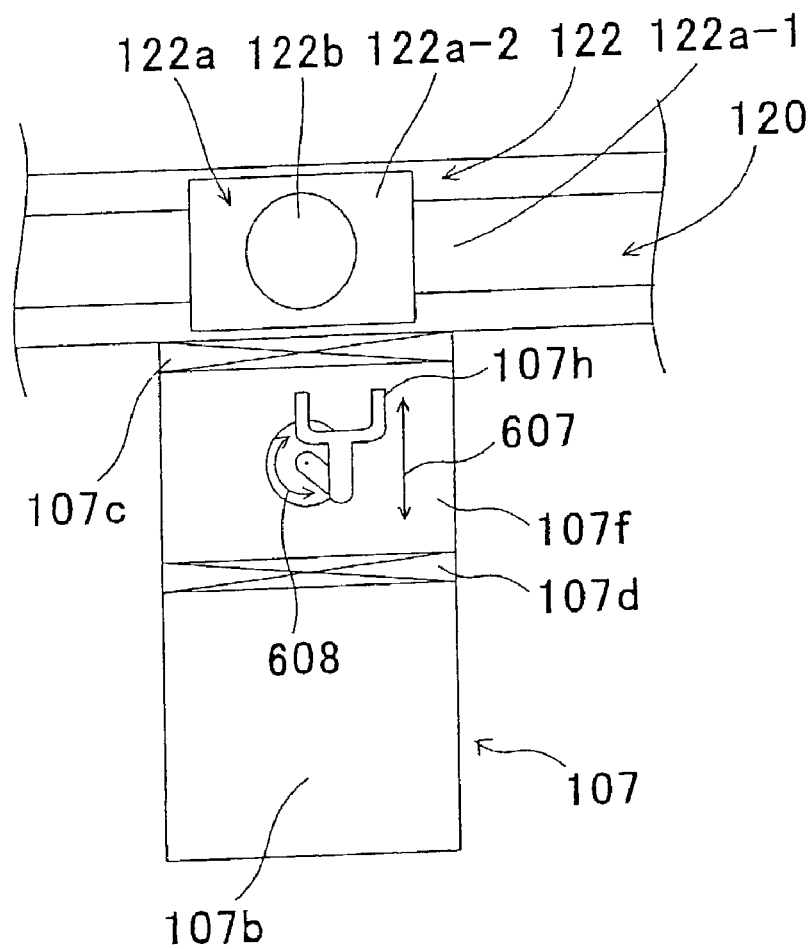
FIG. 22 is a vertical cross-sectional view of the fourth embodiment of the semiconductor fabrication line according to the present invention, illustrating the second embodiment of the wafer handover structure between the upper transfer line and the vacuum processing equipment.
Figure 24:
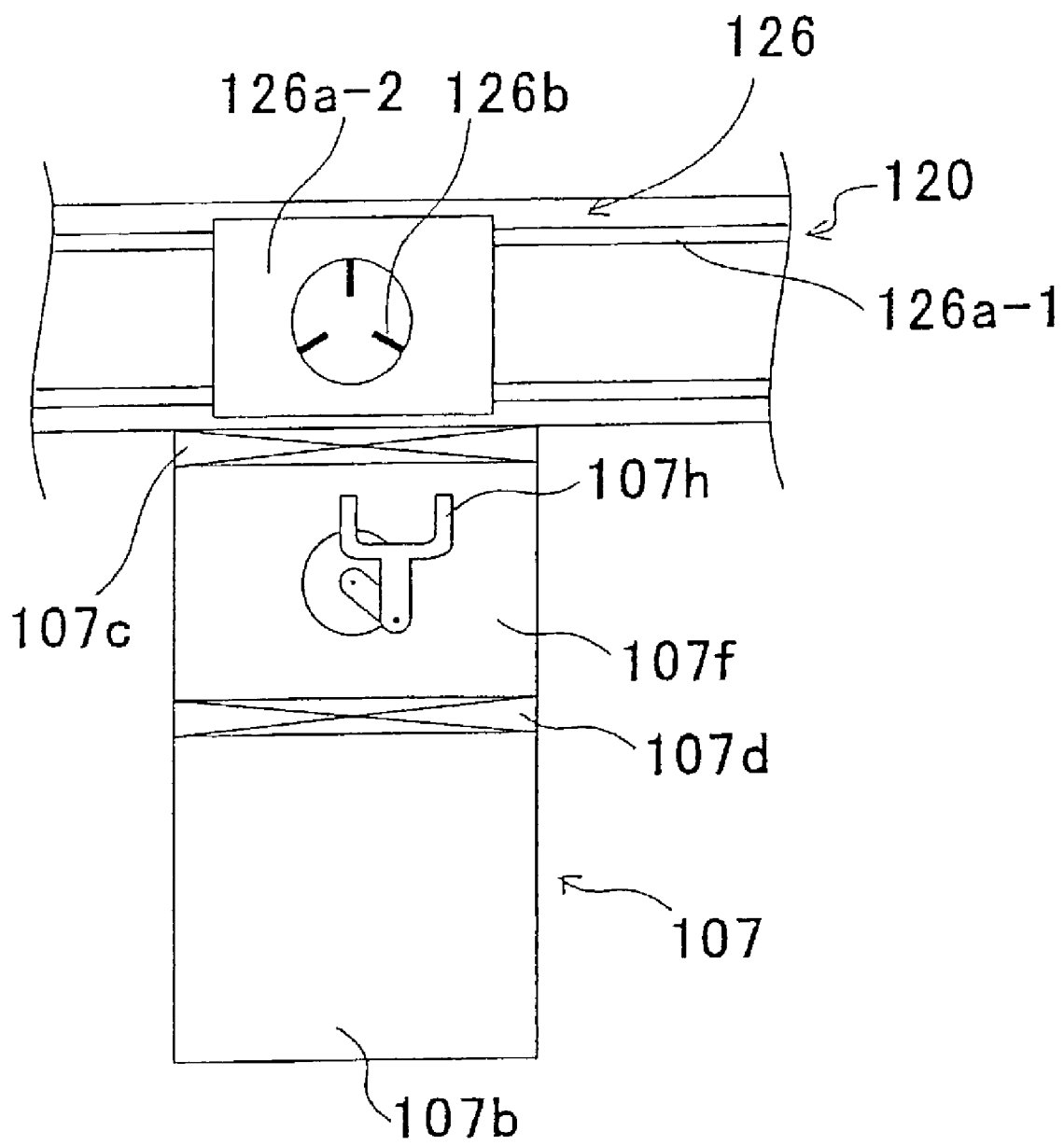
FIG. 24 is a vertical cross-sectional view of the fourth embodiment of the semiconductor fabrication line according to the present invention, illustrating the second embodiment of the wafer handover structure between the lower transfer line and the vacuum transfer equipment.
Figure 25:
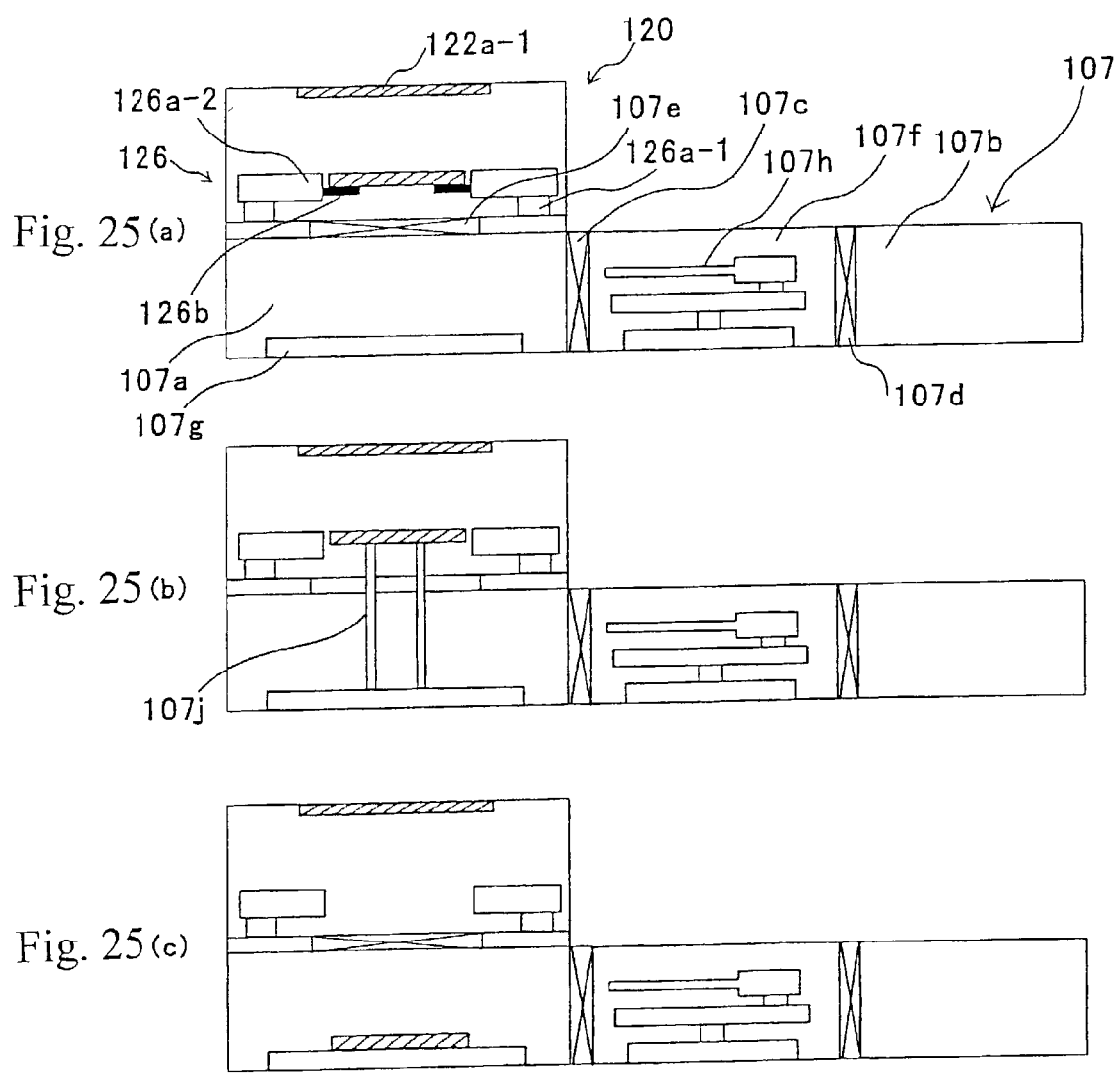
FIG. 25 is a vertical cross-sectional view illustrating the pattern of transfer condition of the wafer according to FIG. 24.

FIGS. 22 and 23 illustrate the hand over structure between the upper transfer line 122 of the single wafer transfer line 120 and the processing equipment 107, and an example of how a wafer is transferred. FIGS. 24 and 25 illustrate the connection between the lower transfer line 126 of the single wafer transfer line 120 and the processing equipment 107, and an example of how a wafer is transferred.

In FIGS. 22 and 23, lock chamber 107*a* of processing equipment 107 is disposed to the space below single wafer transfer line 120. The spaces of the single wafer transfer line and lock chamber 107a are isolated by a gate valve 107e. In the example, the center of wafer platform 122a-2 and wafer supporter 122b and the center of opening of gate valve 107e correspond perpendicularly. The size of the opening of gate valve 107e is at least greater than the size of wafer W, or in other words, its size enables wafer W to pass through. In this case, linear rails 126a-1 of transfer line 126 is divided into two parts. The linear rails are disposed to straddle over gate valve 107e. The structure of the transfer line 122 is similar to that of embodiment 1, so detailed explanation is omitted. Wafer platform 107g is disposed on the bottom wall of lock chamber 107a. The upper surface of wafer platform 107g becomes the wafer supporting surface, and the wafer supporting surface corresponds to the opening portion of gate valve 107e. A transfer chamber 107f is connected to lock chamber 107a via a gate valve 107c, and a processing chamber 107b is connected to transfer chamber 107f via a gate valve 107d. Transfer chamber 107f is provided with a robot 107h.

In FIG. 22, wafer W is supported by wafer supporter 122b, and wafer platform 122a-2 is moved along transfer line 122 toward processing equipment 107. When wafer platform 122a-2 reaches a position corresponding to processing equipment 107 as shown in FIG. 22, the movement of wafer platform 122a-2 is stopped (FIG. 23(a)). Thereafter, clean gas such as nitrogen gas is introduced to the interior of lock chamber 107a, and thereby the lock chamber 107a is adjusted to the same pressure as the interior of the single wafer transfer line, which is substantially at atmospheric pressure. Then, gate valve 107e is opened. Thereafter, wafer pushup pins 107j stored within wafer platform 107g of lock chamber 107a are elevated. The elevation of wafer pushup pins 107j is stopped when their upper ends pass through the opening of gate valve 107e and reach the back surface of wafer W having its outer periphery supported by wafer supporter 122b (FIG. 23 (b)). Thereafter, the opening of wafer supporter 122b in the radial direction releases the wafer W from supporter 122b and onto wafer pushup pins 107j. The pins 107j having received wafer W is lowered. This lowering movement is stopped when the pins hand over wafer W to wafer platform 107g. Thereafter, gate valve 107e is closed (FIG. 23(c)). In this state, the interior of lock chamber 107a is evacuated. When the interior pressure becomes equal to the pressure of transfer chamber 107f, gate valve 107c is opened. Thereafter, pushup pins 107j are reactivated, and thus wafer W is disposed above wafer platform 107g. Then, scoop portion of robot 107h passes through the opening of gate valve 107c into the lock chamber 107a. The scoop portion of robot 107h loaded into lock chamber 107a stops moving when it reaches the back surface of wafer W (FIG. 23(d)). Thereafter, wafer pushup pins 107j are lowered and stored in wafer platform 107g. The robot 107h having received wafer W by its scoop portion travels through gate valve 107c and returns into transfer chamber 107f. Then, gate valve 107c is closed (FIG. 23(e)). The operation performed thereafter is the same as the first embodiment, so detailed explanation thereof is omitted. The wafer having been treated in processing chamber 107b is returned by a reverse operation from processing chamber 107b through transfer chamber 107h, lock chamber 107a and into the single wafer transfer line, and rests in wafer supporter 122b of transfer line 122. Then, this wafer is either transferred to a different processing equipment or to FOUP.

According to FIGS. 24 and 25, a wafer platform is movably disposed on linear rails 126a-1 straddling over gate valve 107e. The wafer platform is provided with a wafer supporter. In the example, wafer supporter is provided with a scoop member for scooping the outer periphery of the back surface of the wafer. There are three scoop members disposed with 120-degree intervals, which are capable of being opened toward the radial direction. In the example, the center of the wafer platform and the wafer supporter corresponds to the center of the opening of gate valve 107e perpendicularly. The other structures are the same as those of FIGS. 22 and 23, so detailed explanations thereof are omitted. In FIG. 24, wafer W is supported by the wafer supporter on a wafer platform, and in this state, the wafer platform is moved along transfer line toward processing equipment 107. When this wafer platform reaches a position corresponding to processing equipment 107 as illustrated in FIG. 24, the movement of the wafer platform is stopped (FIG. 25(a)). Thereafter, clean gas such as nitrogen gas is introduced to the interior of lock chamber 107a, and thereby the lock chamber 107a is adjusted to the same pressure as the interior of the single wafer transfer line, which is substantially at atmospheric pressure. Then, gate valve 107e is opened. Thereafter, wafer pushup pins 107j stored within wafer platform 107g of lock chamber 107a are elevated. The elevation of wafer pushup pins 107j is stopped when their upper ends pass through the opening of gate valve 107e and reach the back surface of wafer W having its outer periphery supported by the wafer supporter. Thereafter, the opening of wafer supporter in the radial direction releases the wafer W from the supporter and onto wafer pushup pins 107j (FIG. 25(b)). The pins 107j having received wafer W is lowered. Then, gate valve 107e is closed (FIG. 25(c)).

Figures 23A, 23B, 23C, 23D, 23E:
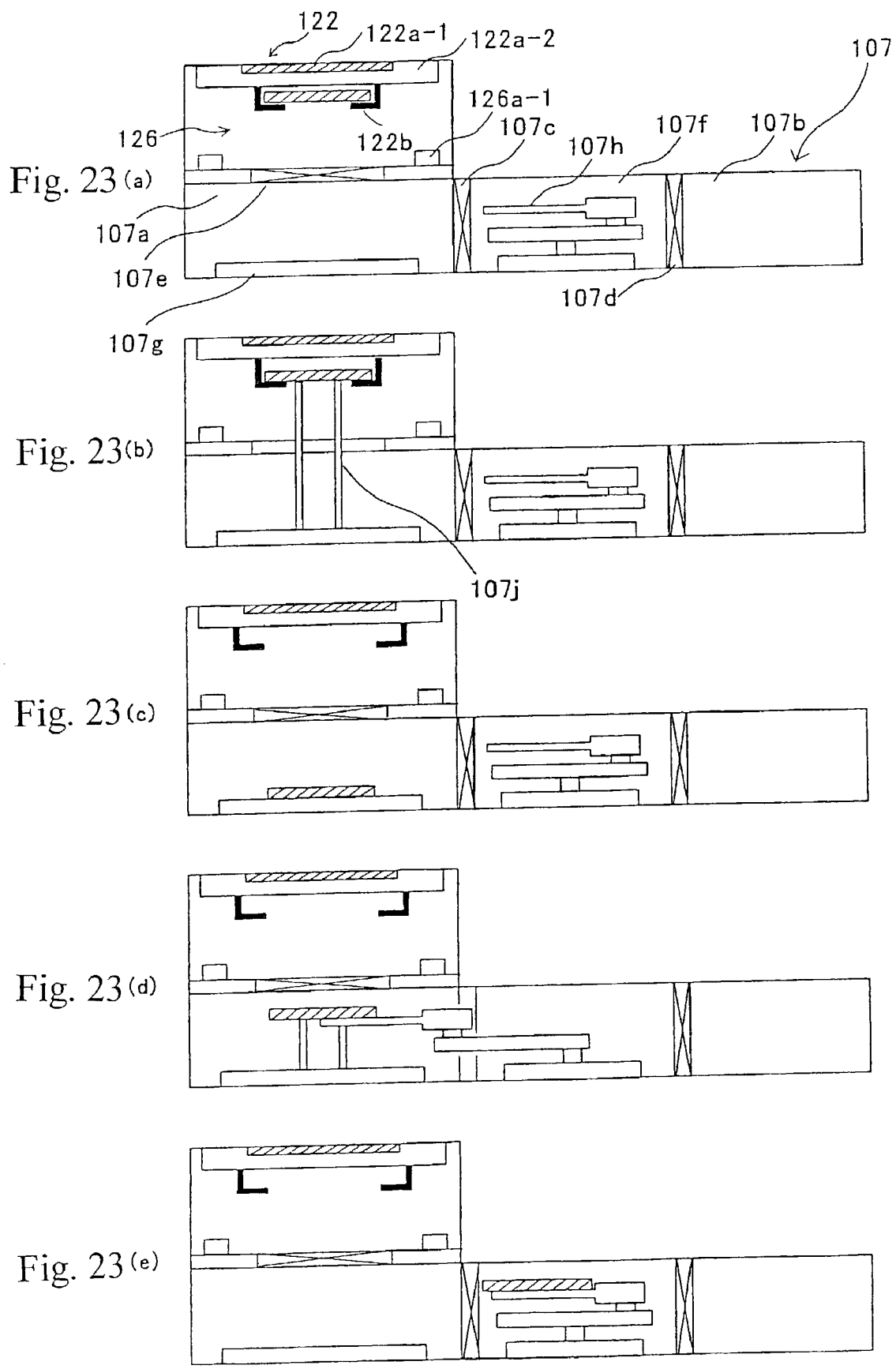
FIG. 23 is a vertical cross-sectional view illustrating the pattern of transfer status of the wafer according to FIG. 22.

The transferring and processing of the wafer that follows is substantially the same as illustrated in FIGS. 23(d) and (e) so detailed explanation is omitted.

The present embodiment enjoys the following advantages in addition to the advantages of the first embodiment.

1. Since the lock chamber of the vacuum processing chamber is disposed directly below the single wafer transfer line, the depth size of the vacuum processing equipment can be reduced, and thus the footprint can be reduced and the throughput per footprint can therefore be improved.
2. Since the transfer robot disposed within the vacuum transfer chamber of the vacuum processing equipment does not have to move in the vertical direction (up-down movement), the cost of the robot is effectively cut down and the possibility of malfunction etc. is reduced.

The present embodiment explained the case where the lock chamber of the processing equipment is disposed below the single wafer transfer line, but according to another example, the lock chamber can be disposed above the transfer line. Such example enjoys the same advantages as the present embodiment.

Figure 26:
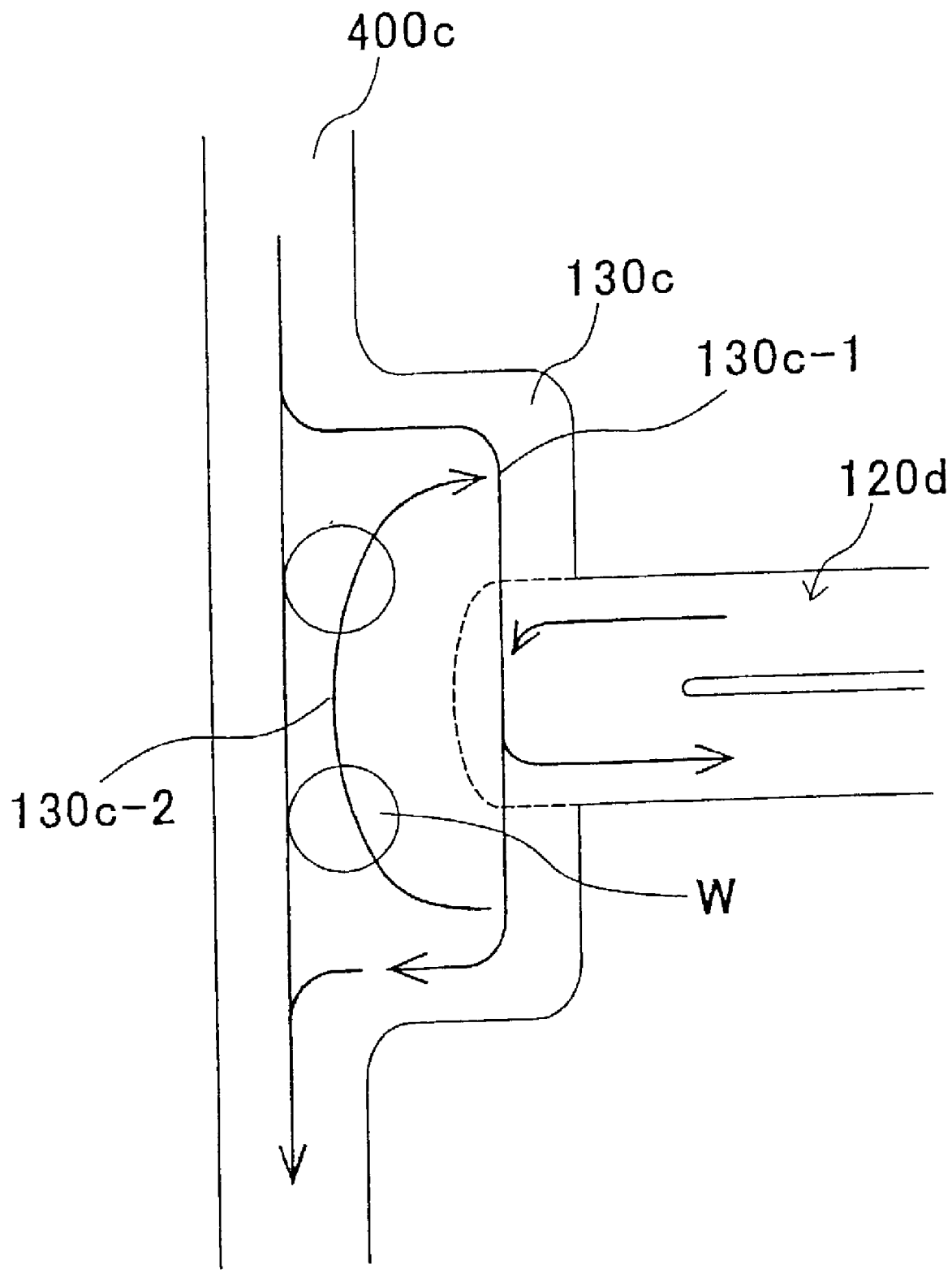
FIG. 26 is a partial plan view showing the fifth embodiment of the semiconductor fabrication line according to the present invention, illustrating the wafer handover between the inter-bay transfer line and the single wafer transfer line within the bay.

FIG. 26 illustrates the fifth embodiment of the present invention related to the connection between the inter-bay transfer line, the bay stocker portion and the single wafer transfer line.

The points of embodiment 5 that differ from the structure of FIG. 11 illustrating the first embodiment are the following.

The greatest difference between the present embodiment and the first embodiment is that the transfer of wafers between the inter-bay transfer line 400c, the bay stocker portion 130c and the single wafer transfer line 120d are all performed by single wafers.

In FIG. 26, the inter-bay transfer line 400c is designed so as to transfer single wafers. For example, inter-bay transfer line 400c comprises a tunnel-like transfer chamber (not shown) defining a space maintained at clean gas atmosphere or decompressed atmosphere, and a means (not shown) disposed within the transfer chamber for supporting and transferring a single wafer. The wafer transfer means comprises, for example, a linear moving body as explained in the first embodiment and a wafer supporter disposed to the linear moving body. The wafer can be supported by the wafer supporter for example with its processing surface facing upward. A plurality of wafer supporters can be disposed on the linear moving body either in a connected manner or in an independent manner.

In FIG. 26, the transfer chamber and the linear moving body of inter-bay transfer line 400c is branched at the upstream side of bay stocker portion 130c, and then connected again at the downstream side thereof. In the present embodiment, the bay stocker side of loop-shaped single wafer transfer line is connected to the branched transfer line 130c-1 of bay stocker portion 130c. Single wafer transfer line 120d comprises a loop-shaped transfer chamber (not shown) and a means (not shown) disposed within the transfer chamber for supporting and transferring a single wafer, which is in this example two upper and lower transfer means. The loop-shaped transfer chamber is controlled either to clean gas atmosphere or to depressurized atmosphere. In this example, two sets of wafer transfer means comprises a linear moving body and a wafer supporter disposed on the linear moving body. In the lower wafer supporter, the wafer is supported horizontally so that the processing surface faces upward, for example. In the upper wafer supporter, the wafer is supported horizontally so that the processing surface faces upward, or faces downward. On the lower side, plural wafer supporters are disposed on the lower linear moving body which are either engaged to each other or are independently movable.

According to FIG. 26, the transfer chamber and the linear moving body of the single wafer transfer line 120d is connected to the transfer chamber and the linear moving body of the branched transfer line 130c-1, respectively. The transfer chamber of the single wafer transfer line 120d and the transfer chamber of the branched transfer line 130c-1 of the bay stocker 130c are communicated to each other.

In FIG. 26, the linear moving body on the upper transfer line of single wafer transfer line 120d is connected to the linear moving body of branched transfer line 130c-1 enabling wafer handover. In the example, the wafer handover between the branched transfer line 130c-1 and the single wafer transfer line 120d is performed using the upper transfer line. Further, the present embodiment enables wafers to be handed over between the upper transfer line and the lower transfer line. In this case, the wafer being transferred on the branched transfer line 130c-1 is handed over from the branched transfer line 130c-1 to the upper transfer line. Thereafter, according to the processing data comprised by the wafer, the wafer is either transferred as it is along the upper transfer line to the predetermined processing equipment or handed over from the upper transfer line to the lower transfer line and then transferred along the lower line to the predetermined processing equipment. Then, when the wafer completes all the predetermined processes within the bay, the wafer is either transferred along the upper transfer line and then handed over to the bay stocker 130c, or transferred along the lower transfer line and then handed over to the upper transfer line and thereafter loaded into the bay stocker 130c.

The control related to the selective utilization of the transfer line is performed similar to the first embodiment, for example, so detailed explanation thereof is omitted.

According to FIG. 26, the transfer line branched from the lower stream side of branched transfer line 130c-1 at bay stocker portion 130c is then merged to the branched transfer line at the upper stream side of branched transfer line. This transfer line 130c-2 comprises a tunnel-shaped transfer chamber (not shown) and linear rails disposed within the transfer chamber for guiding the explained linear moving body. In this example, the transfer chamber is connected to the branched transfer chamber, and the linear rails are connected to the linear rails of the branched transfer line. The transfer chamber and the branched transfer chamber are in a communicated state.

In this example, the inside of the transfer chamber comprises a stocker function and a buffer function for organizing the transfer operation.

According to FIG. 26, if a wafer out of the wafers being transferred one by one along inter-bay transfer line 400c is determined as requiring treatment within the bay, the wafer is transferred onto branched transfer line 130c-1 from inter-bay transfer line 400c. The wafer being transferred to branched transfer line 130c-1 is transferred one by one along either the upper side or the lower side of single wafer transfer line 120d according to its process contents etc. Thus, the wafers are transferred one by one to the predetermined processing device, and there it is subjected to the determined processing. The treated wafer is transmitted one by one along the transfer line of single wafer transfer line 120d, and is merged to inter-bay transfer line 400c via bay stocker portion 130c. Thereafter, the wafer is transferred to another bay etc. via inter-bay transfer line 400c.

In FIG. 26, the wafer either before or after processing can be temporarily stored in the bay stocker portion 130c if necessary. FIG. 26 illustrates an example where two wafers can be temporarily stocked, but the number can be determined according to need.

The present embodiment enjoys the following advantages in addition to the advantages realized by the first embodiment.

1. Since the inter-bay transfer line and the single wafer transfer line are both designed to transfer wafers one by one, the structure and design of the bay stocker connecting these lines can be greatly simplified and the size can be minimized compared to that of the first embodiment. Therefore, the construction fee of the transfer line can be cut down compared to the first embodiment. Moreover, since the footprint is minimized, the throughput per footprint is greatly improved.
2. Since the inter-bay transfer line, the bay stocker portion and the single wafer transfer line are at clean gas atmosphere or depressurized atmosphere, the required cleanliness of the clean room in which these equipments are installed can be relaxed, and as a result equipment expenses can be cut down.

The above embodiment explained the case where the wafers themselves are transferred one by one, but according to another example, a wafer supporter equipped with a space maintaining clean gas atmosphere or depressurized atmosphere capable of housing a single wafer can be utilized to transfer the wafers one by one.

In this example, the transfer chamber explained with reference to FIG. 16, which is the transfer chamber constituting the inter-bay transfer line, the bay stocker portion and the in-bay single wafer transfer line, is not necessary. However, a moving body for moving the wafer supporter, such as a linear moving body comprising linear rails and a linear carriage, is still necessary. Moreover, a means for communicating and shutting the communication between the lock chamber and wafer supporter must be equipped to each processing chamber.

For example, the wafer supporter housing one wafer is mounted to a linear carriage on linear rails of the inter-bay transfer line, the bay stocker portion and the inner bay transfer line and carried to the predetermined processing equipment. Thereafter, the interior of the wafer supporter and the lock chamber are communicated, and the wafer housed in the wafer supporter is loaded into the lock chamber, and then further transferred from the lock chamber into the processing chamber to receive predetermined treatment. The treated wafer is transferred out from the processing chamber to the lock chamber, and then returned to the wafer supporter and housed therein. Thereafter, the communication between the wafer supporter and the lock chamber is shut, and the wafer supporter is isolated from the lock chamber. Then, the wafer supporter is transferred to another processing equipment or to the bay stocker portion. The wafer supporter having reached bay stocker portion is transferred on the inter-bay transfer line to another bay.

The present embodiment enjoys the following advantages in addition to the advantages realized by the embodiment illustrated in FIG. 26.

1. Since the inter-bay transfer line, the bay stocker portion and the in-bay single wafer transfer line are all designed to have an open structure, the construction of these equipments can be further simplified, and the construction fee thereof can be cut down.
2. Since the inter-bay transfer line, the bay stocker portion and the in-bay single wafer transfer line are all designed to have an open structure and the wafers are housed in wafer supporters when being transferred, the required cleanliness of the transfer chamber can be relaxed, and the equipment expenses can therefore be reduced.
3. Since the inter-bay transfer line, the bay stocker portion and the in-bay single wafer transfer line are all opened to the clean room, maintenance can be performed easily.

Figure 27:
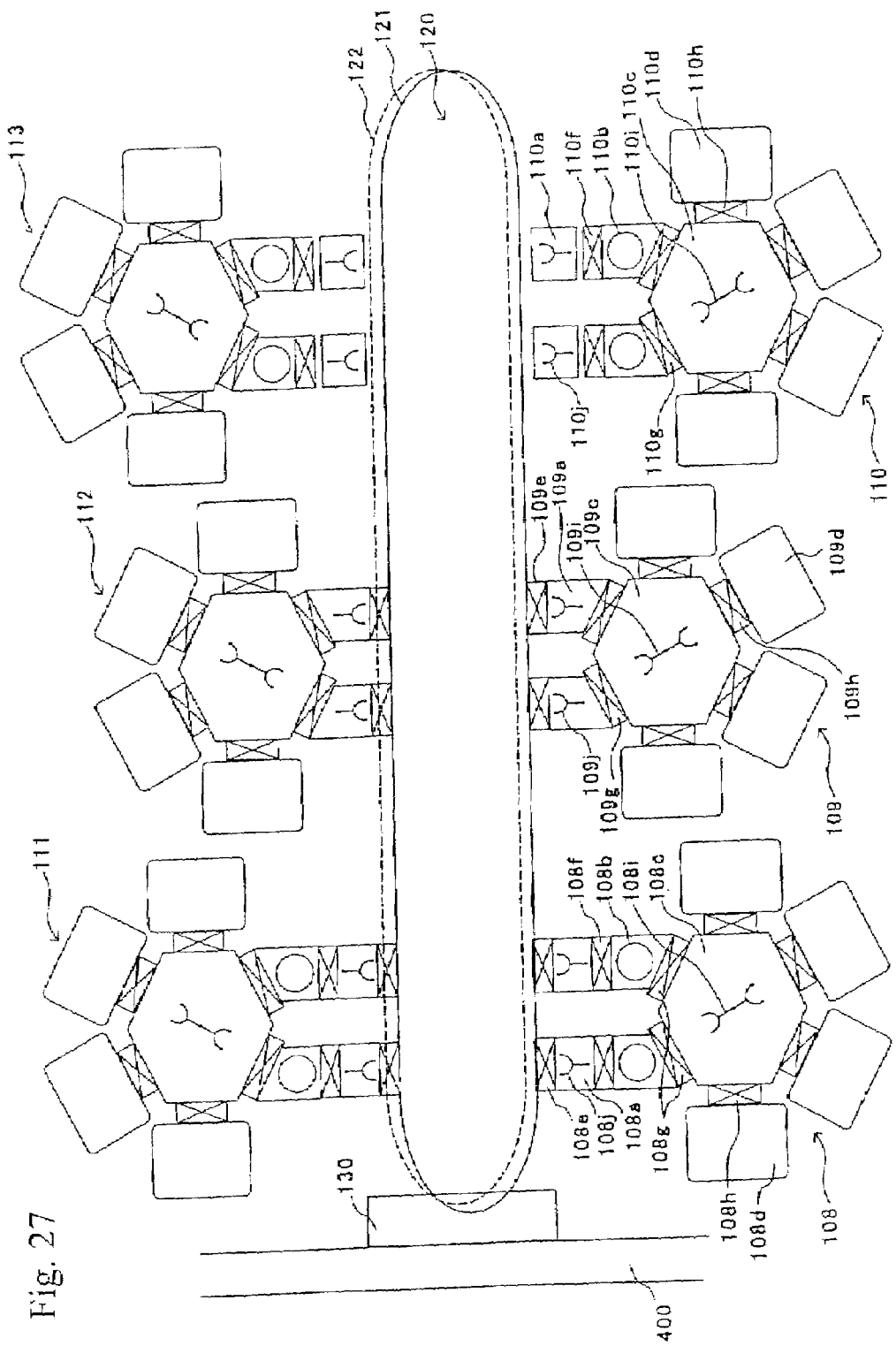
FIG. 27 is a plane view of the bay portion showing the sixth embodiment of the semiconductor fabrication line according to the present invention, illustrating the wafer handover between the in-bay single wafer transfer line and the processing equipments.

FIG. 27 illustrates the sixth embodiment of the present invention. The points of the embodiment of FIG. 27 that differ from the first embodiment illustrated in FIGS. 4 and 13 etc. are the following.

According to FIG. 27, the processing equipment 108 disposed along single wafer transfer line 120 has the following structure. According to the example of FIG. 27, the processing equipment 108 comprises a common vacuum transfer chamber 108c, to which are equipped plural vacuum processing chambers, such as single-wafer vacuum processing chambers 108d each capable of treating a single wafer at a time. In FIG. 27, the shape of vacuum transfer chamber 108c is, for example, hexagonal. Four vacuum processing chambers 108d are disposed to correspond to each side, chambers 108d being connected to the side walls of vacuum transfer chamber 108c via gate valves 108h, respectively. The vacuum transfer chamber 108c houses a wafer transfer robot, which is in this embodiment a double armed robot 108i having two wafer scoop portions.

In FIG. 27, the processing equipment 108 disposed at the left edge or close to inter-bay transfer line 400 comprises two wafer storage chambers 108b connected via gate valves 108g to the remaining two sides of the vacuum transfer chamber 108c. Each wafer storage chamber 108b comprises a lock chamber 108a connected there to via a gate valve 108f. Inside each lock chamber 108a is disposed a robot 108j for transferring wafers. Each lock chamber 108a and single wafer transfer line 120 are designed so that wafers (in this example, single wafers) can be handed over via gate valve 108e. This handover structure is substantially the same as that of the first embodiment, so detailed explanation thereof is omitted.

In FIG. 27, according to the processing equipment 108 disposed at the left side edge, the wafer transferred along either transfer lines of single wafer transfer line 120 is passed through opened gate valve 108e and received by robot 108j inside lock chamber 108a (gate valve 108e closed), and is temporarily stored in wafer storage chamber 108b. In the wafer storage chamber 108b, processes such as cleaning, baking and heating of the wafer is performed, the treatment depending on the contents of processing performed to the wafer within vacuum processing chamber 108d. Thereafter, the wafer is passed through gate valve 108h into vacuum transfer chamber 108c from wafer storage chamber 108b by robot 108i of the vacuum transfer chamber 108c, and then transferred from vacuum transfer chamber 108c to any of the vacuum processing chambers 108d to be subjected to processing. Thus, treatment of the wafers is performed in each vacuum processing chamber. The wafer having been treated completely within vacuum processing chamber 108d is transferred via opened gate valve 108h into wafer storage chamber 108b by robot 108i in vacuum transfer chamber 108c, where it is temporarily stored (gate valve 108h closed). For example, when heating is performed to the wafer, wafer storage chamber 108b is used as a cooling chamber. Thereafter, the wafer is passed through opened gate valve 108f into lock chamber 108a from wafer storage chamber 108b by robot 108j (gate valve 108f closed). Then, the wafer is transferred through opened gate valve 108e from lock chamber 108a to either of the transfer lines of single wafer transfer line 120 so that it can be transferred to another location, such as to another processing equipment or to FOUP.

According to such structure where the equipment comprises a wafer storage chamber, contamination of the vacuum transfer chamber and each vacuum processing chamber can be prevented effectively as compared to the first embodiment, and as a result, the deterioration of throughput caused by contamination is suppressed.

Further, for example, the left side lock chamber 108a can be connected to the lower transfer line 121 via gate valve 108e, and the right side lock chamber 108a can be connected to the upper transfer line 122 via gate valve 108e.

According to such example, the transfer processing line can be separated and made use of in two lines, one line connecting the lower transfer line 121, the left side lock chamber 108a, the left side wafer storage chamber 108b, the vacuum transfer chamber 108c and the left side two vacuum processing chambers 108d, the other line connecting the upper transfer line 122, the right side lock chamber 108a, the right side wafer storage chamber 108b, the vacuum transfer chamber 108c and the right side two vacuum processing chambers 108d. Therefore, wafer processing can be performed in parallel using these two lines, and wafer processing can be performed with further tolerance. Moreover, even if one of the two lines is stopped by failure etc., the remaining line can be used to continue transfer and processing of wafers, thus suppressing the deterioration of wafer productivity.

Further, according to FIG. 27, the processing equipment 109 disposed at the center of the system comprises two lock chambers 109a corresponding to the two remaining sides of vacuum transfer chamber 109c via gate valve 109g. Inside each lock chamber 109a is disposed a robot 109j for transferring wafers. Each lock chamber 109a and single wafer transfer line 120 are designed so that wafers (in this example, single wafers) can be handed over via gate valve 109e. This handover structure is substantially the same as that of the left side processing equipment 108, so detailed explanation thereof is omitted.

In FIG. 27, according to the processing equipment 109 disposed at the center, the wafer transferred along either of the transfer lines of single wafer transfer line 120 is passed through opened gate valve 109e and received by lock chamber 109a (gate 109e opened). Thereafter, the wafer is passed through opened gate valve 109g from lock chamber 109a into vacuum transfer chamber 109c, and then transferred by robot 109j of vacuum transfer chamber 109c from vacuum transfer chamber 109c to any of the vacuum processing chambers 109d. Thus, processing of the wafers is performed in each vacuum processing chamber 109d. The wafer having been processed completely within vacuum processing chamber 109d is transferred via opened gate valve 109g into wafer storage chamber 109c and onto lock chamber 109a by robot 109i in vacuum transfer chamber 109c (gate valve 109g closed). Thereafter, the wafer is passed through opened gate valve 109e from lock chamber 109a by robot 109j to either of the transfer lines of single wafer transfer line 120 so that it can be transferred to another location, such as to another processing equipment or to FOUP.

In this design, the processing equipment is not equipped with a wafer storage chamber 108b as compared to the example of the left side equipment, so the depth of the processing equipment can be reduced and the footprint can be cut down. Thus, according to the center processing equipment, the throughput per footprint can be improved as compared to the example of the left side processing equipment. The advantages of the present example are substantially the same as those of embodiment 1.

According to FIG. 27, the processing equipment 110 disposed at the right side end of the system which is farthest from inter-bay transfer line 400 comprises lock chambers 110b which are equipped with wafer transfer chambers 110a via gate valves 110f, respectively. Each wafer transfer chamber 110a is equipped with a wafer transfer robot 110j. The wafer transfer chamber 110a does not have a lock function, and is always communicated with the single wafer transfer line 120.

According to processing equipment 110 disposed at the right end of FIG. 27, the wafer having been transferred along either of the transfer lines of single wafer transfer line 120 is received by robot 110j inside wafer transfer chamber 110a, and is passed through opened gate valve 110f into lock chamber 110b (gate valve 110f closed). Thereafter, the wafer inside lock chamber 110b is transferred via opened gate valve 110g into vacuum transfer chamber 110c by robot 110i of vacuum transfer chamber 110c, and then further transferred from vacuum transfer chamber 110c to any of the vacuum processing chambers 110d and processed. After being treated in vacuum processing chamber 110d, the wafer is transferred through opened gate valve 110h and further transferred from vacuum transfer chamber 110c to lock chamber 110b by robot 110 of vacuum transfer chamber 110d (gate 110g closed). Thereafter, the wafer is transferred by robot 110j of wafer transfer chamber 110a from lock chamber 110b to either of the transfer lines of single wafer transfer line 120 so that it can be sent to another location, such as to another processing equipment or to FOUP etc.

According to such structure, the wafer transfer chamber 110a functions as an interface between single wafer transfer line 120 and each processing equipment, so the installation of processing equipments to the bay is simplified. For example, the processing equipments are manufactured including the lock chamber at the manufacturer, so when it is connected to the single wafer transfer line of the bay, size deviation or size error may make the installation process very difficult. However, this problem is solved by providing an interface unit as in the present embodiment. Moreover, since according to the present embodiment the system comprises a lock chamber, compared to the structure of embodiment 1, the contamination of the vacuum transmission chamber and the vacuum processing chambers can be prevented, and the deterioration of throughput caused by contamination can be suppressed. Moreover, if necessary, the left side wafer transfer chamber can be connected to the lower transfer line of the single wafer transfer line and the right side wafer transfer chamber can be connected to the upper transfer line thereof.

According thereto, the transfer processing line can be divided into two lines improving usability, one line connecting the lower transfer line 121, the left wafer transfer chamber 110a, the left lock chamber 110b, the vacuum transfer chamber 110c and the two left vacuum processing chambers 110d, and the other line connecting the upper transfer line 122, the right wafer transfer chamber 110a, the right lock chamber 110b, the vacuum transfer chamber 110c, and the two right vacuum processing chambers 110c. This example enjoys the same advantages as the left side equipment.

Further, according to this configuration, there is no need to provide a depressurizing means to the wafer transfer chamber, and when the atmosphere within single wafer transfer line is maintained at clean gas atmosphere, a means should be provided to introduce clean gas into wafer transfer chamber being communicated therewith. If the single wafer transfer line is disposed in open space, the transfer chamber can also be designed as an open structure.

We have explained the seventh embodiment of the present invention with reference to FIG. 27, but explanation on the structures that are similar to the first embodiment illustrated in FIGS. 4 and 13 are omitted.

Further improvements are possible for the embodiment of FIG. 27.

1. FIG. 27 explains the case where plural single wafer processing vacuum chambers are connected to one common vacuum transfer chamber, but is not limited thereto. For example, the vacuum processing chamber can be of the type where plural wafers can be treated at once (batch processing chamber), or a combination of such batch processing chambers and single wafer processing chambers.
2. The bay can be composed of single wafer multi-type processing equipments, batch processing equipments, a combination of batch processing and single wafer processing equipments, or a combination of single unit processing equipments where only one vacuum processing chamber is equipped.
3. The bay can be composed of a combination of vacuum processing equipments and other processing equipments such as normal pressure processing equipments for treating wafers under normal pressure or pressurizing processing equipments for treating wafers under pressurized condition.

For example, the bay can adopt a lithography equipment, a plasma CVD equipment, a sputtering equipment, a plasma etching equipment, an inspection/evaluation equipment, a CMP (chemical mechanical polisher), a vacuum evaporation equipment, a coating equipment, and so on.

The processing equipments required for treating the wafers within the bay are selected and disposed according to the actual use.

Figure 28:
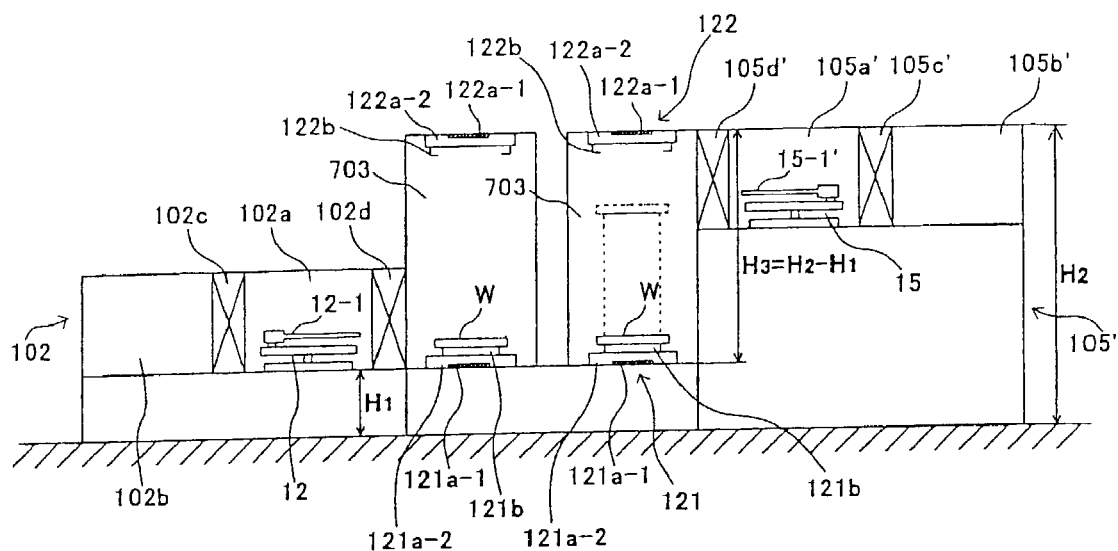
FIG. 28 is a cross-sectional view showing the seventh embodiment of the semiconductor fabrication line according to the present invention, illustrating the traverse cross-section of the single wafer transfer line.

FIG. 28 illustrates the seventh embodiment of the present invention. FIG. 28 is a cross-sectional view showing the traversed state of the single wafer transfer line.

In FIG. 28, the left side transfer chamber 703 is connected to a lock chamber and a processing chamber disposed in this order toward the left direction thereof via gate valves. According to FIG. 28, the bottom surface of the transfer chamber 703, the lock chamber 102a and the processing chamber 102c are substantially at the same height. They are disposed at height $H_1$ from the base floor surface. On the other hand, according to FIG. 28, the top wall surface of the transfer chamber 703, the lock chamber 105a' and the processing chamber 105b' are substantially at the same height. They are disposed at height $H_2$ from the base floor surface. Therefore, in FIG. 28, the height $H_3$ of transfer chamber 703 is $H_2-H_1$.

Inside the transfer chamber 703, linear rails 121a-1 for a non-contact moving body is disposed on the bottom surface as a lower transfer line 121, and linear rails 122a-1 for a non-contact moving body is disposed on the upper wall as an upper transfer line 122. Here, the structure of the transfer lines 121 and 122 are substantially the same as those of the former embodiment, so detailed explanation thereof are omitted. Further, the transfer chamber 703 is maintained at clean gas environment, similar to the former embodiment.

According to FIG. 28, transfer robots 12 and 15' having wafer scooping portions 12-1 and 15-1' are disposed in the left and right lock chambers 102a and 105a', similar to the former embodiment. In general, a processing equipment including lock chambers 102a and 105a' is manufactured independently by the equipment manufacturer, and installed to the bay of the semiconductor factory. If the heights of the lock chambers are roughly the same in various equipments, there is no problem. However, in many cases the height of the lock chambers of various equipments differs.

The embodiment illustrated in FIG. 28 aims at solving this problem by designing the single wafer transfer line as an interface unit. Thus, even when the heights of lock chambers differ in various equipments, the problem caused thereby can be solved according to the present embodiment and the bay can be structured smoothly.

In FIG. 28, the wafer being transferred along lower transfer line 121 is handed over to robot 12 of lock chamber 102a in a similar manner as in the foregoing embodiment. On the other hand, the wafer transferred on the upper transfer line 122 is handed over to robot 12 of lock chamber 102a as follows. At first, the wafer supporter 122b holding the wafer is lowered. The lowering movement is stopped at a height (position) where the wafer can be handed over to robot 12 in lock chamber 102a. Thereafter, gate valve 102d is opened, and the scoop portion 12-1 of robot 12 in lock chamber 102a is moved out toward wafer supporter 122b, thereby scooping the wafer on the wafer supporter 122b by scoop portion 12-1. Then, the wafer is subjected to a predetermined process within processing chamber 102b in a manner similar to the foregoing embodiment. During this time, the wafer supporter 122b that had handed over the wafer is returned to its original position for standby so as not to get in the way of wafers being transferred on the lower transfer line 121. The wafer having completed its treatment in processing chamber 102b is returned from chamber 102b to lock chamber 102a. Moreover, the wafer supporter 122b on standby is lowered and stopped at a predetermined height (position). Then, the pressure of the interior of lock chamber 102a is released and gate valve 102d is opened. The treated wafer within lock chamber 102a is transferred from inside of lock chamber 102a to transfer chamber 703 by the movement of robot 12, and then returned to wafer supporter 122b. Thereafter, the wafer is supported by wafer supporter 122b and transferred within the transfer chamber to a position corresponding for example to the right side lock chamber 105a'. This wafer is transferred from wafer supporter 122b onto wafer scoop portion 15-1' of robot 15' disposed in lock chamber 105a'. Thereafter, the wafer is subjected to treatment in processing chamber 105b' in a manner similar to the foregoing embodiment. When treatment is completed in processing chamber 105b', the wafer is returned to lock chamber 105a'. Then, pressure is released from lock chamber 105a' and the gate valve is opened. The treated wafer inside lock chamber 105a' is transferred to transfer chamber 703 by the movement of robot 15', and then returned to wafer supporter 122b. Next, the wafer can be transferred inside transfer chamber 703 to be treated at another processing equipment or can be returned to the FOUP at the bay stocker portion.

In FIG. 28, the wafer being transferred on the lower transfer line 121 is handed over to robot 12 of lock chamber 122a in the following manner. First, the lower transfer line 121 transfers a wafer platform 121b supporting the wafer, this movement being stopped when the wafer reaches a position corresponding to lock chamber 102a of predetermined processing equipment 102. Thereafter, gate valve 102d is opened, and wafer scoop portion 12-1 of robot 12 inside lock chamber 102a is moved out toward wafer platform 121b, and as a result, the wafer on wafer platform 121b is scooped by scoop portion 12-1 of robot 12. Thereafter, the wafer is subjected to a predetermined treatment inside processing chamber 102b similar to the foregoing embodiment. During this time, the wafer platform 121b having transferred the wafer is moved on forward in transfer chamber 703 so as not to get in the way of transfer of the next wafer. When the processing in processing chamber 102b is completed, the wafer is returned from processing chamber 102b to lock chamber 102a. On the other hand, a wafer platform 121b for receiving the wafer is transferred to a position corresponding to lock chamber 102a. Thereafter, the pressure within lock chamber 102a is released and gate valve 102d is opened. At this state, the treated wafer inside lock chamber 102a is transferred to transfer chamber 703 by the movement of robot 12, and loaded to wafer platform 121b. Thereafter, the wafer supported by wafer platform 121b is transferred inside transfer chamber 703 for example to a position corresponding to the right lock chamber 105a'. Then, similar to embodiment 1, the wafer is elevated toward the top wall within transfer chamber 703 by pushup pins. The elevation is stopped when it reaches a predetermined height. Thereafter, gate valve 105d' is opened, and wafer scoop portion 15-1' of robot 15' disposed in lock chamber 105a' is moved out toward wafer platform 121b, and as a result, the wafer on wafer platform 121b is scooped up by scoop portion 15-1'. Then, the wafer is subjected to a predetermined treatment inside processing chamber 105b', similar to the foregoing embodiment. During this time, the wafer platform 121b having transferred the wafer is moved further forward within transfer chamber 703 so as not to get in the way of next wafer transfer. When the treatment in processing chamber 105b' is completed, the wafer is returned to lock chamber 105a'. On the other hand, a wafer platform 121b for receiving the wafer is transferred to the position corresponding to lock chamber 105a'. Thereafter, the pressure within lock chamber 105a' is released and the gate valve is opened. The treated wafer inside lock chamber 105a' is transferred to transfer chamber 703 by the movement of robot 15', and then loaded onto wafer platform 121b. Then, the wafer is transferred inside transfer chamber 703 to be processed at another processing chamber or returned to the FOUP at the bay stocker portion.

The present embodiment enjoys the following advantages in addition to those realized by the foregoing embodiment.
1. Even when the height of, for example, the lock chambers of the various processing equipments disposed in the bay are different, the single wafer transfer line also functioning as an interface unit enables the bay to be constructed smoothly. This shortens the construction process of the bay and cuts down the installation fee of the bay. Moreover, the setup time of the bay is effectively shortened and the throughput is improved.

According to the present embodiment, the bottom wall height of the transfer chamber is adjusted to corresponding to the height of the lower lock chamber and the top wall height of the transfer chamber is adjusted to correspond to the height of the higher lock chamber, but the present embodiment is not limited to such structure. In other words, the single wafer transfer line can be structured in any form as long as it has an interface unit that corresponds to the various heights of the processing equipments.

Figure 29:
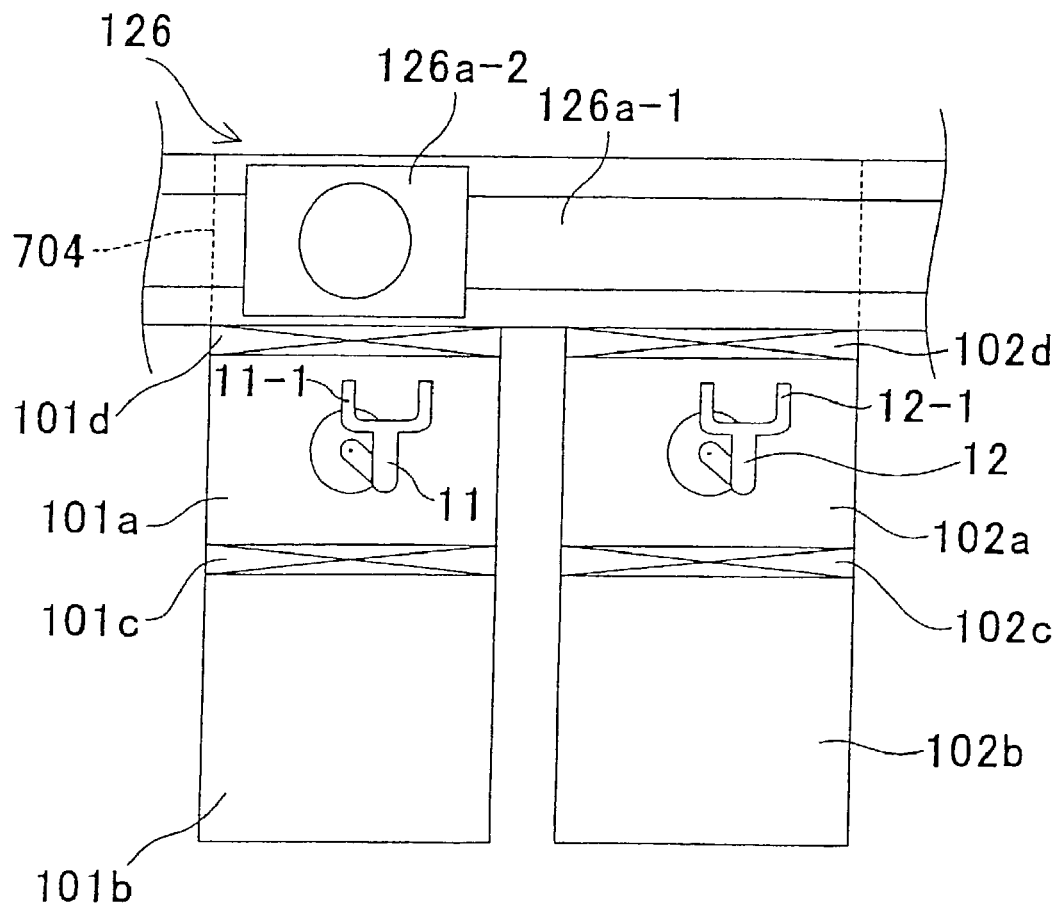
FIG. 29 is a partial plane view showing the eighth embodiment of the semiconductor fabrication line according to the present invention, illustrating another embodiment of the wafer handover between the single wafer transfer line and processing equipments.
Figure 30:
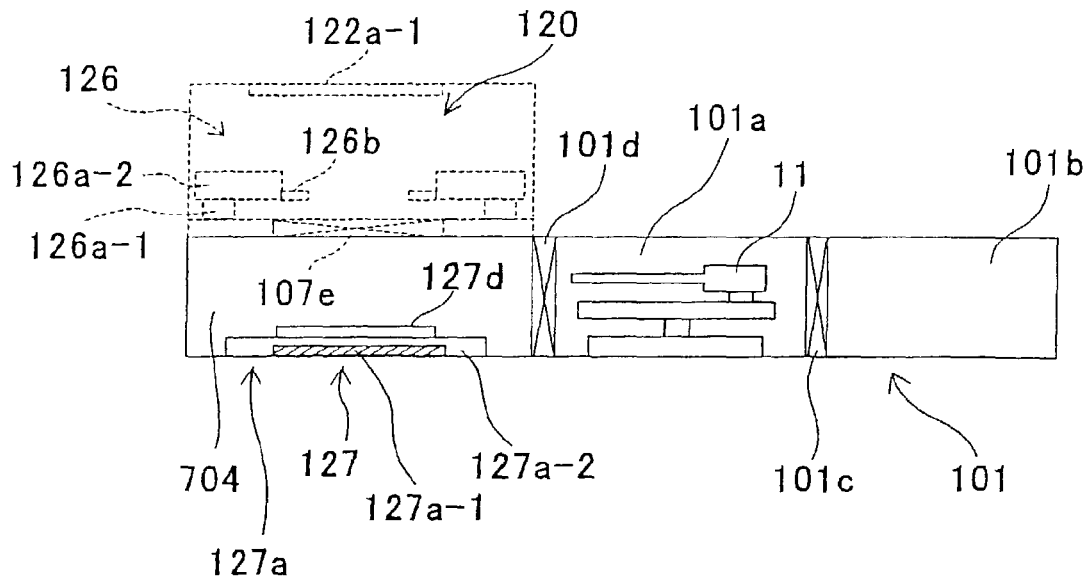
FIG. 30 is a vertical cross-sectional view of the main portion of FIG. 29.

FIGS. 29 and 30 illustrate the eighth embodiment of the present invention. This embodiment illustrates another example of the embodiment explained with reference to FIGS. 22 and 23 where the lock chamber 704 of the processing equipment is disposed below the single wafer transfer line 120.

The points of FIGS. 29 and 30 that differ from the embodiment of FIGS. 22 and 23 are the following.

The points that differ are explained with reference especially to FIG. 29. According to FIG. 29, the lock chamber 704 located below the single wafer transfer line 120, in this case the lower transfer line 126, is commonly used (shared) by a plurality of, in this example, two processing equipments (101, 102) instead of just one. A wafer transfer means is disposed within lock chamber 704. Transfer means in this example utilizes a non-contact moving body, which is a moving body 127a comprising linear rails 127a-1 and a linear carriage 127a-2. Linear rails 127a-1 are disposed on the bottom wall portion of lock chamber 704. Linear rails 127a-1 are oriented along the longitudinal direction of lock chamber 704 along the aligned processing equipments. At least one linear carriage 127a-2 is movably disposed on linear rails 127a-1. The wafer platform 127b on linear carriage 127a-2 corresponds to the opening portion of gate valve 101d disposed between lock chamber 704 and transfer chamber 101a. In this example, the gate valve 107e is disposed only to correspond to one of the processing equipments, the left side processing equipment. The components illustrated in FIGS. 29 and 30 which are substantially the same as those of FIGS. 22 and 23 are assigned to the same reference numbers, and detailed explanations are omitted.

According to FIGS. 29 and 30, the wafer being transferred along, for example, the lower transfer line 126 of single wafer transfer line 120 is loaded into lock chamber 704. The wafer being loaded into lock chamber 704 is received by the wafer platform 127b disposed therein. After receiving the wafer, wafer platform 127b is moved within lock chamber 704 toward, for example, the transfer chamber 102a of processing equipment 102 disposed on the right side. The movement of this wafer platform 127b is stopped when wafer platform 127b reaches a position corresponding to gate 102d of processing equipment 102 disposed on the right side. Thereafter, gate valve 102d is opened, and the wafer on wafer platform 127b is transferred into transfer chamber 102a and then to processing chamber 102b to be subjected to a predetermined processing. When processing is completed, the wafer is returned by reverse operation through processing chamber 102b, transfer chamber 102a, lock chamber 704 and to the lower transfer line 126 and loaded on wafer platform 126b. Having received the processed wafer, wafer platform 126b is transferred along the lower transfer line 126 to another processing equipment or to the bay stocker portion.

According to FIGS. 29 and 30, the next wafer being transferred for example on the lower transfer line 126 is loaded into lock chamber 704. The wafer being loaded into lock chamber 704 is mounted on wafer platform 127b. After receiving the wafer, wafer platform 127b is not moved in this example. In other words, this wafer must be processed in the left-side processing equipment 101, and the wafer platform 127b is stopped in the position corresponding to gate valve 101d. Thereafter, gate valve 101d is opened, and the wafer on wafer platform 127b is transferred to transfer chamber 101a and then to processing chamber 101b to be subjected to a predetermined processing. The treated wafer is returned by reverse operation from the processing chamber 101b to transfer chamber 101a, lock chamber 704 and then to lower transfer line 126 and onto wafer platform 126b. After receiving the treated wafer, the wafer platform 126b is transferred to another processing equipment or to the bay stocker portion.

The embodiment illustrated in FIGS. 29 and 30 is advantageous compared to that of FIGS. 22 and 23, since there is no need to dispose gate valves connected to the single wafer transfer line for all processing equipments, and thus the system can be simplified and the equipments fee for forming the bay is cut down.

FIGS. 29 and 30 illustrate an example where the lower transfer line is selectively utilized, but the upper transfer line, or both the upper and lower lines, can also be used to enjoy the same advantages.

Further, the following use is also advantageous.
1. The transfer of wafers within the processing equipment can be performed via the lock chamber. For example, the wafer having been treated at the left side processing chamber can be transferred through the lock chamber to the right side processing chamber for further treatment. The opposite is also possible.

Figure 31:
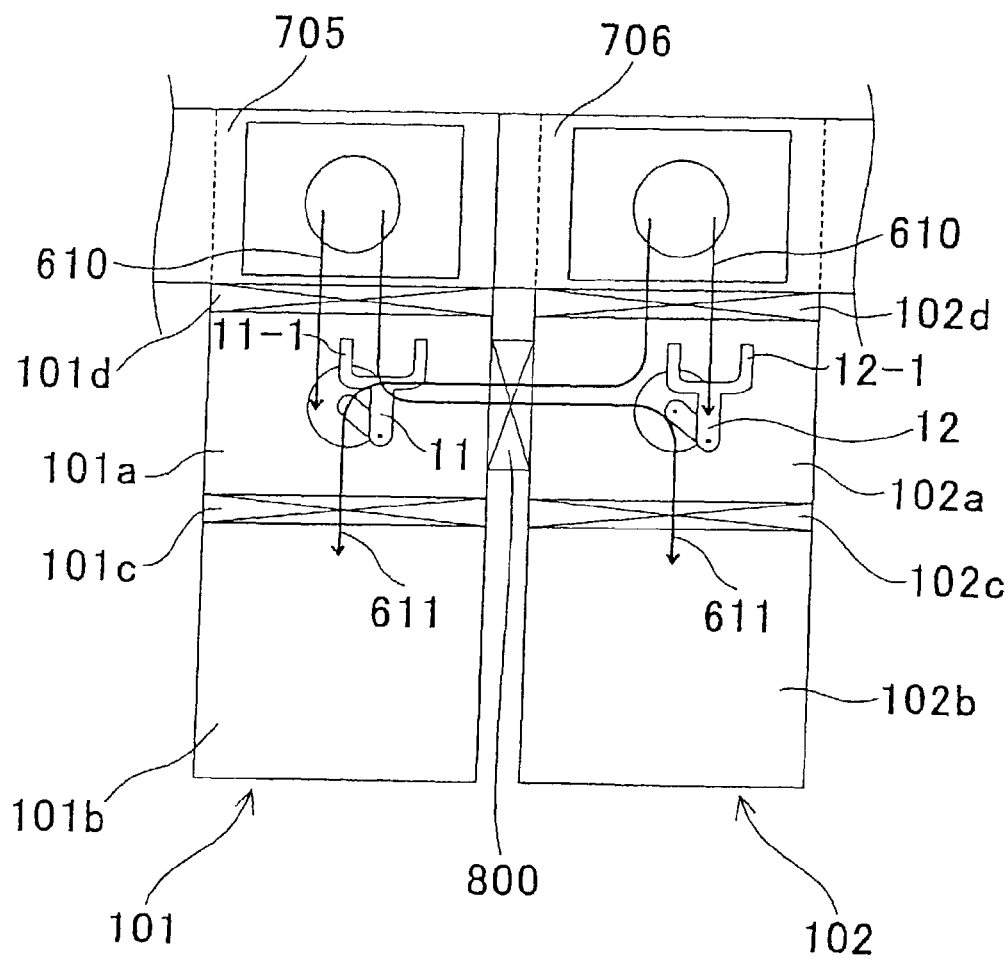
FIG. 31 is a partial plane view showing the ninth embodiment of the semiconductor fabrication line according to the present invention, illustrating yet another embodiment of the wafer handover between the single wafer transfer line and processing equipments.
Figure 32:
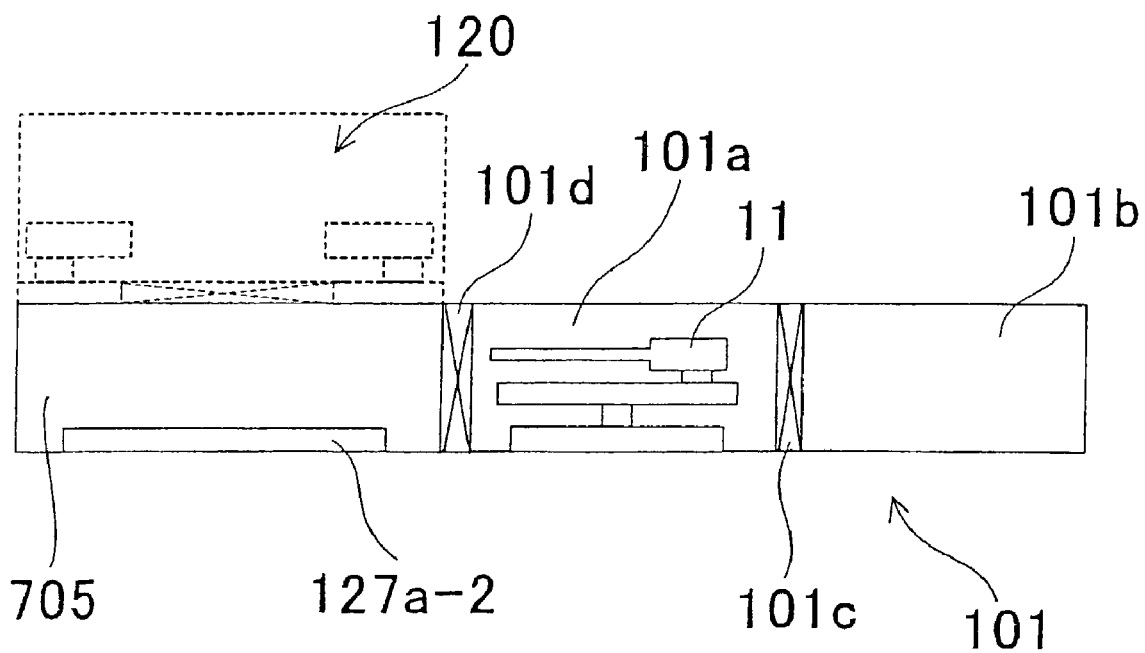
FIG. 32 is a vertical cross-sectional view showing the main portion of FIG. 31.

FIGS. 31 and 32 illustrate the ninth embodiment of the present invention. FIGS. 31 and 32 show yet another embodiment based on the one shown in FIGS. 22 and 23, in which the lock chamber of the processing equipment is disposed below the single wafer transfer line.

The point of the embodiment of FIGS. 31 and 32 that differs from the one illustrated in FIGS. 22 and 23 is that the transfer chambers 101a and 102a of the processing equipments are communicated via a gate valve 800. The other components which are the same as those of FIGS. 22 and 23 are assigned to the same reference numbers, and explanations thereof are omitted.

The embodiment of FIGS. 31 and 32 operates as follows.
1. A wafer is transferred to and processed in each processing equipment as shown by arrow 610.
2. As shown by arrow 611, the wafer can be transferred to and processed in one transfer chamber and processing chamber via the lock chamber and transfer chamber of another equipment. In this example, when transferring a wafer to a certain processing equipment or when transferring the treated wafer to the single wafer transfer line 120, the negative influence that may be caused by the status of the transfer line can be suppressed to a minimum. For example, if the linear carriage on the transfer line supporting a wafer stops by some reason at a location corresponding to the lock chamber 706 of the right side processing equipment 102, the treated wafer within the processing chamber 102b of the right side processing equipment 102 can still be passed on smoothly to the single wafer transfer line 120 by utilizing the left side transfer chamber 101a and the lock chamber 705. Further, for example, if there is a similar need to load the wafer being transferred on the transfer line to the processing chamber 102b of the right side processing equipment 102, the wafer can be transferred smoothly by utilizing the left side lock chamber 706 and transfer chamber 101a.

3. Moreover, in a system where three processing equipments are disposed in a line, when the linear carriage stops by some reason to a position corresponding to the lock chamber of the center processing equipment, the wafer can be transferred from the left lock chamber via the left transfer chamber, the center transfer chamber, the right transfer chamber, the right lock chamber, and on to the wafer platform of the linear carriage, thus skipping the stopped linear carriage.

4. Moreover, the wafer processed at one processing equipment can be transferred via the transfer chamber and the gate valve to a second transfer chamber and then onto the second processing chamber to subject the same wafer to another process continuously.

5. The parallel transfer process explained in 1. and the series transfer process explained in 4. can be performed either independently or in combination.

According to the foregoing embodiments, the transfer line adopts as the transfer line a moving body and a wafer platform (wafer supporter), and adopts a linear moving body comprising linear rails and a linear carriage as the moving body so as to suppress the generation of particles that may affect throughput. However, the present embodiment is not limited by such example. For example, the moving body can be a guide tape and a means for sensing and moving on the guide tape.

Moreover, according to the foregoing embodiments, the transfer space of the single wafer transfer line is maintained at a clean gas atmosphere such as nitrogen gas atmosphere, but this is not a requirement according to the purpose of the present invention. Therefore, the transfer space can also be maintained at decompressed atmosphere. In such case, the connection between the line and the bay stocker becomes somewhat complex. For example, the FOUP and the transfer space must be connected via a lock chamber. On the other hand, the connection between the transfer space and the processing equipments becomes simplified if the processing equipments are vacuum processing equipments (such as plasma etching equipment, plasma CVD equipment, sputtering equipment etc.) since no lock chamber is required. However, if some of the processing equipments are atmospheric processing equipments (for example, lithography equipment, CMP equipment, inspection/evaluation equipment etc.), connecting means such as a lock chamber is required. Further, there is also a need for installation of an evacuation equipment etc. to evacuate the transfer space. The cost for operating the system is also required.

For example, the atmosphere within the transfer space can be the same as the clean room atmosphere, or in other words, untreated atmosphere. In such case, there is a need to connect the FOUP and the transfer space via a lock chamber for atmosphere adjustment. However, the connection between the transfer space and the processing equipments can be designed as explained in the foregoing embodiments. In such example, there is no need for a clean gas supply means or an evacuation means, so the operation cost can be cut down.

The above explained preferred embodiment referred to various examples of the atmosphere of the transfer space within the single wafer transfer line, but if the processing equipments are vacuum processing equipments or atmospheric processing equipments, particles tend to adhere to the wafers when the wafers are being transferred to these equipments. In order to prevent deterioration of yield ratio caused by the adhered particles, the atmosphere within the transfer space should preferably be controlled either to clean gas atmosphere or depressurized atmosphere. However, this is not the case when FOUPs housing single wafers are used to transfer the wafers.

Moreover, the foregoing embodiments referred to the case where AGV is used in the inter-bay transfer line, but other transfer means such as OHT (overhead transfer) can also be used.

In addition to the above explanation, the present invention can have the following aspects.

1. A method for transferring wafers comprising the steps of:
   transferring wafers one by one on a first transfer line;
   transferring the wafers one by one on a second transfer line disposed so as to transfer said wafers in parallel with said first transfer line;
   conveying said wafers one by one between said first and second transfer lines and a plurality of processing equipments disposed along said first and second transfer lines; and
   selectively utilizing said first transfer line and said second transfer line when transferring said wafers one by one based on the processing information of said wafers.

2. A method for transferring wafers comprising the steps of:
   transferring wafers one by one on a first transfer line;
   transferring the wafers one by one on a second transfer line having a wafer transfer plane that is opposed to the wafer transfer plane of said first transfer line;
   conveying said wafers one by one between said first and second transfer lines and a plurality of processing equipments disposed along the wafer transfer planes of said first and second transfer lines; and
   selectively utilizing said first transfer line and said second transfer line when transferring said wafers one by one.

3. A method for transferring wafers comprising the steps of:
   transferring wafers one by one on a first transfer line comprising a substantially horizontal wafer transfer plane;
   transferring the wafers one by one on a second transfer line having a wafer transfer plane that is vertically opposed to the wafer transfer plane of said first transfer line;
   conveying said wafers one by one between said first and second transfer lines and a plurality of processing equipments disposed along the wafer transfer planes of said first and second transfer lines; and
   selectively utilizing said first transfer line and said second transfer line when transferring said wafers one by one.

4. A method for transferring wafers within a bay comprising a plurality of processing equipments and a single wafer transfer line transferring wafers to be subjected to processing in the processing equipments one by one, said bay including said plurality of processing equipments disposed side by side and said single wafer transfer line disposed along said line of plural processing equipments, wherein said method comprising the steps of:

transferring said wafers one by one on a first transfer line constituting said single wafer transfer line;

transferring said wafers one by one on a second transfer line constituting said single wafer transfer line together with said first transfer line and disposed so as to transfer wafers in parallel with said first transfer line;

conveying said wafers one by one between said first transfer line and said processing equipments;

conveying said wafers one by one between said second transfer line and said processing equipments; and selectively utilizing said first transfer line and said second transfer line when transferring said wafers one by one within said bay.

5. A method for transferring wafers within a bay comprising a plurality of processing equipments and a single wafer transfer line for transferring said wafers to be subjected to processing in the processing equipments one by one, said bay including said plurality of processing equipments disposed side by side and said single wafer transfer line disposed along said line of plural processing equipments, wherein said method comprising the steps of:

transferring said wafers one by one on a first transfer line constituting said single wafer transfer line;

transferring said wafers one by one on a second transfer line constituting said single wafer transfer line together with said first transfer line, said second transfer line disposed so as to transfer wafers in parallel with said first transfer line;

conveying said wafers one by one between said first transfer line and said processing equipments;

conveying said wafers one by one between said second transfer line and said processing equipments; and selectively utilizing said first transfer line and said second transfer line based on the processing information of said wafers when transferring said wafers one by one within said bay.

6. A method for transferring wafers within a bay comprising a plurality of processing equipments and a single wafer transfer line for transferring said wafers to be subjected to processing in the processing equipments one by one, said bay including said plurality of processing equipments disposed side by side and said single wafer transfer line disposed along said line of plural processing equipments, wherein said method comprising the steps of:

transferring said wafers one by one on a first transfer line having a substantially horizontal wafer transfer plane constituting said single wafer transfer line;

transferring said wafers one by one on a second transfer line constituting said single wafer transfer line together with said first transfer line, said second transfer line having a wafer transfer plane that is opposed to the wafer transfer plane of said first transfer line;

conveying said wafers one by one between said first transfer line and said processing equipments;

conveying said wafers one by one between said second transfer line and said processing equipments; and selectively utilizing said first transfer line and said second transfer line when transferring said wafers one by one within said bay.

7. A method for transferring wafers within a bay comprising a plurality of processing equipments and a single wafer transfer line for transferring said wafers to be subjected to processing in the processing equipments one by one, said bay including said plurality of processing equipments disposed side by side and said single wafer transfer line disposed along said line of plural processing equipments, wherein said method comprising the steps of:

transferring said wafers one by one on a first transfer line having a substantially horizontal wafer transfer plane constituting said single wafer transfer line;

transferring said wafers one by one on a second transfer line constituting said single wafer transfer line together with said first transfer line, said second transfer line having a wafer transfer plane that is vertically opposed to the wafer transfer plane of said first transfer line;

conveying said wafers one by one between said first transfer line and said processing equipments;

conveying said wafers one by one between said second transfer line and said processing equipments; and selectively utilizing said first transfer line and said second transfer line when transferring said wafers one by one within said bay.

8. A method for transferring wafers within a bay or between plural bays, said plural bays each comprising a plurality of processing equipments and a single wafer transfer line for transferring said wafers one by one, said bay including said plurality of processing equipments disposed side by side and said single wafer transfer line disposed along said line of plural processing equipments, wherein said method comprising the steps of:

transferring said wafers one by one within the bay on a first transfer line constituting said single wafer transfer line and a second transfer line disposed so as to transfer wafers in parallel with said first transfer line, and conveying said wafers one by one between said first transfer line, said second transfer line and said processing equipments by selectively utilizing the first transfer line and the second transfer line; and transferring said wafers between said plural bays.

9. A method for transferring wafers within a bay or between plural bays, said plural bays each comprising a plurality of processing equipments and a single wafer transfer line for transferring said wafers one by one, said bay including said plurality of processing equipments disposed side by side and said single wafer transfer line disposed along said line of plural processing equipments, wherein said method comprising the steps of:

transferring said wafers one by one within the bay selectively utilizing a first transfer line constituting said single wafer transfer line and a second transfer line disposed so as to transfer wafers in parallel with said first transfer line based on the processing information of said wafers, and conveying said wafers one by one between said first transfer line, said second transfer line and said processing equipments by selectively utilizing the first transfer line and the second transfer line based on the processing information of said wafers; and transferring said wafers between said plural bays based on the processing information of said wafers.

10. A single wafer transfer apparatus disposed along a plurality of processing equipments arranged side by side for transferring wafers to be subjected to processing at said processing equipments, said apparatus comprising:

a single wafer transfer line composed of a first transfer line for transferring said wafers one by one and a second transfer line disposed so as to transfer said wafers one by one in parallel with said first transfer line; and a control system for controlling the selective utilization of said first transfer line and said second transfer line of said single wafer transfer line.

11. A single wafer transfer apparatus disposed along a plurality of processing equipments arranged side by side for transferring wafers to be subjected to processing at said processing equipments, said apparatus comprising:

a single wafer transfer line composed of a first transfer line for transferring said wafers one by one and a second transfer line disposed so as to transfer said wafers one by one in parallel with said first transfer line; and a control system for controlling the selective utilization of said first transfer line and said second transfer line of said single wafer transfer line based on the processing information of said wafers.

12. A single wafer transfer apparatus disposed along a plurality of processing equipments arranged side by side for transferring wafers to be subjected to processing at said processing equipments, said apparatus comprising:

a single wafer transfer line composed of a first transfer line for transferring said wafers one by one and a second transfer line for transferring said wafers one by one having a wafer transfer plane being opposed to the wafer transfer plane of said first transfer line; and a control system for controlling the selective utilization of said first transfer line and said second transfer line of said single wafer transfer line.

13. A single wafer transfer apparatus disposed along a plurality of processing equipments arranged side by side for transferring wafers to be subjected to processing at said processing equipments, said apparatus comprising:

a single wafer transfer line composed of a first transfer line for transferring said wafers one by one and a second transfer line for transferring said wafers one by one having a wafer transfer plane being opposed to the wafer transfer plane of said first transfer line; and a control system for controlling the selective utilization of said first transfer line and said second transfer line of said single wafer transfer line based on the processing information of said wafers.

14. A single wafer transfer apparatus disposed along a plurality of processing equipments arranged side by side for transferring wafers to be subjected to processing at said processing equipments, said apparatus comprising:

a single wafer transfer line composed of a first transfer line for transferring said wafers one by one on a substantially horizontal wafer transfer plane and a second transfer line for transferring said wafers one by one on a wafer transfer plane being vertically opposed to the wafer transfer plane of said first transfer line; and a control system for controlling the selective utilization of said first transfer line and said second transfer line of said single wafer transfer line.

15. A single wafer transfer apparatus disposed along a plurality of processing equipments arranged side by side for transferring wafers to be subjected to processing at said processing equipments, said apparatus comprising:

a single wafer transfer line composed of a first transfer line for transferring said wafers one by one on a substantially horizontal wafer transfer plane and a second transfer line for transferring said wafers one by one on a wafer transfer plane being vertically opposed to the wafer transfer plane of said first transfer line; and a control system for controlling the selective utilization of said first transfer line and said second transfer line of said single wafer transfer line based on the processing information of said wafers.

16. A bay comprising plural processing equipments and a single wafer transfer line for transferring wafers one by one to be subjected to processing at said processing equipments, said processing equipments arranged side by side and said single wafer transfer line disposed along said aligned processing equipments; wherein said single wafer transfer line is composed of a first transfer line for transferring said wafers one by one and a second transfer line for transferring said wafers one by one in parallel with said first transfer line;

a control system for controlling the selective utilization of said first transfer line and said second transfer line of said single wafer transfer line; and a transfer equipment for conveying said wafers one by one between said first transfer line, said second transfer line and said processing equipments.

17. A bay comprising plural processing equipments and a single wafer transfer line for transferring wafers one by one to be subjected to processing at said processing equipments, said processing equipments arranged side by side and said single wafer transfer line disposed along said aligned processing equipments; wherein said single wafer transfer line is composed of a first transfer line for transferring said wafers one by one and a second transfer line for transferring said wafers one by one in parallel with said first transfer line;

a control system for controlling the selective utilization of said first transfer line and said second transfer line of said single wafer transfer line based on the processing information of said wafers; and a transfer equipment for conveying said wafers one by one between said first transfer line, said second transfer line and said processing equipments.

18. A bay comprising plural processing equipments and a single wafer transfer line for transferring wafers one by one to be subjected to processing at said processing equipments, said processing equipments arranged side by side and said single wafer transfer line disposed along said aligned processing equipments; wherein said single wafer transfer line is composed of a first transfer line for transferring said wafers one by one and a second transfer line for transferring said wafers one by one on a wafer transfer plane opposed to the wafer transfer plane of said first transfer line;

a control system for controlling the selective utilization of said first transfer line and said second transfer line of said single wafer transfer line based on the processing information of said wafers; and a transfer equipment for conveying said wafers one by one between said first transfer line, said second transfer line and said processing equipments.

19. A bay comprising plural processing equipments and a single wafer transfer line for transferring wafers one by one to be subjected to processing at said processing equipments, said processing equipments arranged side by side and said single wafer transfer line disposed along said aligned processing equipments; wherein said single wafer transfer line is composed of a first transfer line for transferring said wafers one by one and a second transfer line disposed so as to transfer wafers in parallel with said first transfer line;

a control system for controlling the selective utilization of said first transfer line and said second transfer line of said single wafer transfer line based on the processing information of said wafers;

a transfer equipment for conveying said wafers one by one between said first transfer line, said second transfer line and said processing equipments; and a bay stocker portion for conveying said wafers between the single wafer transfer line and the exterior of the bay.

20. A bay comprising plural processing equipments and a single wafer transfer line for transferring wafers one by one to be subjected to processing at said processing equipments, said processing equipments arranged side by side and said single wafer transfer line disposed along said aligned processing equipments; wherein said single wafer transfer line is composed of a first transfer line for transferring said wafers one by one and a second transfer line for transferring said wafers one by one on a wafer transfer plane opposed to the wafer transfer plane of said first transfer line;

a control system for controlling the selective utilization of said first transfer line and said second transfer line of said single wafer transfer line based on the processing information of said wafers;

a transfer equipment for conveying said wafers one by one between said first transfer line, said second transfer line and said processing equipments; and a bay stocker portion for conveying said wafers between the single wafer transfer line and the exterior of the bay.

21. A bay of a semiconductor wafer fabrication line comprising processing equipments for providing predetermined treatment to the semiconductor wafer and a single wafer transfer line for transferring said semiconductor wafers one by one, said plural processing equipments arranged side by side and said single wafer transfer line disposed along said aligned processing equipments; wherein said single wafer transfer line is composed of a first transfer line for transferring said semiconductor wafers one by one and a second transfer line disposed so as to transfer wafers in parallel with said first transfer line;

a control system for controlling the selective utilization of said first transfer line and said second transfer line of said single wafer transfer line based on the processing information of the semiconductor wafers; and a transfer equipment for conveying said semiconductor wafers one by one between said first transfer line, said second transfer line and said processing equipments.

22. A bay of a semiconductor wafer fabrication line comprising processing equipments for providing predetermined treatment to the semiconductor wafer and a single wafer transfer line for transferring said semiconductor wafers one by one, said plural processing equipments arranged side by side and said single wafer transfer line disposed along said aligned processing equipments; wherein said single wafer transfer line is composed of a first transfer line for transferring said semiconductor wafers one by one and a second transfer line for transferring said semiconductor wafers one by one on a semiconductor wafer transfer plane opposed to the semiconductor wafer transfer plane of said first transfer line;

a control system for controlling the selective utilization of said first transfer line and said second transfer line of said single wafer transfer line based on the processing information of the semiconductor wafers; and a transfer equipment for conveying said semiconductor wafers one by one between said first transfer line, said second transfer line and said processing equipments.

23. A semiconductor fabrication line comprising plural bays, each bay comprising processing equipments for providing predetermined treatment to the semiconductor wafer and a single wafer transfer line for transferring the semiconductor wafers one by one, said plural processing equipments arranged side by side and said single wafer transfer line disposed along said aligned processing equipments; said semiconductor fabrication line comprising:

an inter-bay transfer equipment for transferring said semiconductor wafers between said bays;

said single wafer transfer line composed of a first transfer line for transferring said semiconductor wafers one by one and a second transfer line disposed so as to transfer wafers in parallel with said first transfer line;

a control system for controlling the selective utilization of said first transfer line and said second transfer line of said single wafer transfer line based on the processing information of the semiconductor wafers being transferred to said bay by said inter-bay transfer equipment; and a transfer equipment for conveying said semiconductor wafers one by one between said first transfer line, said second transfer line and said processing equipments.

24. A semiconductor fabrication line comprising plural bays, each bay comprising processing equipments for providing predetermined treatment to the semiconductor wafer and a single wafer transfer line for transferring the semiconductor wafers one by one, said plural processing equipments arranged side by side and said single wafer transfer line disposed along said aligned processing equipments; said semiconductor fabrication line comprising:

an inter-bay transfer equipment for transferring said semiconductor wafers between said bays;

said single wafer transfer line composed of a first transfer line for transferring said semiconductor wafers one by one and a second transfer line for transferring said semiconductor wafers one by one on a semiconductor wafer transfer plane opposed to the semiconductor wafer transfer plane of said first transfer line;

a control system for controlling the selective utilization of said first transfer line and said second transfer line of said single wafer transfer line based on the processing information of the semiconductor wafers being transferred to said bay by said inter-bay transfer equipment; and a transfer equipment for conveying said semiconductor wafers one by one between said first transfer line, said second transfer line and said processing equipments.

25. A semiconductor fabrication line comprising plural bays, each bay comprising processing equipments for providing predetermined treatment to the semiconductor wafer and a single wafer transfer line for transferring the semiconductor wafers one by one, said plural processing equipments arranged side by side and said single wafer transfer line disposed along said aligned processing equipments; said semiconductor fabrication line comprising:

an inter-bay transfer equipment for transferring said semiconductor wafers between said bays;

said single wafer transfer line composed of a first transfer line for transferring said semiconductor wafers one by one and a second transfer line disposed so as to transfer wafers in parallel with said first transfer line;

a bay stocker portion for conveying said wafers between said inter-bay transfer equipment and said single wafer transfer line;

a control system for controlling the selective utilization of said first transfer line and said second transfer line of said single wafer transfer line based on the processing information of the semiconductor wafers being transferred to said bay stocker portion by said inter-bay transfer equipment; and a transfer equipment for conveying said semiconductor wafers one by one between said first transfer line, said second transfer line and said processing equipments.

26. A semiconductor fabrication line comprising plural bays, each bay comprising processing equipments for providing predetermined treatment to the semiconductor wafer and a single wafer transfer line for transferring the semiconductor wafers one by one, said plural processing equipments arranged side by side and said single wafer transfer line disposed along said aligned processing equipments; said semiconductor fabrication line comprising:

an inter-bay transfer equipment for transferring said semiconductor wafers between said bays;

said single wafer transfer line composed of a first transfer line for transferring said semiconductor wafers one by one and a second transfer line for transferring said semiconductor wafers one by one on a semiconductor wafer transfer plane opposed to the semiconductor wafer transfer plane of said first transfer line;

a bay stocker portion for conveying said wafers between said inter-bay transfer equipment and said single wafer transfer line;

a control system for controlling the selective utilization of said first transfer line and said second transfer line of said single wafer transfer line based on the processing information of the semiconductor wafers being transferred to said bay stocker portion by said inter-bay transfer equipment; and a transfer equipment for conveying semiconductor wafers one by one between said first transfer line, said second transfer line and said processing equipments.

27. A liquid crystal fabrication line comprising plural bays, each bay having processing equipments for providing predetermined processing to a liquid crystal substrate and a single wafer transfer line for transferring said liquid crystal substrates one by one, said plurality of processing equipments arranged side by side and said single wafer transfer line disposed along said aligned processing equipments; said liquid crystal fabrication line comprising:

said single wafer transfer line composed of a first transfer line for transferring said liquid crystal substrates one by one and a second transfer line disposed so as to transfer said liquid crystal substrates one by one in parallel with said first transfer line;

a bay stocker portion for transferring said liquid crystal substrates between said single wafer transfer line;

a control system for controlling the selective utilization of said first transfer line and said second transfer line of said single wafer transfer line based on the processing information of said liquid crystal substrates at said bay stocker portion; and a transfer equipment for conveying said liquid crystal substrates one by one between said first transfer line, said second transfer line and said processing equipments.

28. A liquid crystal fabrication line comprising plural bays disposed adjacent to one another, each bay having processing equipments for providing predetermined processing to a liquid crystal substrate and a single wafer transfer line for transferring said liquid crystal substrates one by one, said plurality of processing equipments arranged side by side and said single wafer transfer line disposed along said aligned processing equipments; said liquid crystal fabrication line comprising:

an inter-bay transfer equipment disposed sandwiching said bays for transferring said liquid crystal substrates between said bays;

said single wafer transfer line composed of a first transfer line for transferring said liquid crystal substrates one by one and a second transfer line disposed so as to transfer said liquid crystal substrates one by one in parallel with said first transfer line;

a bay stocker portion for transferring said liquid crystal substrates between each said inter-bay transfer equipment and said single wafer transfer line;

a control system for controlling the selective utilization of said first transfer line and said second transfer line of said single wafer transfer line based on the processing information of said liquid crystal substrates being transferred from said inter-bay transfer equipment to said bay stocker portion; and a transfer equipment for conveying said liquid crystal substrates one by one between said first transfer line, said second transfer line and said processing equipments.

As explained, according to the present embodiment, by providing at least one more transfer line capable of transferring wafers simultaneously within the bay, the problems related to wafer transfer within the bay is solved, deterioration of throughput within the bay is prevented and as a result deterioration of throughput of all the bays is prevented.

What is claimed is:

1. A method for transferring wafers in a bay, said wafers having different processing speeds in being processed by a plurality of processing equipments in said bay, comprising the steps of:

transferring any wafer stored inside a front opening unified pod (FOUP) one by one on a first transfer line in the bay;

transferring any wafer stored within the FOUP one by one on a second transfer line having a wafer transfer plane that is opposed to any wafer transfer plane of said first transfer line in the bay;

conveying said wafers one by one between (a) said first and second transfer lines in the bay and (b) a plurality of processing equipments disposed along the wafer transfer planes of said first and second transfer lines; and selectively utilizing said first transfer line and said second transfer line, based on processing information of said wafers corresponding to wafers having fast and slow processing speeds, when transferring said wafers in the bay one by one.

2. The method according to claim 1, further comprising the steps of transferring front opening unified pods (FOUPs) on an inter-bay transfer line, and mounting the transferred FOUPs on a bay stocker in the bay.

3. A method for transferring wafers in a bay, said wafers having different processing speeds in being processed by a plurality of processing equipments in said bay, comprising the steps of:

transferring any wafer stored inside a front opening unified pod (FOUP) one by one on a first transfer line in the bay, the transfer including a substantially horizontal wafer transfer plane;

transferring any wafer within the FOUP one by one on a second transfer line having a wafer transfer plane that is vertically opposed to the wafer transfer plane of said first transfer line;

conveying said wafers one by one between (a) said first and second transfer lines in said bay and (b) a plurality of processing equipments disposed along the wafer transfer planes of said first and second transfer lines; and selectively utilizing said first transfer line and said second transfer line, based on processing information of said wafers corresponding to wafers having fast and slow processing speeds, when transferring said wafers in the bay one by one.

4. The method according to claim 3, further comprising the steps of transferring front opening unified pods (FOUPs) on an inter-bay transfer line, and mounting the transferred FOUPs on a bay stocker in the bay.

* * * * *